United States Patent
Watanabe et al.

(10) Patent No.: US 10,526,500 B2
(45) Date of Patent: *Jan. 7, 2020

(54) FILM-FORMING INK, FILM FORMATION METHOD, DEVICE WITH FILM, AND ELECTRONIC APPARATUS

(71) Applicant: SEIKO EPSON CORPORATION, Tokyo (JP)

(72) Inventors: Shotaro Watanabe, Suwa (JP); Takuya Sonoyama, Fujimi-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 164 days.

This patent is subject to a terminal disclaimer.

(21) Appl. No.: 15/532,406

(22) PCT Filed: Nov. 30, 2015

(86) PCT No.: PCT/JP2015/005953
§ 371 (c)(1),
(2) Date: Jun. 1, 2017

(87) PCT Pub. No.: WO2016/088356
PCT Pub. Date: Jun. 9, 2016

(65) Prior Publication Data
US 2017/0335126 A1    Nov. 23, 2017

(30) Foreign Application Priority Data
Dec. 2, 2014  (JP) .................... 2014-244519

(51) Int. Cl.
C09D 11/50  (2014.01)
C09D 11/033  (2014.01)
(Continued)

(52) U.S. Cl.
CPC ............ *C09D 11/50* (2013.01); *C09D 11/033* (2013.01); *C09D 11/106* (2013.01); *C09D 11/36* (2013.01);
(Continued)

(58) Field of Classification Search
None
See application file for complete search history.

(56) References Cited

U.S. PATENT DOCUMENTS 3,450,663 A    6/1969   Cockerham
9,508,935 B2 *  11/2016  Watanabe ........... H01L 51/0037
(Continued)

FOREIGN PATENT DOCUMENTS

EP    1 083 775 A1    3/2001
JP    H11-054270 A    2/1999
(Continued)

OTHER PUBLICATIONS

Cyclohexylbenzene; National Center for Biotechnology Information, PubChem database, Cyclohexylbenzene, CID=13229; https://pubchem.ncbi.nih.gov/compound/13229; no date available; 24 pages.*

(Continued)

*Primary Examiner* — Helene Klemanski
(74) *Attorney, Agent, or Firm* — Oliff PLC

(57) ABSTRACT

A film-forming ink includes a film-forming material and a liquid medium in which the film-forming material is dissolved or dispersed. The liquid medium contains a first component which has a viscosity of less than 20 cp and a second component which has a boiling point at an atmospheric pressure within a range of ±30° C. relative to the boiling point at an atmospheric pressure of the first component and has a viscosity of 20 cp or more, and the second component is contained in an amount of 20 parts by weight (Continued)

or more and 500 parts by weight or less with respect to 100 parts by weight of the first component.

17 Claims, 11 Drawing Sheets

(51) Int. Cl.
| | |
|---|---|
| C09D 11/106 | (2014.01) |
| C09D 11/36 | (2014.01) |
| C09D 11/38 | (2014.01) |
| C09D 11/52 | (2014.01) |
| C09K 11/02 | (2006.01) |
| C09K 11/06 | (2006.01) |
| H01L 51/00 | (2006.01) |
| H01L 51/50 | (2006.01) |
| G02B 5/20 | (2006.01) |
| C09K 11/66 | (2006.01) |

(52) U.S. Cl.
CPC ............. *C09D 11/38* (2013.01); *C09D 11/52* (2013.01); *C09K 11/02* (2013.01); *C09K 11/06* (2013.01); *C09K 11/661* (2013.01); *H01L 51/004* (2013.01); *H01L 51/005* (2013.01); *H01L 51/0043* (2013.01); *H01L 51/0078* (2013.01); *H01L 51/0081* (2013.01); *H01L 51/0085* (2013.01); *H01L 51/0087* (2013.01); *H01L 51/0091* (2013.01); *C09K 2211/1011* (2013.01); *C09K 2211/1029* (2013.01); *C09K 2211/1425* (2013.01); *C09K 2211/185* (2013.01)

(56) References Cited

U.S. PATENT DOCUMENTS

| | | | |
|---|---|---|---|
| 9,647,211 B2* | 5/2017 | Watanabe | C09K 11/06 |
| 10,125,282 B2* | 11/2018 | Watanabe | C09D 11/36 |
| 2002/0189495 A1 | 12/2002 | Hayashi et al. | |
| 2004/0225056 A1 | 11/2004 | Spreitzer et al. | |
| 2005/0058770 A1 | 3/2005 | Kiguchi et al. | |
| 2006/0115652 A1* | 6/2006 | Yoshimoto | H01L 51/0068 428/411.1 |
| 2006/0283385 A1 | 12/2006 | Iwata et al. | |
| 2007/0173578 A1 | 7/2007 | Spreitzer et al. | |
| 2007/0228356 A1 | 10/2007 | Makiura et al. | |
| 2008/0265214 A1* | 10/2008 | Steiger | C09K 11/025 252/500 |
| 2009/0033208 A1* | 2/2009 | Nagayama | C09D 11/50 313/504 |
| 2009/0103284 A1 | 4/2009 | Suzuki et al. | |
| 2010/0243960 A1* | 9/2010 | Matsue | H01L 51/0007 252/301.35 |
| 2011/0006265 A1* | 1/2011 | James | C09D 11/52 252/500 |
| 2013/0069020 A1 | 3/2013 | May et al. | |
| 2013/0082249 A1 | 4/2013 | Kawanami et al. | |
| 2013/0087070 A1 | 4/2013 | Itou et al. | |
| 2013/0256636 A1 | 10/2013 | Watanabe | |
| 2014/0024841 A1 | 1/2014 | Sagisaka et al. | |
| 2014/0138655 A1 | 5/2014 | Sonoyama et al. | |
| 2015/0064828 A1 | 3/2015 | Watanabe et al. | |
| 2015/0097173 A1 | 4/2015 | Watanabe et al. | |
| 2015/0232746 A1* | 8/2015 | Sonoyama | C09K 11/06 257/40 |
| 2015/0270485 A1 | 9/2015 | Watanabe | |
| 2015/0318498 A1 | 11/2015 | Stoessel et al. | |
| 2015/0333280 A1 | 11/2015 | Stoessel et al. | |
| 2015/0349277 A1 | 12/2015 | Stoessel et al. | |
| 2015/0364713 A1 | 12/2015 | Takeda et al. | |
| 2016/0288213 A1 | 10/2016 | Kumaki et al. | |
| 2017/0267880 A1* | 9/2017 | Sonoyama | C09D 11/52 |
| 2018/0030296 A1 | 2/2018 | Fujii et al. | |

FOREIGN PATENT DOCUMENTS

| | | |
|---|---|---|
| JP | 2002-285086 A | 10/2002 |
| JP | 2006-346647 A | 12/2006 |
| JP | 2007-281039 A | 10/2007 |
| JP | 2009-163170 A | 7/2009 |
| JP | 2010-034316 A | 2/2010 |
| JP | 2010-039161 A | 2/2010 |
| JP | 2010-235853 A | 10/2010 |
| JP | 2012-023334 A | 2/2012 |
| JP | 2012-062460 A | 3/2012 |
| JP | 2012-230904 A | 11/2012 |
| JP | 2013-076067 A | 4/2013 |
| JP | 2013-214397 A | 10/2013 |
| JP | 2014-077046 A | 5/2014 |
| JP | 2015-185640 A | 10/2015 |
| WO | 2009/141924 A1 | 11/2009 |
| WO | 2010/127548 A1 | 11/2010 |
| WO | 2011/158384 A1 | 12/2011 |
| WO | 2013/015198 A1 | 1/2013 |
| WO | 2013/118599 A1 | 8/2013 |
| WO | 2014/094961 A1 | 6/2014 |
| WO | 2015/075929 A1 | 5/2015 |
| WO | WO 2016/088352 A1 * | 6/2016 |

OTHER PUBLICATIONS

Diethylene Glycol; National Center for Biotechnology Information, PubChem database, DI(Hydroxyethyl)ether, CID=8117; https://pubchem.ncbi.nih.gov/compound/8117; no date available; 67 pages.*
1-Nonanol; National Center for Biotechnology Information, PubChem database, 1-Nonanol, CID=8914; https://pubchem.ncbi.nih.gov/compound/8914; no date available; 56 pages.*
Nonanol datasheet; https://cameochemicals.noaa.gov/chris/NNN.pdf; Jun. 1999; 2 pages.*
Feb. 23, 2016 Search Report issued in International Patent Application No. PCT/JP2015/005953.
Apr. 24, 2018 Extended European Search Report issued in European Patent Application No. 15865982.1.
Viswanath, D. S. et al., Viscosity of Liquids, Springer 2007, p. 296, Year 2007.
Fisher Scientific,product webpage for Phenethyl alcohol,99% ,ACRO S Organics. Retrieved from www.fishersci.com on Mar. 19, 2018, Year 2018.

* cited by examiner

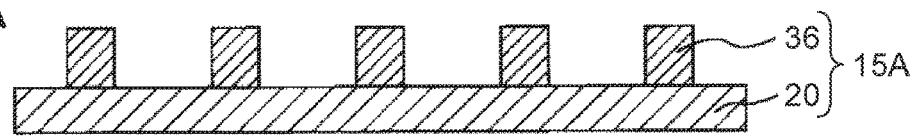
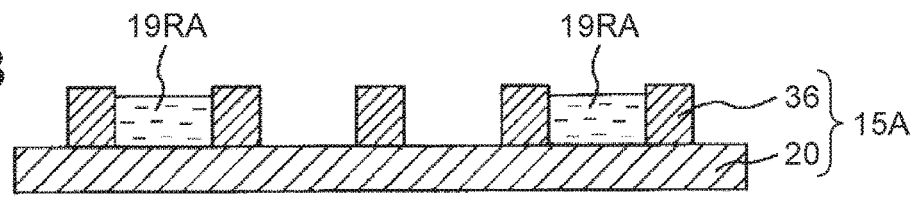
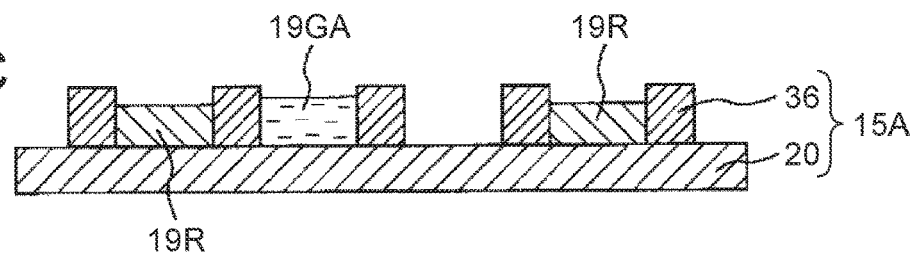
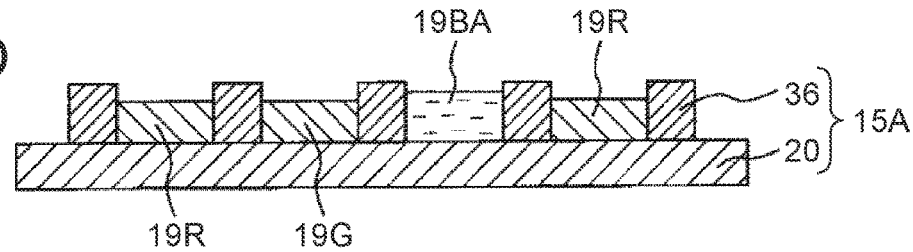
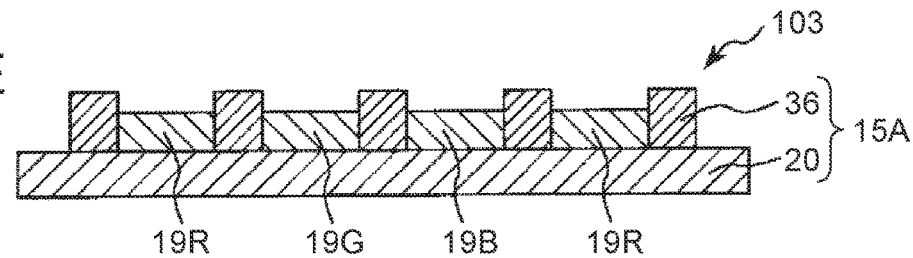

FILM-FORMING INK, FILM FORMATION METHOD, DEVICE WITH FILM, AND ELECTRONIC APPARATUS

TECHNICAL FIELD

The present invention relates to a film-forming ink, a film formation method, a device with a film, and an electronic apparatus.

BACKGROUND ART

As a film formation method, for example, there has been known a method for forming a film by supplying a film-forming ink obtained by dissolving a film-forming material in a solvent onto a base material using a liquid droplet ejection method, and removing the solvent from the film-forming ink on the base material (see, for example, PTL 1).

It has been proposed that by using this film formation method, for example, an organic layer (for example, a light-emitting layer, a hole transport layer, etc.) of an organic electroluminescence (organic EL) element, a colored layer of a color filter, a conductor pattern of a wiring board, etc. are formed.

Patterning (film formation method) of such an organic layer or a film of a conductor pattern or the like is performed by forming a partition wall (bank) including an opening part corresponding to the shape of a film to be formed to ensure a film-forming region, and then, supplying a film-forming ink as a liquid droplet into the opening part, and thereafter removing a solvent by heating.

That is, in a film formation method for a film having such a configuration, generally, a film-forming ink (liquid droplet) is supplied into an opening part included in a partition wall whose surface has been subjected to a water repellency treatment, and thereafter, a solvent is removed by natural drying or by heating through vacuum drying or the like, whereby a film is formed.

At this time, due to a coffee stain phenomenon, a film is formed into a shape in which a film thickness in a central portion is thin and a film thickness at a partition wall edge is thick, that is, the vertical cross-sectional shape is U-shape.

Here, a film whose vertical cross sectional shape is a U-shape is formed by the occurrence of "seeping-up" such that the film-forming material seeps up on a partition wall surface of the partition wall when the solvent is removed by heating. Therefore, due to the occurrence of this "seeping-up", a problem that it becomes difficult to form a film having a uniform thickness arises.

In order to solve such a problem, for example, PTL 2 has proposed that an application step of supplying a liquid droplet into an opening part and a drying step of drying the liquid droplet are performed in a state where a substrate is placed on the same stage, therefore, transfer between the respective steps is performed promptly so as to suppress "seeping-up" of the film-forming material, thereby forming a uniform film. Incidentally, PTL 2 has also proposed that a more uniform film is formed by repeatedly performing these application step and drying step a plurality of times.

However, by such a method, "seeping-up" caused by natural drying of an ink for which the drying time is relatively long can be suppressed, however, "seeping-up" caused by vacuum drying for which the drying time is short cannot be effectively suppressed, and also the method has a problem that huge cost is required for production of a device realizing this method.

CITATION LIST

Patent Literature

PTL 1: JP-A-11-54270
PTL 2: JP-A-2006-346647

SUMMARY OF INVENTION

Technical Problem

An object of the invention is to provide a film-forming ink and a film formation method, capable of forming a film having a uniform thickness in an opening part included in a partition wall by suppressing or preventing seeping-up on a partition wall surface of the film-forming ink to be supplied as a liquid droplet into the opening part, and also to provide a device with a film and an electronic apparatus, each of which has a film formed using the film formation method.

Solution to Problem

Such an object is achieved by the following invention.

A film-forming ink of the invention is characterized by including a film-forming material and a liquid medium in which the film-forming material is dissolved or dispersed, wherein the liquid medium contains a first component which has a viscosity of less than 20 cp and a second component which has a boiling point at an atmospheric pressure within a range of ±30° C. relative to the boiling point at an atmospheric pressure of the first component and has a viscosity of 20 cp or more, and the second component is contained in an amount of 20 parts by weight or more and 500 parts by weight or less with respect to 100 parts by weight of the first component.

By using the film-forming ink having such a configuration, seeping-up on a partition wall surface of the film-forming ink to be supplied as a liquid droplet into an opening part included in a partition wall can be suppressed or prevented. Therefore, a film to be formed can be formed as a film having a uniform thickness.

It is preferred that the viscosity of the film-forming ink of the invention is less than 20 cp.

By setting the viscosity within such a range, a liquid droplet having a weight suitable for ejecting the liquid droplet can be ejected using an inkjet method as a liquid droplet having a uniform weight.

In the film-forming ink of the invention, it is preferred that the liquid medium contains a third component which has a boiling point at an atmospheric pressure lower than the boiling point of the component having a higher boiling point at an atmospheric pressure between the first component and the second component, and has a viscosity of less than 20 cp.

By including the third component having a low viscosity in this manner, when the film-forming ink is supplied into the opening part as a liquid droplet, the viscosity of the film-forming ink can be easily set within a range suitable for forming a liquid droplet, and therefore, the liquid droplet having a uniform size can be ejected with excellent accuracy. Further, after the liquid droplet lands, the liquid droplet can easily wet and spread in the opening part when a liquid coating film is formed in the opening part.

In the film-forming ink of the invention, it is preferred that the boiling point at an atmospheric pressure of the third component is 200° C. or higher and 270° C. or lower.

According to this, the third component is more reliably volatilized before the first component and the second component are volatilized when the liquid coating film is heated and dried.

In the film-forming ink of the invention, it is preferred that the boiling point at an atmospheric pressure of the first component is 200° C. or higher and 300° C. or lower.

By having a boiling point within such a range, undesirable drying of the film-forming ink (first component) in an atmospheric pressure (normal pressure) can be accurately suppressed, and therefore, after the liquid droplet lands, the film-forming ink (liquid droplet) smoothly wets and spreads in the opening part, and also the storage stability of the film-forming ink is improved.

In the film-forming ink of the invention, it is preferred that the first component has a solubility capable of dissolving the film-forming material in an amount of 0.5 wt % or more of the first component.

By having a solubility within such a range, the film-forming material can be sufficiently dissolved in the first component, and in the film-forming ink, the deposition (elution) of the film-forming material can be accurately suppressed or prevented. Therefore, in the opening part, the film-forming ink can be made to uniformly wet and spread in a state where the film-forming material is homogeneously dissolved in the film-forming ink.

In the film-forming ink of the invention, it is preferred that the solubility of dissolving the film-forming material of the second component is lower than that of the first component.

According to this, when vacuum drying or heating drying is performed, in the case where the ratio occupied by the second component in the ink during volatilization is increased, even if seeping-up on a partition wall surface of the liquid coating film occurs, the solubility of the film-forming material in the second component is low, and therefore, the film-forming material can be deposited only in the opening part before the film-forming material seeps up. Therefore, seeping-up of the film-forming material on the partition wall surface can be accurately suppressed or prevented, and therefore, a film having a uniform thickness can be more accurately formed. Further, in the case where a deposition state derived from the second component is not favorable, minute irregularities with a size of 10 nm or more may be formed on the entire outer layer surface of the formed film, however, not a little of the first component having a high solubility is also present just before the completion of drying, and therefore, minute irregularities are eliminated by the first component. Therefore, a film having extremely small irregularities on the outer layer surface of the formed film can be realized.

In the film-forming ink of the invention, it is preferred that the second component includes a hydroxy group.

Here, the surface of the partition wall is subjected to a surface treatment of imparting liquid repellency in some cases. In such a case, a fluorine element is exposed from the surface of the partition wall, and therefore, by using a component including a hydroxy group and having high surface tension as the second component, a repelling force is generated between the surface of the partition wall and the film-forming ink. Due to this, by this repelling force, on the partition wall surface of the partition wall, seeping-up of the film-forming material can be more accurately suppressed or prevented. Further, a solvent having a hydroxy group tends to have a high viscosity, and therefore, because of this, the viscosity of the second component can be easily increased.

In the film-forming ink of the invention, it is preferred that the second component includes an aromatic group.

According to this, the compatibility with the first component can be enhanced, and therefore, separation of the first component from the second component in the film-forming ink can be prevented, and thus, the stability of the film-forming ink is improved.

In the film-forming ink of the invention, it is preferred that the second component includes an acetate group.

According to this, the viscosity of the second component is easily increased.

In the film-forming ink of the invention, it is preferred that the film-forming ink is supplied as a liquid droplet to an opening part included in a partition wall on a substrate, followed by drying, thereby forming a film.

By using the film-forming ink of the invention in such film formation, seeping-up on the partition wall surface of the film-forming ink to be supplied as a liquid droplet into the opening part included in the partition wall can be suppressed or prevented. Therefore, a film to be formed can be formed as a film having a uniform thickness.

A film formation method of the invention is characterized by including a step of supplying the film-forming ink of the invention as a liquid droplet into an opening part included in a partition wall provided on a base material, thereby forming a liquid coating film, and a step of drying the liquid coating film by heating, thereby forming a film in the opening part.

According to the film formation method having such a configuration, a film formed with a uniform thickness can be formed with excellent film formation accuracy in an opening part included in the partition wall.

A device with a film of the invention is characterized by including a film formed by the film formation method of the invention or a film obtained by treating the film.

Such a device with a film includes a film formed with a uniform thickness, and therefore has excellent reliability.

An electronic apparatus of the invention is characterized by including the device with a film of the invention.

Such an electronic apparatus includes the device with a film having excellent reliability, and therefore has excellent reliability.

BRIEF DESCRIPTION OF DRAWINGS

FIG. 7 is a view illustrating a case where the film formation method of the invention is applied to the production of the color filter.

DESCRIPTION OF EMBODIMENTS

Figure 1A:
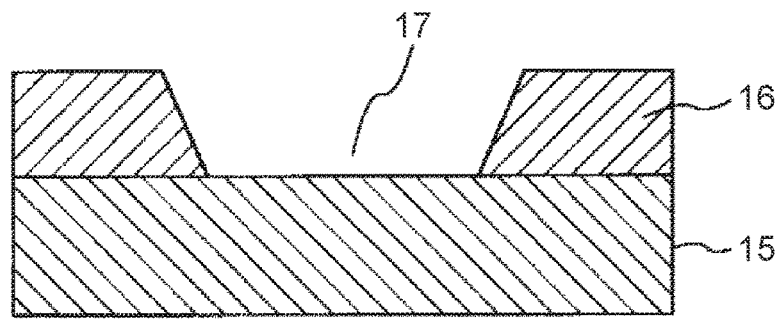
FIG. 1 is a view for illustrating a film formation method of the invention.

Hereinafter, preferred embodiments of the invention will be described in detail.
(Film-Forming Ink)

A film-forming ink of the invention includes a film-forming material and a liquid medium in which the film-forming material is dissolved or dispersed.

In particular, the film-forming ink of the invention is characterized in that the liquid medium contains a first component which has a viscosity of less than 20 cp and a second component which has a boiling point at an atmospheric pressure within a range of ±30° C. relative to the boiling point at an atmospheric pressure of the first component and has a viscosity of 20 cp or more. As will be described in detail later, such a film-forming ink is supplied as a liquid droplet into an opening part (concave part) included in a partition wall provided on a base material, thereby forming a liquid coating film in the opening part, and thereafter, this liquid coating film is subjected to vacuum drying or heating drying, thereby forming a film, however, during the vacuum drying or heating drying, the occurrence of "seeping-up" such that the film-forming material seeps up on a partition wall surface of the partition wall can be accurately suppressed or prevented. Therefore, a film to be formed can be formed as a film having a uniform thickness.

Hereinafter, the respective components of the film-forming ink of the invention will be described in detail.
(Film-Forming Material)

The film-forming material contained in the film-forming ink of the invention is a constituent material of a film to be formed or a precursor thereof.

Such a film-forming material is determined according to the type of a film to be formed and is not particularly limited, and various organic materials, various inorganic materials, and mixtures thereof can be used. For example, examples of the film-forming material include a constituent material of each layer (particularly, an organic layer) of an organic electroluminescence (organic EL) element or a precursor thereof, a constituent material of a conductor pattern of a wiring board or a precursor thereof, and a constituent material of a colored layer of a color filter or a precursor thereof, which will be described later.

In this manner, by using a constituent material of an organic layer of an organic electroluminescence element or a precursor thereof as the film-forming material, an organic layer (for example, a hole transport layer, a hole injection layer, a light-emitting layer, an intermediate layer, or the like) of an organic electroluminescence element can be formed. Further, by using a constituent material of a conductor pattern of a wiring board or a precursor thereof as the film-forming material, a conductor pattern of a wiring board can be formed. In addition, by using a constituent material of a colored layer of a color filter or a precursor thereof as the film-forming material, a colored layer of a color filter can be formed. Incidentally, these materials will be described in detail later.

Further, as the film-forming material, for example, two or more types of components selected from the above-mentioned materials may be used in combination.

Incidentally, in the film-forming ink, the film-forming material may be a material which is dissolved in the below-mentioned liquid medium or may be a material which is dispersed therein, however, in the case where the film-forming material is a material which is dispersed in the liquid medium, the average particle diameter of the film-forming material is preferably from 20 to 100 nm, more preferably from 5 to 50 nm. According to this, the dispersion stability of the film-forming material in the film-forming ink can be made excellent.

Further, in the case where the film-forming material contains an organic material as a main material, by appropriately selecting the first component and the second component, the film-forming material can be dissolved in the liquid medium.

On the other hand, in the case where the film-forming material contains an inorganic material or the case where the film-forming material is insoluble in the liquid medium even if the film-forming material is an organic material, the film-forming material may be dispersed in the liquid medium.

The content of the film-forming material in the film-forming ink is determined according to the use of the film-forming ink and is not particularly limited, but, for example, is preferably from 0.01 to 10 wt %, more preferably from 0.05 to 5 wt %. When the content of the film-forming material is a value within the above range, the ejection property (ejection stability) from a liquid droplet ejection head (inkjet head) for film formation can be made particularly excellent.
(Liquid Medium)

The liquid medium contained in the film-forming ink of the invention contains a first component and a second component, and is a component in which the above-mentioned film-forming material is dissolved or dispersed, that is, it is a solvent or a dispersion medium. This liquid medium is such a material that almost the entire amount (the most part) thereof is volatilized and removed by vacuum drying or heating drying in the below-mentioned film formation method (film formation process).

In particular, the liquid medium contained in the film-forming ink of the invention contains a first component which has a viscosity of less than 20 cp and a second component which has a boiling point at an atmospheric pressure within a range of ±30° C. relative to the boiling point at an atmospheric pressure of the first component and has a viscosity of 20 cp or more.

In such a film-forming ink, the second component is a component which has a boiling point at an atmospheric pressure within a range of ±30° C. relative to the boiling point at an atmospheric pressure of the first component and has a viscosity of 20 cp or more. By including a component having a high viscosity such that the viscosity is 20 cp or more in the liquid medium, when the liquid coating film formed in the opening part is subjected to vacuum drying or heating drying, the viscosity of the liquid coating film can be further increased. Such an increase in the viscosity decreases the flowability of the liquid itself. Due to this, the occurrence of "seeping-up" such that the film-forming material seeps up on the partition wall surface of the partition wall can be accurately suppressed or prevented. As a result, a film to be formed can be formed as a film having a uniform thickness.

Further, the first component and the second component are components which have a difference in boiling point at an atmospheric pressure within a range of ±30° C. By having such a difference in boiling point, when the liquid coating film formed in the opening part is subjected to vacuum drying or heating drying, the first component and the second component can be azeotropically distilled off, and the viscosity of the liquid coating film can be further increased while preventing preferential volatilization of either one component. As a result, the occurrence of seeping-up on the partition wall surface of the partition wall can be accurately suppressed or prevented.

Such a first component and a second component are not particularly limited as long as they have a boiling point relationship as described above and the film-forming ink can dissolve or disperse the film-forming material, and various solvents or various dispersion media can be used. Incidentally, in the following description, a case where at least the first component of the first component and the second component is a solvent capable of dissolving the film-forming material will be described as one example.

Incidentally, in this description, the "normal pressure" refers to a pressure equivalent to the atmospheric pressure, and is specifically, $10^5$ Pa (1013 mbar). Further, the "normal temperature" refers to a range of 20° C.±15° C. (that is, 5° C. or higher and 35° C. or lower).

Further, as the liquid medium, a most suitable medium is selected and can be used according to the type of the film-forming material or the use of the film to be formed.

Further, as the liquid medium, a medium which has the lowest possible aggressiveness to the film-forming material or other components contained in the film-forming ink is preferably used. According to this, alteration or deterioration of the film-forming ink can be reliably suppressed or prevented.

Further, in the case where the liquid medium may remain in the film after film formation, it is preferred to use a medium which least inhibits the properties according to the use of the film as the liquid medium. For example, in the case where the film-forming ink is used for forming an organic layer of an organic EL element, it is preferred to select each component of the liquid medium by also considering the electrical properties. Further, in the case where the film-forming ink is used for forming a colored layer of a color filter, it is preferred to select each component of the liquid medium by also considering the optical properties.

Hereinafter, the first component and the second component will be described in detail.

[First Component]

The first component is a component which has a viscosity of less than 20 cp. Further, in this embodiment, the first component is a component which shows a dissolution property of dissolving the film-forming material.

By including such a first component, after the liquid droplet lands, when the liquid coating film is formed in the opening part, the film-forming material can wet and spread in the opening part without undesirably depositing.

Such a first component A is not particularly limited, however, examples thereof include A-1) dibenzyl ether (boiling point: 298° C., viscosity: 10.5 cp, surface tension: 37 N/m), A-2) 4-isopropyl biphenyl (boiling point: 291° C., viscosity: 9.8 cp, surface tension: 37 N/m), A-3) benzyl phenyl ether (boiling point: 288° C., viscosity: 12 cp, surface tension: 37 N/m), A-4) 3-phenoxy toluene (boiling point: 272° C., viscosity: 5.8 cp, surface tension: N/m), A-5) octyl benzene (boiling point: 268° C., viscosity: 2.8 cp, surface tension: 30 N/m), A-6) 2-isopropyl naphthalene (boiling point: 268° C., viscosity: 5.6 cp, surface tension: 36 N/m), A-7) 4-methyl biphenyl (boiling point: 268° C., viscosity: 10.2 cp, surface tension: 37 N/m), A-8) diphenylmethane (boiling point: 265° C., viscosity: 5.5 cp, surface tension: 37 N/m), A-9) diphenyl ether (boiling point: 260° C., viscosity: 5.8 cp, surface tension: 37 N/m), A-10) 2-methyl biphenyl (boiling point: 256° C., viscosity: 10.0 cp, surface tension: 37 N/m), A-11) 1-methyl naphthalene (boiling point: 244° C., viscosity: 6.0 cp, surface tension: 36 N/m), A-12) cyclohexyl benzene (boiling point: 236° C., viscosity: 2.6 cp, surface tension: 24 N/m), A-13) heptyl benzene (boiling point: 235° C., viscosity: 2.8 cp, surface tension: 30 N/m), A-14) hexyl benzene (boiling point: 226° C., viscosity: 2.7 cp, surface tension: 29 N/m), and A-15) pentyl benzene (boiling point: 205° C., viscosity: 2.7 cp, surface tension: 29 N/m), and it is possible to use one type or two or more types in combination among these.

This first component is a component which has a viscosity of less than 20 cp, but desirably has a viscosity of 10 cP or less, more desirably 1 cP or less. According to this, an undesirable increase in the viscosity of the film-forming ink can be accurately suppressed, and therefore, the ink can be stably ejected, and thus, can be reliably supplied as a liquid droplet into the opening part included in the partition wall, and also can be made to wet and spread in the opening part more smoothly.

Further, the first component preferably has a boiling point at an atmospheric pressure of 200° C. or higher and 300° C. or lower, and preferably 220° C. or higher and 280° C. or lower. According to this, undesirable drying of the film-forming ink (first component) in an atmospheric pressure (normal pressure) can be accurately suppressed, and therefore, after the liquid droplet lands, the film-forming ink (liquid droplet) smoothly wets and spreads in the opening part, and also the storage stability of the film-forming ink is improved.

Further, the first component is a solvent capable of dissolving the film-forming material in this embodiment, and preferably has a solubility capable of dissolving the film-forming material in an amount of 0.5 wt % or more, more preferably 1.5 wt % or more and 4.5 wt % or less of the first component. By having a solubility within such a range, the film-forming material can be sufficiently dissolved in the first component, and in the film-forming ink, the deposition of the film-forming material can be accurately suppressed or prevented. Therefore, in the opening part, the film-forming ink can be made to uniformly wet and spread in a state where the film-forming material is homogeneously dissolved in the film-forming ink.

[Second Component]

The second component is a component which has a boiling point at an atmospheric pressure within a range of ±30° C. relative to the boiling point at an atmospheric pressure of the first component and has a viscosity of 20 cp or more.

By including a component having a high viscosity in the liquid medium in this manner, when the liquid coating film formed in the opening part is subjected to vacuum drying or heating drying, the viscosity of the liquid coating film can be further increased. Due to this, the occurrence of "seeping-up" such that the film-forming material seeps up on the partition wall surface of the partition wall can be accurately suppressed or prevented. As a result, a film to be formed is formed as a film having a uniform thickness.

Further, the second component is a component which has a difference in boiling point at an atmospheric pressure from the first component within a range of ±30° C. By having such a difference in boiling point, when the liquid coating film formed in the opening part is subjected to vacuum drying or heating drying, the first component and the second component can be azeotropically distilled off, and the viscosity of the liquid coating film can be further increased while preventing preferential volatilization of either one component. As a result, the occurrence of seeping-up on the partition wall surface of the partition wall can be accurately suppressed or prevented.

Incidentally, the second component and the first component are in the form of a liquid at normal temperature and normal pressure in a coexistence state. According to this, the film-forming ink can be ejected as a liquid droplet, and further, after the ejection, the film-forming ink can be made to wet and spread in the opening part. That is, the function as the film-forming ink can be exhibited. Further, the second component and the first component are required to be homogeneous throughout the entire film-forming ink also during the long-term storage of the ink, and therefore, components having compatibility with each other are selected, respectively.

Such a second component is not particularly limited, however, examples thereof include B-1) diethylene glycol monophenyl ether (boiling point: 298° C., viscosity: 47 cp, surface tension: 45 N/m), B-2) glycerin (boiling point: 290° C., viscosity: 1412 cp, surface tension: 63 N/m), B-3) triethylene glycol (boiling point: 288° C., viscosity: 39.5 cp, surface tension: 45 N/m), B-4) 2-(benzyloxy)ethanol (boiling point: 256° C., viscosity: 20 cp, surface tension: 40 N/m), B-5) diethyl iminodiacetate (boiling point: 248° C., viscosity: 104 cp), B-6) diethylene glycol (boiling point: 245° C., viscosity: 28.5 cp, surface tension: 49 N/m), B-7) propylene glycol monophenyl ether (boiling point: 243° C., viscosity: 23.2 cp, surface tension: 38 N/m), B-8) ethylene glycol monophenyl ether (boiling point: 237° C., viscosity: 37 cp, surface tension: 42 N/m), and B-9) 1,3-propanediol (boiling point: 214° C., viscosity: 39.2 cp, surface tension: 47 N/m), and it is possible to use one type or two or more types in combination among these.

Further, among these, the second component is preferably a component which includes a hydroxy group and has high surface tension. Here, the surface of the partition wall is subjected to a surface treatment of imparting liquid repellency in some cases. In such a case, a fluorine element is exposed from the surface of the partition wall, and therefore, by using a component including a hydroxy group and having high surface tension as the second component, a repelling force is generated between the surface of the partition wall and the film-forming ink. Due to this, by this repelling force, on the partition wall surface of the partition wall, seeping-up of the film-forming material can be more accurately suppressed or prevented. Further, the surface of the base material exposed from the opening part of the partition wall is constituted by a metal oxide such as ITO, and due to this, a hydroxy group is exposed from the surface of the base material in some cases. In such a case, the surface of the base material and the second component have excellent affinity, and therefore, the film-forming ink supplied as a liquid droplet into the opening part can be made to wet and spread more smoothly.

Such a second component having a hydroxy group is preferably a component which further includes an aromatic group. According to this, the compatibility with the first component can be enhanced, and therefore, separation of the first component from the second component in the film-forming ink can be prevented, and thus, the stability of the film-forming ink is improved.

Further, the second component is preferably a component which includes an acetate group. According to this, the viscosity of the second component is easily increased.

The second component is a component which has a viscosity of 20 cP or more, but preferably has a viscosity of 30 cP or more and 1500 cP or less. According to this, when the liquid coating film formed in the opening part is dried by heating, the viscosity of the liquid coating film can be further increased, and the occurrence of seeping-up on the partition wall surface of the partition wall can be accurately suppressed or prevented.

Further, a difference between the viscosity of the first component and the viscosity of the second component is desirably 10 cP or more. By increasing the difference in this manner, when the first component and the second component are volatilized, the viscosity of the film-forming ink itself in the opening part is increased, and therefore, seeping-up on the partition wall surface of the partition wall can be accurately suppressed or prevented.

Further, the second component has a boiling point at an atmospheric pressure within a range of ±30° C. relative to the boiling point at an atmospheric pressure of the first component, but preferably has a boiling point at an atmospheric pressure within a range of ±15° C. relative to the boiling point at an atmospheric pressure of the first component. According to this, when the liquid coating film formed in the opening part is dried by heating, the first component and the second component can be more reliably azeotropically distilled off, and the viscosity of the liquid coating film can be more reliably increased while preventing preferential volatilization of either one component. As a result, the occurrence of seeping-up on the partition wall surface of the partition wall can be more accurately suppressed or prevented.

Further, the second component has a surface tension of preferably 35 mN/m or more, more preferably 40 mN/m or more and 75 mN/m or less. According to this, the surface tension of the film-forming ink can be increased, and therefore, the occurrence of seeping-up of the film-forming material on the partition wall surface of the partition wall can be accurately suppressed or prevented.

Further, the second component is preferably such that, although the first component is a solvent capable of dissolving the film-forming material in this embodiment, the solubility of dissolving the film-forming material of the second component is lower than that of the first component. According to this, when the liquid coating film is subjected to vacuum drying or heating drying, in the case where the ratio occupied by the second component in the ink during volatilization is increased, even if seeping-up on the partition wall surface of the liquid coating film occurs, the solubility of the film-forming material in the second component is low, and therefore, the film-forming material can be deposited only in the opening part before the film-forming material seeps up. Therefore, seeping-up of the film-forming material on the partition wall surface can be accurately suppressed or prevented, and thus, a film having a uniform thickness can be more accurately formed. Further, in the case where a deposition state derived from the second component is not favorable, minute irregularities with a size of 10 nm or more may be formed on the entire outer layer surface of the formed film, however, not a little of the first component having a high solubility is also present just before the completion of drying, and therefore, minute irregularities are eliminated by the first component. Therefore, a film having extremely small irregularities on the outer layer surface of the formed film can be realized. Incidentally, specifically, the second component preferably has a solubility capable of dissolving the film-forming material in an amount of 0.1 wt % or more, more preferably 0.5 wt % or more and 1.0 wt % or less of the second component. According to this, the above-mentioned effect can be reliably obtained.

Further, the content of the second component with respect to 100 parts by weight of the first component is 20 parts by weight or more and 500 parts by weight or less, but is preferably 40 parts by weight or more and 500 parts by weight or less, more preferably 60 parts by weight or more and 500 parts by weight or less. By setting the content thereof within the range of 20 parts by weight or more and 500 parts by weight or less, seeping-up of the film-forming material on the partition wall surface when the liquid coating film is subjected to vacuum drying or heating drying can be accurately suppressed or prevented. Further, by setting the content thereof within the preferred range, and within the more preferred range, the viscosity of the film-forming ink can be easily set to fall within a range suitable for ejecting the ink in the opening part as a liquid droplet.

Further, the liquid medium as described above may contain another component other than the above-mentioned second component and first component as long as the component shows compatibility in the film-forming ink, and has a boiling point at an atmospheric pressure lower than the boiling point of the component having a higher boiling point at an atmospheric pressure between the first component and the second component, and for example, may contain a third component as shown below.

[Third Component]

The third component is a component which has a boiling point at an atmospheric pressure lower than the boiling point of the component having a higher boiling point at an atmospheric pressure between the first component and the second component, and has a viscosity of less than 20 cp.

By including the third component having a low viscosity in this manner, when the film-forming ink is supplied into the opening part as a liquid droplet, the viscosity of the film-forming ink can be easily set within a range suitable for forming a liquid droplet, and therefore, the liquid droplet having a uniform size can be ejected with excellent accuracy. Further, after the liquid droplet lands, the liquid droplet can easily wet and spread in the opening part when the liquid coating film is formed in the opening part.

Further, the third component has higher volatility than the first component and the second component, and therefore, when the liquid coating film is subjected to vacuum drying or heating drying, the third component is volatilized (removed) before the first component and the second component are volatilized (removed). Therefore, even if seeping-up of the film-forming ink on the partition wall surface of the partition wall occurs when the third component is removed, the first component and the second component remain in the film-forming ink, and the removal of the first component and the second component occurs after the removal of the third component is completed. Therefore, the removal of the first component and the second component is started in a state where the seeping-up is eliminated. Accordingly, even when the film-forming ink is configured to include the third component, the effect obtained by configuring the film-forming ink to include the first component and the second component described above is obtained in the same manner.

Incidentally, the third component is preferably a component in the form of a liquid at normal temperature and normal pressure. According to this, the third component can be more smoothly volatilized from the film-forming ink after the film-forming ink as a liquid droplet wets and spreads in the opening part.

Further, this third component and the first component and the second component are required to be homogeneous throughout the entire film-forming ink also during the long-term storage of the ink, and therefore, components having compatibility with one another are selected, respectively.

Such a third component C is not particularly limited, however, examples thereof include C-1) triethylene glycol butyl methyl ether (boiling point: 261° C., viscosity: 2.9 cp, surface tension: 28 N/m), C-2) diethylene glycol butyl ether (boiling point: 256° C., viscosity: 2.4 cp, surface tension: 25 N/m), C-3) cyclohexyl benzene (boiling point: 236° C., viscosity: 2.6 cp, surface tension: 24 N/m), C-4) heptyl benzene (boiling point: 235° C., viscosity: 2.8 cp, surface tension: 30 N/m), C-5) hexyl benzene (boiling point: 226° C., viscosity: 2.7 cp, surface tension: 29 N/m), C-6) triethylene glycol ethyl methyl ether (boiling point: 225° C., viscosity: 2.4 cp, surface tension: 29 N/m), C-7) tripropylene glycol dimethyl ether (boiling point: 215° C., viscosity: 2.3 cp, surface tension: 26 N/m), C-8) diethylene glycol butylmethyl ether (boiling point: 212° C., viscosity: 1.6 cp, surface tension: 24 N/m), C-9) 1,4-diisopropyl benzene (boiling point: 210° C., viscosity: 1.6 cp, surface tension: 28 N/m), C-10) pentyl benzene (boiling point: 205° C., viscosity: 2.7 cp, surface tension: 29 N/m), C-11) 1,3-diisopropyl benzene (boiling point: 203° C., viscosity: 2.7 cp, surface tension: 29 N/m), and C-12) ethylene glycol dibutyl ether (boiling point: 203° C., viscosity: 2.4 cp, surface tension: 24 N/m), and it is possible to use one type or two or more types in combination among these.

This third component is a component which has a viscosity of less than 20 cp, but preferably has a viscosity of 1 cP or more and 5 cP or less. According to this, the viscosity of the film-forming ink can be easily set within a suitable range when supplying the film-forming ink as a liquid droplet into the opening part, and also the film-forming ink can be made to wet and spread in the opening part more smoothly.

This third component has a boiling point at an atmospheric pressure lower than the boiling point of the component having a higher boiling point at an atmospheric pressure between the first component and the second component, but is preferably has a boiling point at an atmospheric pressure lower than the boiling points of both of the first component and the second component. According to this, the above-mentioned effect can be more prominently exhibited.

Further, this third component has a boiling point at an atmospheric pressure of preferably 200° C. or higher and 270° C. or lower, more preferably 210° C. or higher and 240° C. or lower. According to this, the third component is more reliably volatilized (removed) before the first component and the second component are volatilized (removed) when the liquid coating film is subjected to vacuum drying or heating drying.

Further, a difference between the boiling point of the third component and the boiling point of the component having a higher boiling point at an atmospheric pressure between the first component and the second component is preferably more than 30° C., more preferably 60° C. or more. According to this, when the third component is removed by volatilization from the film-forming ink, undesirable volatilization and removal of the first component and the second component along with the third component can be accurately suppressed or prevented.

Further, the third component has a surface tension of 20 mN/m or more and 30 mN/m or less. According to this, after a liquid droplet lands, when the liquid coating film is formed in the opening part, the liquid droplet can be more reliably made to wet and spread in the opening part.

Further, the content of the third component is preferably 20 parts by weight or more and 500 parts by weight or less, more preferably 40 parts by weight or more and 500 parts by weight or less with respect to 100 parts by weight of the first component. By setting the content of the third component within such a range, the viscosity of the film-forming ink can be easily set within a suitable range when supplying the film-forming ink as a liquid droplet into the opening part, and also the film-forming ink can be made to wet and spread in the opening part more smoothly.

Incidentally, in addition to the above-mentioned third component, the liquid medium may contain a fourth component and a fifth component, etc., each of which shows compatibility and has a boiling point at an atmospheric pressure lower than the boiling point of the component having a higher boiling point at an atmospheric pressure between the first component and the second component, or the boiling points of both of the first component and the second component as other components.

The film-forming ink as described above is used in a film formation method using an inkjet method (a liquid droplet ejection method) as described later. According to the inkjet method, a uniform number (a uniform liquid droplet amount) of liquid droplets with a uniform size can be relatively easily and reliably supplied into the opening part formed on the substrate.

Hereinafter, the film formation method by an inkjet method using this film-forming ink will be described.
(Film Formation Method)

Next, the film formation method using the above-mentioned film-forming ink, that is, the film formation method of the invention will be described.

Figure 1B:
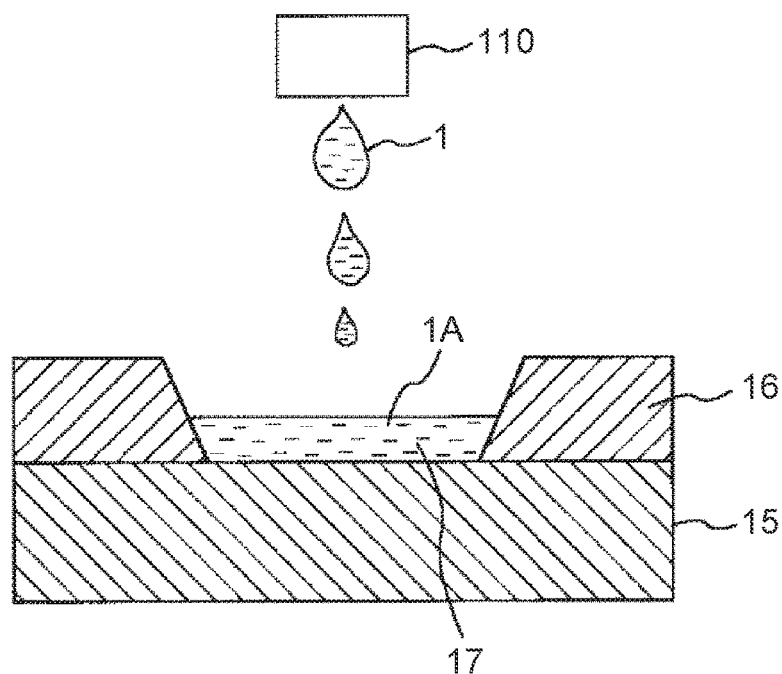
Figure 1C:
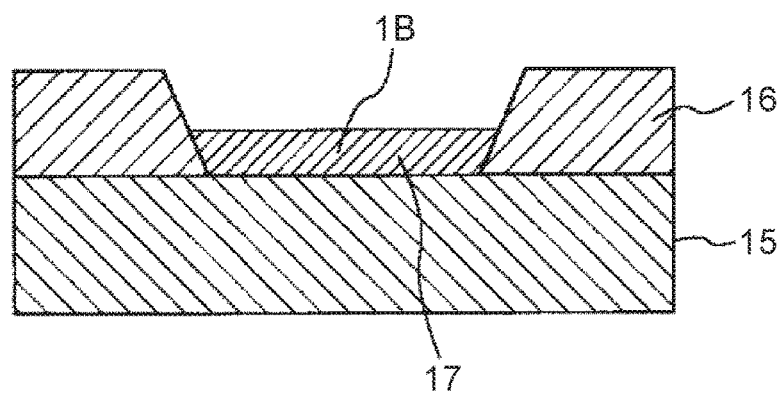
Figure 2:
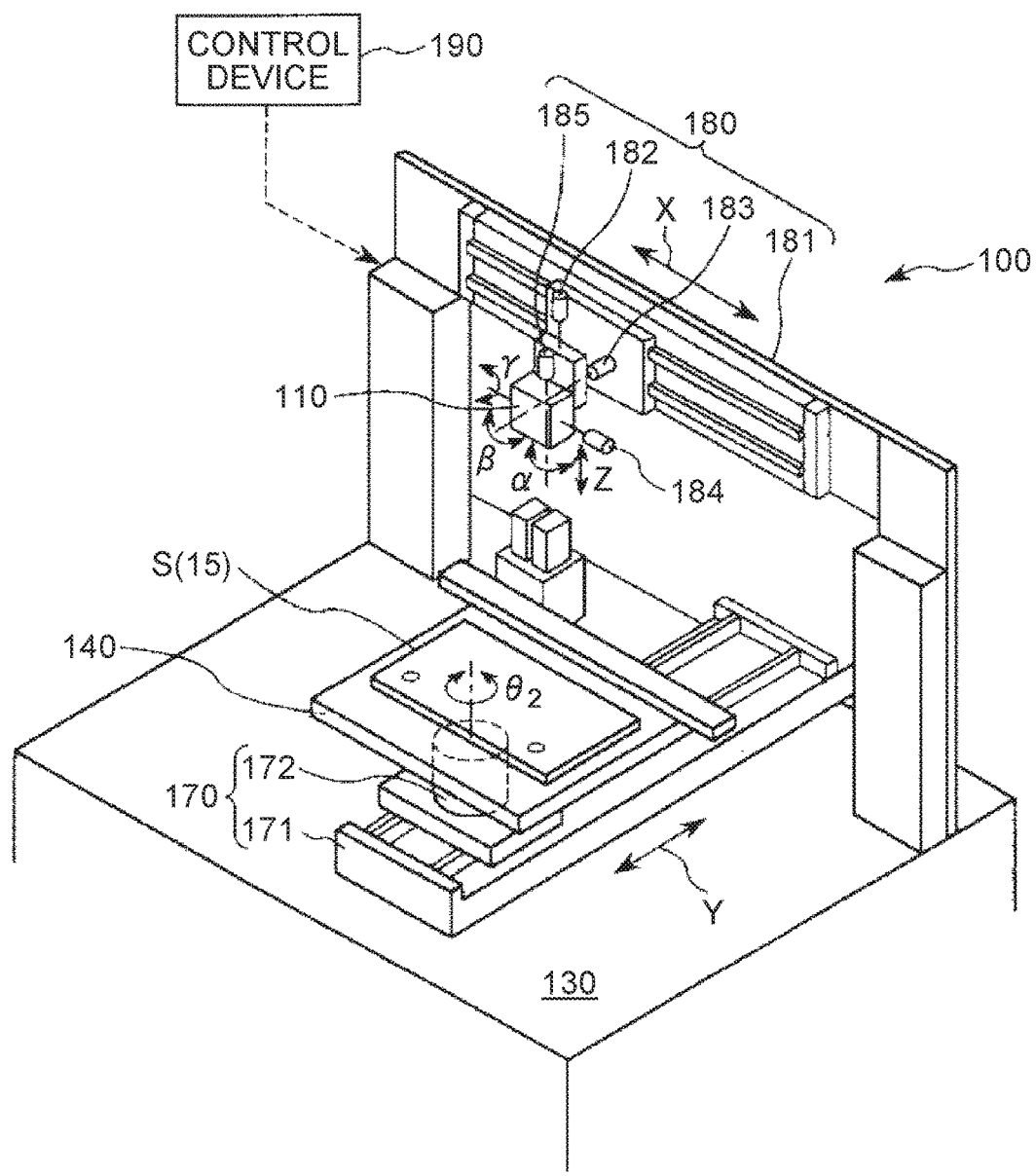
FIG. 2 is a perspective view showing a schematic configuration of a liquid droplet ejection device to be used in the film formation method of the invention.
Figure 3:
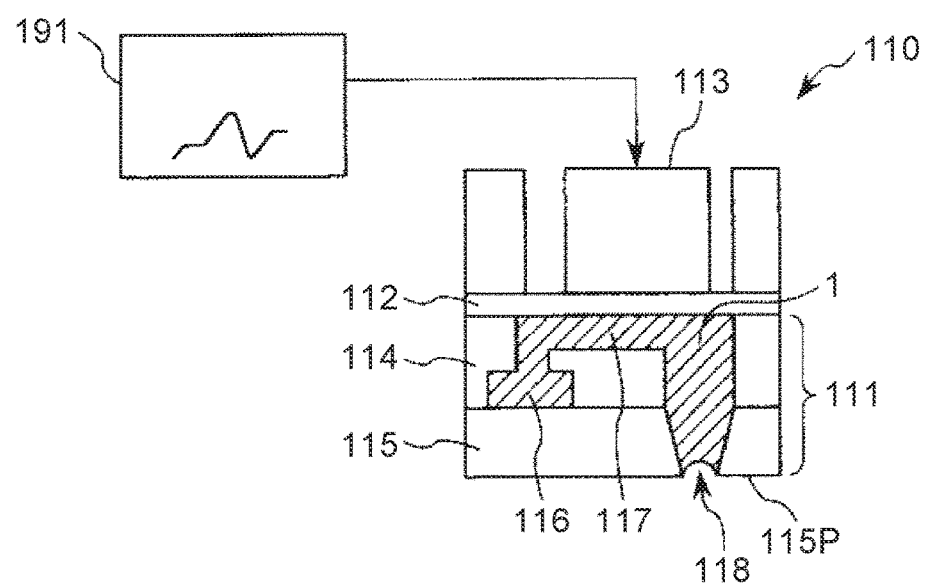
FIG. 3 is a schematic view for illustrating a schematic configuration of a liquid droplet ejection head included in the liquid droplet ejection device shown in FIG. 2.

FIG. 1 is a view for illustrating the film formation method of the invention, FIG. 2 is a perspective view showing a schematic configuration of a liquid droplet ejection device to be used in the film formation method of the invention, and FIG. 3 is a schematic view for illustrating a schematic configuration of a liquid droplet ejection head included in the liquid droplet ejection device shown in FIG. 2.

The film formation method (film production method) of the invention includes [1] a step of supplying the above-mentioned film-forming ink as a liquid droplet into an opening part included in a partition wall provided on a base material, thereby forming a liquid coating film (ink application step), and [2] a step of drying the liquid coating film by subjecting the liquid coating film to a vacuum drying or heating drying, thereby forming a film containing the film-forming material as a main component (drying step).

According to the film formation method having such a configuration, a film which is homogeneous and has a uniform thickness can be formed with excellent film formation accuracy in the opening part included in the partition wall.

Hereinafter, the respective steps of the film formation method of the invention will be sequentially described in detail.
[1] Ink Application Step
1-1

First, as shown in FIG. 1(a), a base material 15 provided with a partition wall 16 on the upper surface thereof is prepared.

This base material 15 is an object on which a film to be formed is formed and is not particularly limited, and for example, various substrates, materials obtained by subjecting various substrates to a treatment, a process, or the like, etc. can be used.

Further, the partition wall 16 can be obtained by forming a layer constituted by any of various materials on almost the entire upper surface of the base material 15, and thereafter forming an opening part 17 by patterning this layer.
1-2

Subsequently, as shown in FIG. 1(b), in the opening part 17 included in the partition wall 16 provided on the base material 15, the above-mentioned film-forming ink 1 is supplied. By doing this, a liquid coating film 1A composed of the film-forming ink 1 is formed in the opening part 17.

In this embodiment, the film-forming ink 1 is supplied into the opening part 17 by a liquid droplet ejection method. That is, by using a liquid droplet ejection device which ejects the film-forming ink, the film-forming ink 1 is ejected as a liquid droplet, and the film-forming ink 1 is supplied into the opening part 17.

Here, a preferred embodiment of the liquid droplet ejection device will be described.

FIG. 2 is a perspective view showing a schematic configuration of a liquid droplet ejection device to be used in the film formation method of the invention, and FIG. 3 is a schematic view for illustrating a schematic configuration of a liquid droplet ejection head included in the liquid droplet ejection device shown in FIG. 2.

As shown in FIG. 2, a liquid droplet ejection device 100 includes a liquid droplet ejection head (inkjet head, hereinafter simply referred to as "head") 110, a base 130, a table 140, an ink reservoir part (not shown), a table positioning unit 170, a head positioning unit 180, and a control device 190.

The base 130 is a stand which supports the respective constituent members of the liquid droplet ejection device 100 such as the table 140, the table positioning unit 170, and the head positioning unit 180.

The table 140 is installed in the base 130 through the table positioning unit 170. The table 140 is a member on which the base material 15 is placed.

Further, on the rear surface of the table 140, a rubber heater (not shown) is disposed. The entire upper surface of the base material 15 placed on the table 140 can be heated to a predetermined temperature by the rubber heater.

The table positioning unit 170 includes a first moving unit 171 and a motor 172. The table positioning unit 170 positions the table 140 in the base 130, and thereby the position of the base material 15 in the base 130 is determined.

The first moving unit 171 includes two rails provided substantially parallel to the Y direction, and a support stand which moves on the rails. The support stand of the first moving unit 171 supports the table 140 through the motor 172. Then, by moving the support stand on the rails, the table 140 on which the base material 15 is placed is moved and positioned in the Y direction.

The motor 172 supports the table 140 and swings and positions the table 140 in the θz direction.

The head positioning unit 180 includes a second moving unit 181, a linear motor 182, and motors 183, 184, and 185. The head positioning unit 180 positions the head 110.

The second moving unit 181 includes two support pillars provided vertically from the base 130, a rail stand provided between the support pillars and supported by the support pillars and having two rails, and a support member (not shown) which can move along the rails and supports the head 110. Then, by moving the support member along the rails, the head 110 is moved and positioned in the X direction.

The linear motor 182 is provided near the support member, and can move and position the head 110 in the Z direction.

The motors 183, 184, and 185 swing and position the head 110 in the α, β, and γ directions, respectively.

By the table positioning unit 170 and the head positioning unit 180 as described above, the liquid droplet ejection device 100 is configured to be able to accurately control the relative position and posture between an ink ejection surface 115P of the head 110 and the base material 15 on the table 140.

As shown in FIG. 3, the head 110 ejects the film-forming ink 1 from a nozzle (ejecting part) 118 by an inkjet system (liquid droplet ejection system). In this embodiment, the head 110 uses a piezo system in which an ink is ejected using a piezo element 113 as a piezoelectric element. The piezo system does not apply heat to the film-forming ink 1, and therefore has an advantage that it does not affect the composition of the material, etc.

The head 110 includes a head main body 111, a vibrating plate 112, and a piezo element 113.

The head main body 111 includes a main body 114 and a nozzle plate 115 on the lower end surface thereof. Then, by sandwiching the main body 114 between the plate-shaped nozzle plate 115 and the plate-shaped vibrating plate 112, a reservoir 116 as a space and a plurality of ink chambers 117 branched from the reservoir 116 are formed.

To the reservoir 116, the film-forming ink 1 is supplied from the below-mentioned ink reservoir part. The reservoir 116 forms a flow path for supplying the film-forming ink 1 to each ink chamber 117.

Further, the nozzle plate 115 is attached to the lower end surface of the main body 114, and constitutes the ink ejection surface 115P. In this nozzle plate 115, a plurality of nozzles 118 for ejecting the film-forming ink 1 are opened corresponding to each ink chamber 117. Then, the ink flow path is formed from each ink chamber 117 to the corresponding nozzle (ejection part) 118.

The vibrating plate 112 is attached to the upper end surface of the head main body 111, and constitutes the partition wall surface of each ink chamber 117. The vibrating plate 112 can vibrate according to the vibration of the piezo element 113.

The piezo element 113 is provided corresponding to each ink chamber 117 on the opposite side to the head main body 111 of the vibrating plate 112. The piezo element 113 is configured such that a piezoelectric material such as quartz is sandwiched between a pair of electrodes (not shown). The pair of electrodes are connected to a driving circuit 191.

Then, when an electrical signal is input to the piezo element 113 from the driving circuit 191, the piezo element 113 is expanded and deformed or contracted and deformed. When the piezo element 113 is contracted and deformed, the pressure in the ink chamber 117 is decreased, and the film-forming ink 1 flows in the ink chamber 117 from the reservoir 116. Further, when the piezo element 113 is expanded and deformed, the pressure in the ink chamber 117 is increased, and the film-forming ink 1 is ejected from the nozzle 118. Incidentally, by changing the applied voltage, the deformation amount of the piezo element 113 can be controlled. Further, by changing the frequency of the applied voltage, the deformation speed of the piezo element 113 can be controlled. That is, by controlling the applied voltage to the piezo element 113, the ejection conditions for the film-forming ink 1 can be controlled.

The control device 190 controls the respective parts of the liquid droplet ejection device 100. For example, by adjusting the waveform of the applied voltage generated by the driving circuit 191, the ejection conditions for the film-forming ink 1 are controlled, or by controlling the head positioning unit 180 and the table positioning unit 170, the ejection position of the film-forming ink 1 to the base material 15 is controlled.

The ink reservoir part (not shown) reserves the film-forming ink 1.

The ink reservoir part (not shown) is connected to the head 110 (reservoir 116) through a conveyance path (not shown).

By using the liquid droplet ejection device 100 as described above, from the head 110, the film-forming ink 1 is ejected as a liquid droplet and lands in the opening part 17 included in the partition wall 16, whereby the film-forming ink 1 is supplied into the opening part 17.

This liquid droplet preferably has a weight of 2 ng or more and 12 ng or less, more preferably has a weight of ng or more and 10 ng or less when it is ejected. According to this, a liquid droplet having a uniform weight can be ejected from the liquid droplet ejection head.

The viscosity of the film-forming ink is preferably set to, for example, less than 20 cP, more preferably set to 3 cP or more and 15 cP or less. According to this, a liquid droplet having a weight within the above range can be accurately ejected from the head 110 as a liquid droplet having a uniform weight.

Then, when the liquid droplet lands in the opening part 17, that is, when the film-forming ink 1 is supplied thereto, this film-forming ink 1 wets and spreads in the opening part 17, and as a result, a liquid coating film 1A composed of the film-forming ink 1 is formed in the opening part 17 (see FIG. 1(*b*)).

The temperature and pressure in the atmosphere in this ink application step [1] are each determined according to the composition of the film-forming ink 1 or the boiling points and the melting points of the first component and the second component, respectively, and are not particularly limited as long as the film-forming ink 1 can be applied into the opening part 17, but are preferably normal temperature and normal pressure. Therefore, it is preferred to use the film-forming ink 1 capable of applying the film-forming ink 1 into the opening part 17 under normal temperature and normal pressure. According to this, the ink application step [1] can be more easily performed.

[2] Drying Step

Subsequently, the liquid coating film 1A (film-forming ink 1) formed in the opening part 17 is subjected to vacuum drying or heating drying.

By doing this, the liquid medium is removed from the liquid coating film, and the liquid coating film is dried, whereby as shown in FIG. 1(*c*), a film 1B containing the film-forming material as a main component is formed.

At this time, in the film-forming ink, the second component is a component which has a boiling point at an atmospheric pressure within a range of ±30° C. relative to the boiling point at an atmospheric pressure of the first component and has a viscosity of 20 cp or more. By including a component having a high viscosity such that the viscosity is 20 cp or more in the liquid medium, when the liquid coating film formed in the opening part is subjected to vacuum drying or heating drying, the viscosity of the liquid coating film can be further increased. Due to this, the occurrence of "seeping-up" such that the film-forming material seeps up on the partition wall surface of the partition wall can be accurately suppressed or prevented.

Further, the first component and the second component are components which have a difference in boiling point at an atmospheric pressure within a range of ±30° C. By having such a difference in boiling point, when the liquid coating film formed in the opening part is subjected to vacuum drying or heating drying, the first component and the second component can be azeotropically distilled off, and the viscosity of the liquid coating film can be further increased while preventing preferential volatilization of either one component. As a result, the occurrence of seeping-up on the partition wall surface of the partition wall can be accurately suppressed or prevented.

Accordingly, the film 1B formed by subjecting this liquid coating film 1A to vacuum drying or heating drying is formed as a film which is homogeneous and has a uniform thickness.

The temperature and pressure in the atmosphere in the drying step [2] are each determined according to the composition of the film-forming ink 1 or the boiling points and the melting points of the first component and the second component, respectively, and are not particularly limited as long as the first component and the second component can be removed from the liquid coating film 1A on the base material 15. However, the temperature in the heating drying is preferably higher than the boiling point of the component having a higher boiling point at an atmospheric pressure between the first component and the second component, more preferably higher than the boiling point of the component having a higher boiling point by about 5 to 30° C. Further, the ultimate vacuum pressure in the vacuum drying is more preferably 10 Pa or less, or about $10^{-3}$ Pa or less.

Further, the time for the vacuum drying or the heating drying is not particularly limited, but is set to about 1 minute or more and 30 minutes or less.

Further, the method for heating the liquid coating film 1A is not particularly limited, but can be performed using a hot plate or an infrared ray, or the like, and further, may be performed using a rubber heater provided on the table 140 of the above-mentioned liquid droplet ejection device 100.

Incidentally, the film 1B obtained as described above is a film constituted by a constituent material of a film to be formed or a precursor thereof.

Then, in the case where a precursor is used as the film-forming material, the film 1B is subjected to a predetermined treatment as needed. For example, in the case where the film-forming material is a low-molecular weight compound, by performing a treatment of causing a polymerization reaction of the low-molecular weight compound, a film constituted by including a high-molecular weight compound can be obtained. Further, in the case where the film-forming material is a resin material, by performing a treatment of causing a crosslinking reaction of the resin material, a film constituted by including a high-molecular weight compound can be obtained. Further, in the case where the film-forming material contains metal particles and a binder (resin material), by subjecting the film 1B to a firing treatment, a film constituted by a metal can be obtained.

By undergoing the steps as described above, the film 1B which is homogeneous and has a uniform thickness can be formed with excellent film formation accuracy in the opening part 17.

(Display Device)

Next, a device with a film of the invention will be described.

Figure 4:
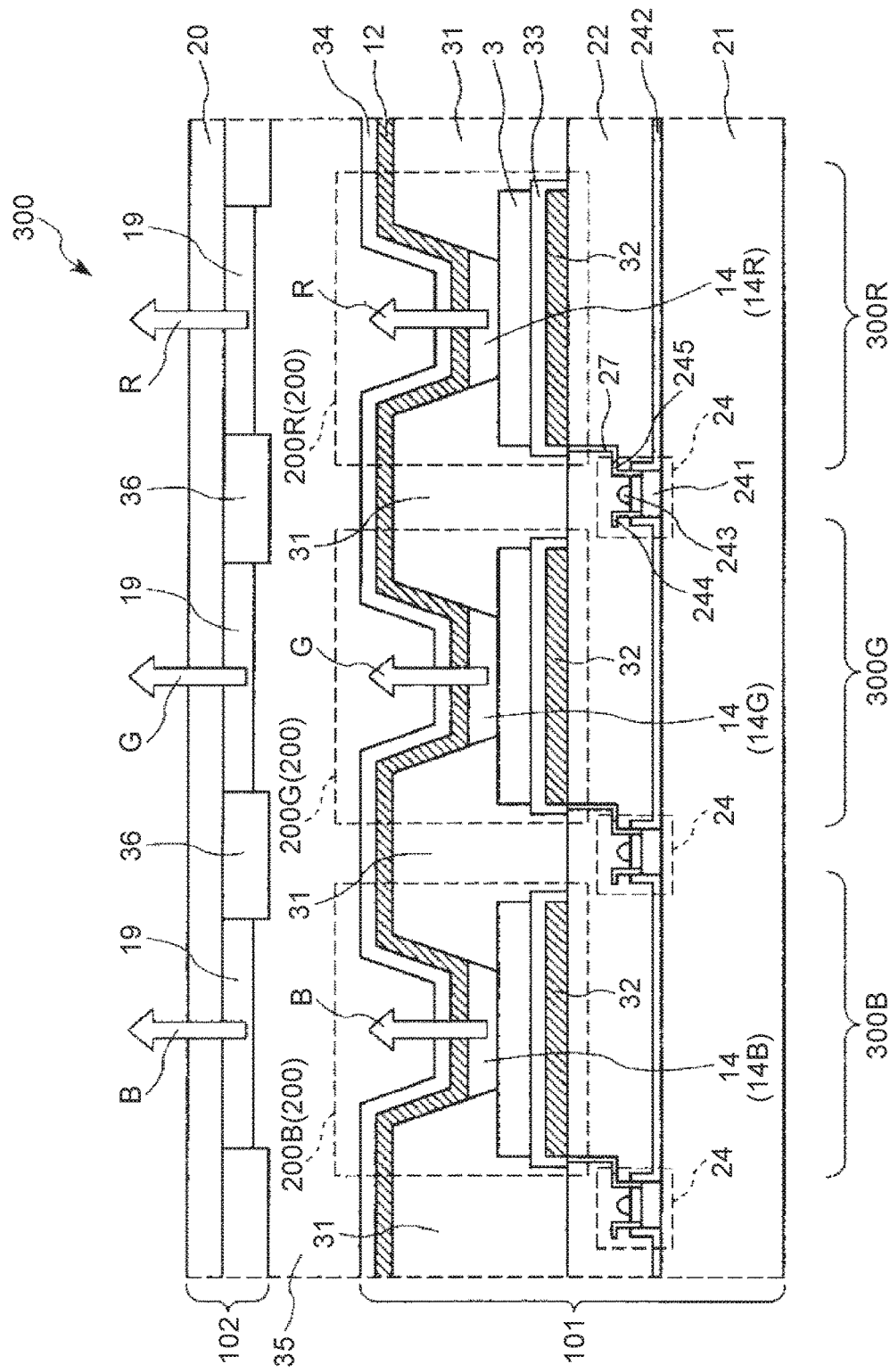
FIG. 4 is a cross-sectional view showing a display device including a light-emitting device and a color filter being one example of a device with a film of the invention.
Figure 5:
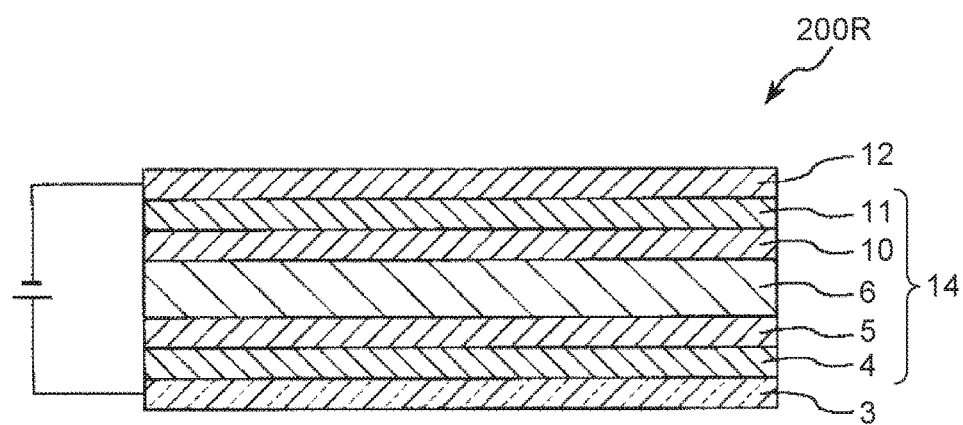
FIG. 5 is a cross-sectional view showing one example of a light-emitting element of the light-emitting device included in the display device shown in FIG. 4.

FIG. 4 is a cross-sectional view showing a display device including a light-emitting device and a color filter being one example of a device with a film of the invention, and FIG. 5 is a cross-sectional view showing one example of a light-emitting element of the light-emitting device included in the display device shown in FIG. 4. Incidentally, in the following description, for the sake of convenience of description, in FIG. 4 and in FIG. 5, the upper side is referred to as "upper", and the lower side is referred to as "lower".

A display device 300 shown in FIG. 4 includes a light-emitting device 101 including a plurality of light-emitting elements 200R, 200G, and 200B, and a transmission filter 102 including a transmission layer 19 provided corresponding to each of the light-emitting elements 200R, 200G, and 200B.

In such a display device 300, a plurality of light-emitting elements 200R, 200G, and 200B and a plurality of transmission layers 19 are provided corresponding to sub-pixels 300R, 300G, and 300B, and a display panel having a top emission structure is constituted.

Incidentally, in this embodiment, an example in which an active matrix system is adopted as the driving system of the display device is described, however, a passive matrix system may be adopted.

The light-emitting device 101 includes a substrate 21, the plurality of light-emitting elements 200R, 200G, and 200B, and a plurality of switching elements 24.

The substrate 21 supports the plurality of light-emitting elements 200R, 200G, and 200B and the plurality of switching elements 24. Each of the light-emitting elements 200R, 200G, and 200B of this embodiment has a configuration (top emission type) in which light is extracted from the opposite side to the substrate 21. Accordingly, it is possible to use either of a transparent substrate or a non-transparent substrate as the substrate 21. Incidentally, in the case where each of the light-emitting elements 200R, 200G, and 200B has a configuration (a bottom emission type) in which light is extracted from the substrate 21 side, as the substrate 21, a substrate which is substantially transparent (colorless and transparent, colored and transparent, or semi-transparent) is used.

Examples of the constituent material of the substrate 21 include resin materials such as polyethylene terephthalate, polyethylene naphthalate, polypropylene, a cycloolefin polymer, polyamide, polyether sulfone, polymethyl methacrylate, polycarbonate, and polyarylate, and glass materials such as quartz glass and soda glass, and it is possible to use one type or two or more types in combination among these.

Examples of the non-transparent substrate include a substrate constituted by a ceramic material such as alumina, a substrate in which an oxide film (insulating film) is formed on the surface of a substrate of a metal such as stainless steel, and a substrate constituted by a resin material.

The average thickness of such a substrate 21 is not particularly limited, but is preferably about 0.1 to 30 mm, more preferably about 0.1 to 10 mm.

On such a substrate 21, the plurality of switching elements 24 are arranged in a matrix form.

Each of the switching elements 24 is provided corresponding to each of the light-emitting elements 200R, 200G, and 200B and is a driving transistor for driving each of the light-emitting elements 200R, 200G, and 200B.

Each of such switching elements 24 includes a semiconductor layer 241 composed of silicon, a gate insulating layer 242 formed on the semiconductor layer 241, a gate electrode 243 formed on the gate insulating layer 242, a source electrode 244, and a drain electrode 245.

A flattening layer 22 constituted by an insulating material is formed so as to cover such a plurality of switching elements 24.

On the flattening layer 22, the light-emitting elements 200R, 200G, and 200B are provided corresponding to each of the switching elements 24.

In the light-emitting element 200R, on the flattening layer 22, a reflective film 32, an anti-corrosion film 33, an anode 3, a stacked body (organic EL light-emitting part) 14 (14R), a cathode 12, and a cathode cover 34 are stacked in this order. In this embodiment, the anode 3 of each of the light-emitting elements 200R, 200G, and 200B constitutes a pixel electrode and is electrically connected to the drain electrode 245 of each of the switching elements 24 through a conductive part (wiring) 27. In addition, as the cathode 12 of each of the light-emitting elements 200R, 200G, and 200B, a common electrode is used.

Each of the stacked bodies 14R, 14G, and 14B included in such light-emitting elements 200R, 200G, and 200B, respectively, can be formed by the film formation method as described above. In such a case, as the film-forming material of the film-forming ink, a constituent material contained in each layer included in the stacked bodies 14R, 14G, and 14B described later is contained. Incidentally, the production method for the stacked bodies 14R, 14G, and 14B will be described in detail later.

Further, as the configuration of each of the light-emitting elements 200G and 200B, the same configuration as that of the light-emitting element 200R can be adopted except for the configuration of the light-emitting layer 6 (that is, an emission color is different). Incidentally, the light-emitting elements 200R, 200G, and 200B may have mutually the same configuration except for the configuration of the light-emitting layer 6, or may have mutually different configurations. For example, the stacked bodies 14R, 14G, and 14B of the light-emitting elements 200R, 200G, and 200B may have mutually the same configuration except for the configuration of the light-emitting layer 6, or may have mutually different configurations. However, in the case where the stacked bodies 14R, 14G, and 14B have mutually different configurations, the effect of applying the film-forming ink and the film formation method of the invention becomes prominent.

A partition wall 31 is provided between the adjacent light-emitting elements 200R, 200G, and 200B.

This partition wall 31 has a function of preventing mutual interference with light emitted from the adjacent light-emitting elements 200R, 200G, and 200B. Further, as will be described in detail later, when the stacked bodies 14R, 14G, and 14B are produced by the liquid droplet ejection method, the partition wall 31 has a function of holding back the ink.

To the light-emitting device 101 configured in this manner, the transmission filter 102 is connected through a resin layer 35 constituted by a thermosetting resin such as an epoxy resin.

The transmission filter 102 includes a substrate 20, a plurality of transmission layers 19, and a light-shielding layer (partition wall) 36.

The substrate (sealing substrate) 20 supports each transmission layer 19 and the partition wall 36. Since each of the light-emitting elements 200R, 200G, and 200B of this embodiment is of a top emission type as described above, and therefore, as the substrate 20, a transparent substrate is used.

The constituent material of such a substrate 20 is not particularly limited as long as the substrate 20 has a light transmission property, and the same constituent material as that of the substrate 20 described above can be used.

The plurality of transmission layers 19 are provided corresponding to each of the light-emitting elements 200R, 200G, and 200B.

The respective transmission layers 19 are filter parts which transmit red light R from the light-emitting element 200R, green light G from the light-emitting element 200G, and blue light B from the light-emitting element 200B, respectively. By transmitting the light R, G, and B emitted from such light-emitting elements 200R, 200G, and 200B through the transmission layers 19, a full-color image can be displayed.

This transmission layer 19 is constituted by a resin material having a light transmission property. As this resin material, a material having a light transmission property is used among those listed as the constituent material of the substrate 21.

A partition wall 36 is formed between the adjacent transmission layers 19.

This partition wall 36 has a function of preventing undesired light emission of the sub-pixel 300R, 300G, or 300B. Further, as will be described in detail later, when the transmission filter 102 is produced by the liquid droplet ejection method, the partition wall 36 has a function of holding back the ink.

Light-Emitting Element

Here, the light-emitting elements 200R, 200G, and 200B will be described in detail with reference to FIG. 5. Incidentally, in the following description, the light-emitting element 200R will be representatively described, and with respect to the light-emitting elements 200G and 200B, points different from those of the light-emitting element 200R are mainly described, and the description of the same points as those of the light-emitting element 200R will be omitted.

The light-emitting element (electroluminescence element) 200R shown in FIG. 5 includes a red light-emitting layer 6 which emits light with an emission spectrum of R (red).

In such a light-emitting element 200R, as described above, the stacked body 14 is interposed between two electrodes (between the anode 3 and the cathode 12), and in this stacked body 14, as shown in FIG. 5, a hole injection layer 4, a hole transport layer 5, a red light-emitting layer 6, an electron transport layer 10, and an electron injection layer 11 are stacked in this order from the anode 3 side to the cathode 12 side.

In other words, the light-emitting element 200R is configured such that the anode 3, the hole injection layer 4, the hole transport layer 5, the red light-emitting layer 6, the electron transport layer 10, the electron injection layer 11, and the cathode 12 are stacked in this order.

Further, in this embodiment, between the anode 3 and the flattening layer 22, the reflective film 32 and the anti-corrosion film 33 are provided, and also on the opposite side to the stacked body 14 of the cathode 12, the cathode cover (sealing layer) 34 is provided.

In such a light-emitting element 200R, an electron is supplied (injected) to the red light-emitting layer 6 from the cathode 12 side, and also a hole is supplied (injected) thereto from the anode 3 side. Then, the hole and the electron are recombined in the red light-emitting layer 6, and an exciton is generated by energy emitted at the time of this recombination, and when the exciton is returned to a ground state, energy (red fluorescence or phosphorescence) is emitted (light emission). In this manner, the light-emitting element 200R emits red light. Then, when such emitted light is extracted from the transmission filter 102 side, the light is enhanced by a resonance effect in which the light is reflected between the reflective film 32 and the cathode 12, however, when the light is extracted, the stacked body 14R is formed with a uniform thickness by applying the film formation method of the invention as described later. Therefore, since the optical path length is made uniform, the emitted light can be enhanced without causing uneven enhancement in an edge portion of the partition wall 31.

The respective layers constituting such a light-emitting element 200R can be formed by the above-mentioned film formation method. In particular, it is preferred to form a layer constituted by an organic material, more preferably a light-emitting layer by the above-mentioned film formation method. In such a case, in the film-forming ink, a material constituting the light-emitting layer described later or a precursor thereof is contained.

Hereinafter, the respective parts constituting the light-emitting element 200R will be sequentially described.
(Anode)

The anode 3 is an electrode which injects holes into the hole transport layer 5 through the hole injection layer 4 described later. As the constituent material of the anode 3, a material having a large work function and excellent electrical conductivity is preferably used.

Examples of the constituent material of the anode 3 include oxides such as ITO (Indium Tin Oxide), IZO (Indium Zinc Oxide), $In_2O_3$, $SnO_2$, Sb-containing $SnO_2$, and Al-containing ZnO, Au, Pt, Ag, Cu, and an alloy containing any of these materials, and it is possible to use one type or two or more types in combination among these.

The average thickness of such an anode 3 is not particularly limited, but is preferably from about 10 to 200 nm, more preferably from about 50 to 150 nm.
(Cathode)

On the other hand, the cathode 12 is an electrode which injects electrons into the electron transport layer 10 through the below-mentioned electron injection layer 11. As the constituent material of this cathode 12, a material having a small work function is preferably used.

Examples of the constituent material of the cathode 12 include Li, Mg, Ca, Sr, La, Ce, Er, Eu, Sc, Y, Yb, Ag, Cu, Al, Cs, Rb, and an alloy containing any of these materials, and it is possible to use one type or two or more types in combination among these (for example, a stacked body of a plurality of layers or the like).

In particular, in the case where an alloy is used as the constituent material of the cathode 12, it is preferred to use an alloy containing a stable metal element such as Ag, Al, or Cu, specifically, an alloy such as MgAg, AlLi, or CuLi. By using such an alloy as the constituent material of the cathode 12, the electron injection efficiency and stability of the cathode 12 can be improved.

The average thickness of such a cathode 12 is not particularly limited, but is preferably from about 80 to 10000 nm, more preferably from about 100 to 500 nm.
(Hole Injection Layer)

The hole injection layer 4 has a function of improving the hole injection efficiency from the anode 3.

The constituent material (hole injection material) of this hole injection layer 4 is not particularly limited, however, examples thereof include poly(3,4-ethylenedioxythiophene/styrenesulfonic acid) (PEDOT/PSS), PEDOT/PSS/Nafion (registered trademark), polythiophene and derivatives thereof, polyaniline and derivatives thereof, polypyrrole and derivatives thereof, and N,N,N',N'-tetraphenyl-p-diaminobenzene and derivatives thereof, and it is possible to use one type or two or more types in combination among these.

The average thickness of such a hole injection layer is not particularly limited, but is preferably from about 5 to 150 nm, more preferably from about 10 to 100 nm.

Incidentally, this hole injection layer 4 can be omitted.
(Hole Transport Layer)

The hole transport layer 5 has a function of transporting the injected holes from the anode 3 to the red light-emitting layer 6 through the hole injection layer 4.

The constituent material (hole transport material) of this hole transport layer 5 is not particularly limited, however, it is possible to use various p-type high-molecular weight materials or various p-type low-molecular weight materials alone or in combination.

Examples of the p-type high-molecular weight material (organic polymer) include materials having an arylamine skeleton such as polyarylamines including poly(2,7-(9,9-di-n-octylfluorene)-(1,4-phenylene-((4-sec-butylphenyl)imino)-1,4-phenylene (TFB), and the like, materials having a fluorene skeleton such as a fluorene bithiophene copolymer, materials having both of an arylamine skeleton and a fluorene skeleton such as a fluorene-arylamine copolymer, poly(N-vinylcarbazole), polyvinylpyrene, polyvinylanthracene, polythiophene, polyalkylthiophene, polyhexylthiophene, poly(p-phenylenevinylene), polythinylene vinylene, a pyreneformaldehyde resin, an ethyl carbazole formaldehyde resin, and derivatives thereof.

Such a p-type high-molecular weight material may also be used as a mixture with another compound. Examples of a mixture containing polythiophene include poly(3,4-ethylenedioxythiophene/styrenesulfonic acid) (PEDOT/PSS).

Examples of the p-type low-molecular weight material include arylcycloalkane-based compounds such as 1,1-bis(4-di-p-triaminophenyl)cyclohexane and 1,1'-bis(4-di-p-tolylaminophenyl)-4-phenyl-cyclohexane, arylamine-based compounds such as 4,4',4"-trimethyltriphenylamine, N,N,N',N'-tetraphenyl-1,1'-biphenyl-4,4'-diamine, N,N'-diphenyl-N,N'-bis(3-methylphenyl)-1,1'-biphenyl-4,4'-diamine (TPD1), N,N'-diphenyl-N,N'-bis(4-methoxyphenyl)-1,1'-biphenyl-4,4'-diamine (TPD2), N,N,N',N'-tetrakis(4-methoxyphenyl)-1,1'-biphenyl-4,4'-diamine (TPD3), and N,N'-bis(1-naphthyl)-N,N'-diphenyl-1,1'-biphenyl-4,4'-diamine (α-NPD), and TPTE, phenylenediamine-based compounds such as N,N,N',N'-tetraphenyl-p-phenylenediamine, N,N,N',N'-tetra(p-tolyl)-p-phenylenediamine, and N,N,N',N'-tetra(m-tolyl)-m-phenylenediamine (PDA), carbazole-based compounds such as carbazole, N-isopropyl carbazole, and N-phenyl carbazole, stilbene-based compounds such as stilbene and 4-di-p-tolylaminostilbene, oxazole-based compounds such as $O_xZ$, triphenylmethane-based compounds such as triphenylmethane and m-MTDATA, pyrazoline-based compounds such as 1-phenyl-3-(p-dimethylaminophenyl)pyrazoline, benzine(cyclohexadiene)-based compounds, triazole-based compounds such as triazole, imidazole-based compounds such as imidazole, oxadiazole-based compounds such as 1,3,4-oxadiazole and 2,5-di(4-dimethylaminophenyl)-1,3,4-oxadiazole, anthracene-based compounds such as anthracene and 9-(4-diethylaminostyryl)anthracene, fluorenone-based compounds such as fluorenone, 2,4,7-trinitro-9-fluorenone, and 2,7-bis(2-hydroxy-3-(2-chlorophenylcarbamoyl)-1-naphthylazo)fluorenone, aniline-based compounds such as polyaniline, silane-based compounds, pyrrole-based compounds such as 1,4-dithio-keto-3,6-diphenyl-pyrrolo-(3,4-c)pyrrolopyrrole, fluorene-based compounds such as fluorene, porphyrin-based compounds such as porphyrin and metal tetraphenylporphyrin, quinacridone-based compounds such as quinacridone, metallic or non-metallic phthalocyanine-based compounds such as phthalocyanine, copper phthalocyanine, tetra(t-butyl)copper phthalocyanine, and iron phthalocyanine, metallic or non-metallic naphthalocyanine-based compounds such as copper naphthalocyanine, vanadyl naphthalocyanine, and monochloro gallium naphthalocyanine, and benzidine-based compounds such as N,N'-di(naphthalen-1-yl)-N,N'-diphenyl-benzidine and N,N,N',N'-tetraphenylbenzidine.

The average thickness of such a hole transport layer is not particularly limited, but is preferably from about 10 to 150 nm, more preferably from about 10 to 100 nm.

Incidentally, this hole transport layer 5 can be omitted.
(Red Light-Emitting Layer)

This red light-emitting layer (first light-emitting layer) 6 is configured to include a red light-emitting material which emits red (first color) light.

Such a red light-emitting material is not particularly limited, and it is possible to use one type or two or more types in combination among various red fluorescent materials and red phosphorescent materials.

The red fluorescent material is not particularly limited as long as it emits red fluorescence, and examples thereof include perylene derivatives, europium complexes, benzopyrane derivatives, rhodamine derivatives, benzothioxanthene derivatives, porphyrin derivatives, Nile red, 2-(1,1-dimethylethyl)-6-(2-(2,3,6,7-tetrahydro-1,1,7,7-tetramethyl-1H,5H-benzo(ij)quinolizin-9-yl)ethenyl]-4H-pyran-4-ylidene)propanedinitrile (DCJTB), 4-(dicyanomethylene)-2-methyl-6-(p-dimethylaminostyryl)-4H-pyran (DCM), poly[2-methoxy-5-(2-ethylhexyloxy)-1,4-(1-cyanovinylenephenylene)], poly[{9,9-dihexyl-2,7-bis(1-cyanovinylene)fluorenylene}alt-co-{2,5-bis(N,N'-diphenylamino)-1,4-phenylene}], and poly[{2-methoxy-5-(2-ethylhexyloxy)-1,4-(1-cyanovinylenephenylene)}-co-{2,5-bis(N,N'-diphenylamino)-1,4-phenylene}].

The red phosphorescent material is not particularly limited as long as it emits red phosphorescence, and examples thereof include metal complexes of iridium, ruthenium, platinum, osmium, rhenium, palladium, or the like, and also includes metal complexes in which at least one of the ligands of these metal complexes has a phenylpyridine skeleton, a bipyridyl skeleton, a porphyrin skeleton, or the like. More specific examples thereof include tris(1-phenylisoquinoline) iridium, bis[2-(2'-benzo[4,5-α]thienyl)pyridinate-N,C$^{3'}$] iridium (acetylacetonate) (btp2Ir(acac)), 2,3,7,8,12,13,17,18-octaethyl-12H,23H-porphyrin-platinum (II), bis[2-(2'-benzo[4,5-a]thienyl)pyridinate-N,C$^{3'}$]iridium and bis(2-phenylpyridine) iridium (acetylacetonate).

Further, in the red light-emitting layer 6, in addition to the above-mentioned red light-emitting material, a host material to which a red light-emitting material is added as a guest material may be contained.

The host material has a function of recombining a hole and an electron to generate an exciton and also transferring the energy of the exciton to the red light-emitting material (Forster transfer or Dexter transfer) to excite the red light-emitting material. In the case where such a host material is used, for example, the host material can be doped with the red light-emitting material which is a guest material as a dopant, and used.

Such a host material is not particularly limited as long as it exhibits the function as described above for the red light-emitting material to be used, however, in the case where the red light-emitting material contains a red fluorescent material, examples thereof include acene derivatives (acene-based materials) such as naphthacene derivatives, naphthalene derivatives, and anthracene derivatives, quinolinolate-based metal complexes such as distyrylarylene derivatives, perylene derivatives, distyryl benzene derivatives, distyrylamine derivatives, and tris(8-quinolinolate) aluminum complexes (Alq$_3$), triarylamine derivatives such as tetramers of triphenylamine, oxadiazole derivatives, silole derivatives, dicarbazole derivatives, oligothiophene derivatives, benzopyrane derivatives, triazole derivatives, benzoxazole derivatives, benzothiazole derivatives, quinoline derivatives, and 4,4'-bis(2,2'-diphenylvinyl)biphenyl (DPVBi). It is also possible to use one type or two or more types in combination among these.

In the case where the red light-emitting material (guest material) and the host material as described above are used, the content (doping amount) of the red light-emitting material in the red light-emitting layer 6 is preferably from 0.01 to 10 wt %, more preferably from 0.1 to 5 wt %. By setting the content of the red light-emitting material within such a range, the luminous efficiency can be optimized.

The average thickness of such a red light-emitting layer 6 is not particularly limited, but is preferably from about 10 to 150 nm, more preferably from about 10 to 100 nm.
(Electron Transport Layer)

The electron transport layer 10 has a function of transporting the injected electrons from the cathode 12 to the red light-emitting layer 6 through the electron injection layer 11.

Examples of the constituent material (electron transport material) of the electron transport layer 10 include quinoline derivatives of an organic metal complex or the like including, as a ligand, 8-quinolinol or a derivative thereof such as tris(8-quinolinolate) aluminum (Alq$_3$), oxadiazole derivatives, perylene derivatives, pyridine derivatives, pyrimidine derivatives, quinoxaline derivatives, diphenylquinone derivatives, and nitro-substituted fluorene derivatives, and it is possible to use one type or two or more types in combination among these.

The average thickness of the electron transport layer 10 is not particularly limited, but is preferably from about 0.5 to 100 nm, more preferably from about 1 to 50 nm.

Incidentally, this electron transport layer 10 can be omitted.
(Electron Injection Layer)

The electron injection layer 11 has a function of improving the electron injection efficiency from the cathode 12.

Examples of the constituent material (electron injection material) of the electron injection layer 11 include various inorganic insulating materials and various inorganic semiconductor materials.

Examples of such an inorganic insulating material include alkali metal chalcogenides (oxides, sulfates, selenides, and tellurides), alkaline earth metal chalcogenides, alkali metal halides, and alkaline earth metal halides, and it is possible to use one type or two or more types in combination among these. By constituting the electron injection layer using any of these materials as a main material, the electron injection property can be further improved. In particular, alkali metal compounds (alkali metal chalcogenides, alkali metal halides, and the like) have a very small work function, and by constituting the electron injection layer 11 using this, the light-emitting element 200 capable of obtaining high luminance is realized.

Examples of the alkali metal chalcogenide include Li$_2$O, LiO, Na$_2$S, Na$_2$Se, and NaO.

Examples of the alkaline earth metal chalcogenide include CaO, BaO, SrO, BeO, BaS, MgO, and CaSe.

Examples of the alkali metal halide include CsF, LiF, NaF, KF, LiCl, KCl, and NaCl.

Examples of the alkaline earth metal halide include $CaF_2$, $BaF_2$, $SrF_2$, $MgF_2$, and $BeF_2$.

Further, examples of the inorganic semiconductor material include oxides, nitrides, and oxide-nitrides containing at least one element of Li, Na, Ba, Ca, Sr, Yb, Al, Ga, In, Cd, Mg, Si, Ta, Sb, and Zn, and it is possible to use one type or two or more types in combination among these.

The average thickness of the electron injection layer 11 is not particularly limited, but is preferably from about 0.1 to 1000 nm, more preferably from about 0.2 to 100 nm, further more preferably from about 0.2 to 50 nm.

Incidentally, this electron injection layer 11 can be omitted.

The light-emitting element 200R is configured as described above. Further, the light-emitting elements 200G and 200B include a green light-emitting layer and a blue light-emitting layer as described below, respectively, in place of the red light-emitting layer 6 included in the light-emitting element 200R, and therefore emit light with an emission spectrum of G (green) and light with an emission spectrum of B (blue), respectively.

(Blue Light-Emitting Layer)

The blue light-emitting layer (second light-emitting layer) 8 is configured to include a blue light-emitting material which emits blue (second color) light.

Examples of such a blue light-emitting material include various blue fluorescent materials and blue phosphorescent materials, and it is possible to use one type or two or more types in combination among these.

The blue fluorescent material is not particularly limited as long as it emits blue fluorescence, and examples thereof include distyrylamine derivatives such as distyryldiamine-based compounds, fluoranthene derivatives, pyrene derivatives, perylene and perylene derivatives, anthracene derivatives, benzoxazole derivatives, benzothiazole derivatives, benzoimidazole derivatives, chrysene derivatives, phenanthrene derivatives, distyryl benzene derivatives, tetraphenylbutadiene, 4,4'-bis(9-ethyl-3-carbazovinylene)-1,1'-biphenyl (BCzVBi), poly[(9,9-dioctylfluoren-2,7-diyl)-co-(2,5-dimethoxybenzen-1,4-diyl)], poly[(9,9-dihexyloxyfluoren-2,7-diyl)-alt-co-(2-methoxy-5-{2-ethoxyhexyloxy}phenylen-1,4-diyl)], and poly[(9,9-dioctylfluoren-2,7-diyl)-co-(ethynylbenzene)].

The blue phosphorescent material is not particularly limited as long as it emits blue phosphorescence, and examples thereof include metal complexes of iridium, ruthenium, platinum, osmium, rhenium, palladium, or the like. Specific examples thereof include bis[4,6-difluorophenylpyridinate-$N,C^{2'}$]-picolinate-iridium, tris[2-(2,4-difluorophenyl)pyridinate-$N,C^{2'}$]iridium, bis[2-(3,5-trifluoromethyl)pyridinate-N,$C^{2'}$]-picolinate-iridium, and bis(4,6-difluorophenylpyridinate-$N,C^{2'}$) iridium (acetylacetonate).

Further, in the blue light-emitting layer 8, in addition to the above-mentioned blue light-emitting material, a host material to which a blue light-emitting material is added as a guest material may be contained.

As such a host material, the same host material as described with respect to the above-mentioned red light-emitting layer (first light-emitting layer) 6 can be used.

Further, as the host material of such a blue light-emitting layer 8, it is preferred to use an acene derivative (acene-based material) in the same manner as the host material of the red light-emitting layer 6. According to this, the blue light-emitting layer 8 can be made to emit blue light with higher luminance and higher efficiency.

(Green Light-Emitting Layer)

The green light-emitting layer (third light-emitting layer) 9 is configured to include a green light-emitting material which emits green (third color) light.

Such a green light-emitting material is not particularly limited, and examples thereof include various green fluorescent materials and green phosphorescent materials, and it is possible to use one type or two or more types in combination among these.

The green fluorescent material is not particularly limited as long as it emits green fluorescence, and examples thereof include coumarin derivatives, quinacridone and derivatives thereof such as quinacridone derivatives, 9,10-bis[(9-ethyl-3-carbazoyl)-vinylenyl]-anthracene, poly(9,9-dihexyl-2,7-vinylenefluorenylene), poly[(9,9-dioctylfluoren-2,7-diyl)-co-(1,4-diphenylenevinylene-2-methoxy-5-{2-ethylhexyloxy}benzene)], and poly[(9,9-dioctyl-2,7-divinylenefluorenylene)-alt-co-(2-methoxy-5-(2-ethoxylhexyloxy)-1,4-phenylene)].

The green phosphorescent material is not particularly limited as long as it emits green phosphorescence, and examples thereof include metal complexes of iridium, ruthenium, platinum, osmium, rhenium, palladium, or the like, and specific examples thereof include fac-tris(2-phenylpyridine)iridium (Ir(ppy)3), bis(2-phenylpyridinate-$N,C^{2'}$) iridium (acetylacetonate), and fac-tris[5-fluoro-2-(5-trifluoromethyl-2-pyridine)phenyl-C,N]iridium.

Further, in the green light-emitting layer 9, in addition to the above-mentioned green light-emitting material, a host material to which a green light-emitting material is added as a guest material may be contained.

As such a host material, the same host material as described with respect to the above-mentioned red light-emitting layer (first light-emitting layer) 6 can be used.

Further, as the host material of such a green light-emitting layer 9, it is preferred to use an acene derivative (acene-based material) in the same manner as the host material of the red light-emitting layer 6. According to this, the green light-emitting layer 9 can be made to emit green light with higher luminance and higher efficiency.

Further, the host material of this green light-emitting layer 9 is preferably the same as the host material of the blue light-emitting layer 8 described above. According to this, in both of the light-emitting layers 8 and 9, green light and blue light can be emitted in a well-balanced manner.

(Production Method for Stacked Body in Light-Emitting Element)

The film formation method of the invention is applied to the formation of the stacked bodies 14R, 14G, and 14B of the light-emitting elements 200R, 200G, and 200B included in the display device 300 configured as described above.

Hereinafter, a production method (formation method) for the stacked bodies 14R, 14G, and 14B using the film formation method of the invention will be described.

FIG. 6 is a view illustrating a case where the film formation method of the invention is applied to the production of the stacked body of the light-emitting element included in the display device.

Incidentally, in the following description, the production method is the same as the above-mentioned film formation method except that the film-forming ink for forming each layer included in the stacked bodies 14R, 14G, and 14B is used, and therefore, the description of the same points as those of the above-mentioned film formation method will be omitted.

Further, in this embodiment, the stacked body 14R is configured such that the hole injection layer 4, the hole transport layer 5, the red light-emitting layer 6, the electron transport layer 10, and the electron injection layer 11 are stacked in this order from the anode 3 side to the cathode 12 side, and the stacked bodies 14G and 14B include the green light-emitting layer and the blue light-emitting layer, respectively, in place of the red light-emitting layer 6 included in the stacked body 14R, and therefore, a case where the stacked body 14R is formed on the anode 3 exposed from the opening part of the partition wall 31 provided on the flattening layer 22 will be described below as an example.

A-1

Figure 6A:
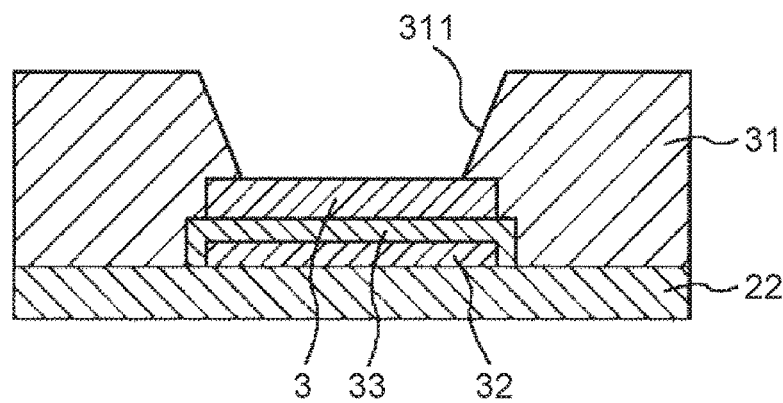
FIG. 6 is a view illustrating a case where the film formation method of the invention is applied to the production of a stacked body of the light-emitting element included in the display device.
Figure 6B:
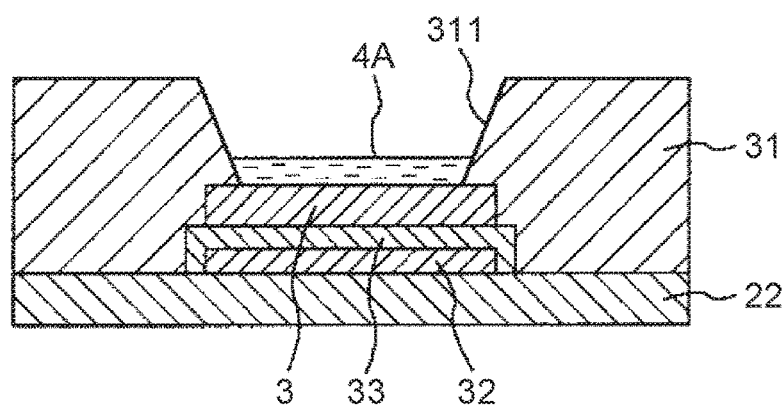

First, on the anode 3 exposed from the opening part of the partition wall 31 provided on the flattening layer as shown in FIG. 6(a), a film-forming ink 4A is supplied (see FIG. 6(b)).

This step can be performed in the same manner as the ink application step [1] of the film formation method described above.

The film-forming ink 4A contains a film-forming material and a liquid medium, and is configured in the same manner as the above-mentioned film-forming ink 1.

Further, the film-forming ink 4A contains a hole injection material as the film-forming material.

Incidentally, on the surface of the anode 3 exposed from the opening part of the partition wall 31, a hydroxy group is exposed in the case where the above-mentioned oxide (metal oxide) is used as the constituent material of the anode 3. Due to this, by using a component including a hydroxy group as the second component, the surface of the anode 3 and the second component have excellent affinity. Therefore, the film-forming ink 4A supplied as a liquid droplet into the opening part can be made to wet and spread on the anode 3 more smoothly.

Further, in the case where the surface of a partition wall surface 311 of the partition wall 31 is subjected to a surface treatment of imparting liquid repellency, a fluorine element is exposed on this surface. Due to this, by using a component including a hydroxy group as the second component, a repelling force is generated between the surface of the partition wall surface 311 and the film-forming ink 4A. As a result, on the partition wall surface 311, seeping-up of the film-forming material contained in the film-forming ink 4A can be more accurately suppressed or prevented.

Then, the film-forming ink 4A applied onto the anode 3 is subjected to vacuum drying or heating drying in the same manner as the drying step [2] of the film formation method described above.

Figure 6C:
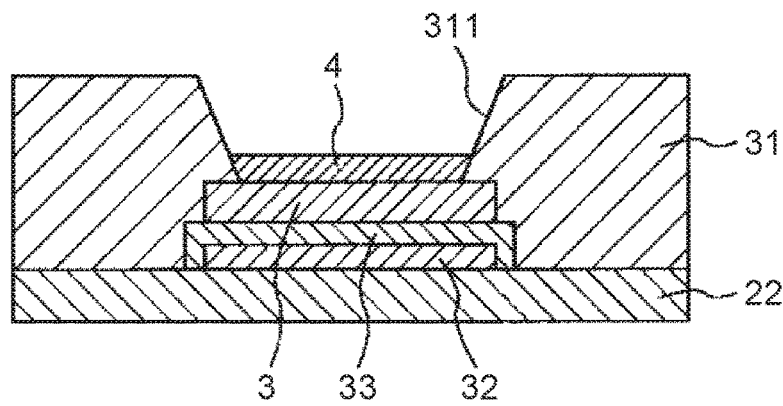

By doing this, as shown in FIG. 6(c), the first component is removed from the film-forming ink 4A, and as a result, the film-forming ink 4A is dried, whereby the hole injection layer 4 is formed.

A-2

Subsequently, on the hole injection layer 4 formed in the opening part of the partition wall 31, a film-forming ink 5A is supplied in the same manner as the ink application step [1] of the film formation method described above.

The film-forming ink 5A contains a film-forming material and a liquid medium, and is configured in the same manner as the above-mentioned film-forming ink 1.

Further, the film-forming ink 5A contains a hole transport material as the film-forming material.

Incidentally, in the case where the surface of the partition wall surface 311 of the partition wall 31 is subjected to a surface treatment of imparting liquid repellency, a fluorine element is exposed on this surface. Due to this, by using a component including a hydroxy group as the second component, a repelling force is generated between the surface of the partition wall surface 311 and the film-forming ink 5A. As a result, on the partition wall surface 311, seeping-up of the film-forming material contained in the film-forming ink 5A can be more accurately suppressed or prevented.

Then, the film-forming ink 5A applied onto the hole injection layer 4 is subjected to vacuum drying or heating drying in the same manner as the drying step [2] of the film formation method described above.

By doing this, the first component is removed from the film-forming ink 5A, and as a result, the film-forming ink 5A is dried, whereby the hole transport layer 5 is formed.

A-3

Subsequently, on the hole transport layer 5 formed in the opening part of the partition wall 31, a film-forming ink 6A is supplied in the same manner as the ink application step [1] of the film formation method described above.

Incidentally, in the case where the surface of the partition wall surface 311 of the partition wall 31 is subjected to a surface treatment of imparting liquid repellency, a fluorine element is exposed on this surface. Due to this, by using a component including a hydroxy group as the second component, a repelling force is generated between the surface of the partition wall surface 311 and the film-forming ink 6A. As a result, on the partition wall surface 311, seeping-up of the film-forming material contained in the film-forming ink 6A can be more accurately suppressed or prevented.

The film-forming ink 6A contains a film-forming material and a liquid medium, and is configured in the same manner as the above-mentioned film-forming ink 1.

Further, the film-forming ink 6A contains a red light-emitting material as the film-forming material.

Then, the film-forming ink 6A applied onto the hole transport layer 5 is subjected to vacuum drying or heating drying in the same manner as the drying step [2] of the film formation method described above.

By doing this, the first component is removed from the film-forming ink 6A, and as a result, the film-forming ink 6A is dried, whereby the red light-emitting layer 6 is formed.

A-4

Subsequently, on the red light-emitting layer 6 formed in the opening part of the partition wall 31, the electron transport layer 10 is formed.

This electron transport layer 10 is preferably formed using, for example, a gas-phase process such as a sputtering method, a vacuum vapor deposition method, or a CVD method, although it is not particularly limited. By using a gas-phase process, the electron transport layer 10 can be reliably formed while preventing layer dissolution between the red light-emitting layer 6 and the electron transport layer 10.

A-5

Subsequently, on the electron transport layer 10 formed in the opening part of the partition wall 31, the electron injection layer 11 is formed.

This electron injection layer 11 is preferably formed using, for example, a gas-phase process such as a sputtering method, a vacuum vapor deposition method, or a CVD method, although it is not particularly limited. By using a gas-phase process, the electron injection layer 11 can be reliably formed while preventing layer dissolution between the electron transport layer 10 and the electron injection layer 11.

As described above, on the anode 3 exposed from the opening part of the partition wall 31, the stacked body 14R can be produced. Incidentally, the stacked bodies 14R, 14G, and 14B may be formed independently of one another, or may be formed collectively.

The thus obtained stacked bodies 14R, 14G, and 14B included in the display device 300 which is the device with a film can be formed with excellent dimensional accuracy while preventing the stacked bodies from mixing with one another by the partition wall 31, and therefore have desired optical properties, and thus have excellent reliability.

The application of such a film formation method is not limited to the production of the stacked bodies 14R, 14G, and 14B, and the method can also be applied to the production of a color filter 103.

(Production Method for Color Filter)

Next, as a more specific application example of the film formation method of the invention, a production method for the color filter 103 described above will be described.

FIG. 7 is a view illustrating a case where the film formation method of the invention is applied to the production of the color filter.

Incidentally, in the following description, the production method is the same as the above-mentioned film formation method except that a plurality of types of film-forming inks of different colors are used, and therefore, the description of the same points as those of the above-mentioned film formation method will be omitted.

This color filter 103 includes a plurality of colored layers 19R, 19G, and 19B, a light-shielding layer (partition wall) 36, and a substrate 20 which supports the respective colored layers 19R, 19G, and 19B and the partition wall 36 as shown in FIG. 7(e).

In this color filter 103, the colored layer 19R is a filter part which converts light WR from the light-emitting element 200R into red. Further, the colored layer 19G is a filter part which converts light WG from the light-emitting element 200G into green. Further, the colored layer 19B is a filter part which converts light WB from the light-emitting element 200B into blue.

In the color filter 103 having such a configuration, the film-forming ink of the invention is used for the formation of each of the colored layers 19R, 19G, and 19B, however, hereinafter, a production method for the color filter 103 using the film-forming ink of the invention will be described.

B-1

First, as shown in FIG. 7(a), a base material 15A in which the partition wall 36 (bank) is formed on the substrate 20 is prepared.

Further, according to need, the base material 15A may be lyophilized by an oxygen plasma treatment under an atmospheric pressure before the partition wall 36 (bank) is formed.

Further, the surface of the partition wall 36 may be subjected to a surface treatment of imparting liquid repellency.

B-2

Subsequently, as shown in FIG. 7(b), a film-forming ink 19RA is supplied to a compartment in which the colored layer 19R is to be formed.

This step can be performed in the same manner as the ink application step [1] of the film formation method described above.

The film-forming ink 19RA contains a film-forming material and a liquid medium, and is configured in the same manner as the above-mentioned film-forming ink 1.

Further, the film-forming material of the film-forming ink 19RA contains a colorant such as a red dye or pigment. Further, in the film-forming material of the film-forming ink 19RA, for example, a resin material such as an acrylic resin may be contained.

B-3

Then, the film-forming ink 19RA applied onto the base material 15A is heated in the same manner as the drying step [2] of the film formation method described above.

By doing this, as shown in FIG. 7(c), the first component is removed from the film-forming ink 19RA, and as a result, the film-forming ink 19RA is dried, whereby the colored layer 19R is formed.

Thereafter, as shown in FIG. 7(c), a film-forming ink 19GA is supplied to a compartment in which the colored layer 19G is to be formed. At this time, the colored layer 19R is in a solid state, and therefore, does not flow out to the other compartments.

The application of the film-forming ink 19GA to the base material 15A in this step can also be performed in the same manner as the ink application step [1] of the film formation method described above.

The film-forming ink 19GA contains a film-forming material and a liquid medium, and is configured in the same manner as the above-mentioned film-forming ink 1.

Further, the film-forming material of the film-forming ink 19GA contains a colorant such as a green dye or pigment. Further, in the film-forming material of the film-forming ink 19GA, for example, a resin material such as an acrylic resin may be contained.

B-4

Then, the film-forming ink 19GA applied onto the base material 15A is heated in the same manner as the drying step [2] of the film formation method described above.

By doing this, as shown in FIG. 7(d), the first component is removed from the film-forming ink 19GA, and as a result, the film-forming ink 19GA is dried, whereby the colored layer 19G is formed.

Thereafter, as shown in FIG. 7(d), a film-forming ink 19BA is supplied to a compartment in which the colored layer 19B is to be formed. At this time, each of the colored layers 19R and 19G is in a solid state, and therefore, does not flow out to the other compartments.

The application of the film-forming ink 19BA to the base material 15A in this step can also be performed in the same manner as the ink application step [1] of the film formation method described above.

The film-forming ink 19BA contains a film-forming material and a liquid medium, and is configured in the same manner as the above-mentioned film-forming ink 1.

Further, the film-forming material of the film-forming ink 19BA contains a colorant such as a blue dye or pigment. Further, in the film-forming material of the film-forming ink 19BA, for example, a resin material such as an acrylic resin may be contained.

B-5

Then, the film-forming ink 19BA applied onto the base material 15A is heated in the same manner as the drying step [2] of the film formation method described above.

By doing this, as shown in FIG. 7(e), the first component is removed from the film-forming ink 19BA, and as a result, the film-forming ink 19BA is dried, whereby the colored layer 19B is formed.

As described above, the colored layers 19R, 19G, and 19B in a solid state are formed in the opening parts on the base material 15A. Incidentally, the colored layers 19R, 19G, and 19B may be collectively formed by collectively performing the same treatment as the drying step [2] of the film formation method described above after all the film-forming inks 19RA, 19GA, and 19BA are applied onto the base material 15A.

As described above, the color filter 103 can be produced.

In the thus obtained color filter 103 which is the device with a film, color mixing of the colored layers 19R, 19G, and 19B is prevented, and also the colored layers 19R, 19G, and 19B can be formed with excellent dimensional accuracy, and therefore, the color filter 103 has desired optical properties, and thus has excellent reliability.

Other Application Example

Further, the film-forming ink of the invention can be used for forming a conductor pattern of a wiring board.

The film-forming ink for forming the conductor pattern is an ink for forming a conductor pattern precursor.

Specifically, the film-forming material of the film-forming ink contains metal particles. Then, the film-forming ink is a dispersion liquid in which the metal particles are dispersed in a dispersion medium.

As such metal particles, silver particles are preferably used, and the average particle diameter of the silver particles is preferably 1 nm or more and 100 nm or less, more preferably 10 nm or more and 30 nm or less. According to this, the ejection stability of the ink can be further increased, and also a fine conductor pattern can be easily formed. Incidentally, in this description, the "average particle diameter" refers to an average particle diameter on a volume basis unless otherwise noted.

Further, the silver particles (metal particles) are preferably dispersed in a dispersion medium as silver colloidal particles (metal colloidal particles) with a dispersant attached to the surface thereof. According to this, the dispersibility of the silver particles in an aqueous dispersion medium becomes particularly excellent, and the ejection stability of the ink becomes particularly excellent.

The content of the silver colloidal particles in the ink is preferably 1 wt % or more and 60 wt % or less, more preferably 10 wt % or more and 50 wt % or less.

Further, the film-forming material of the film-forming ink for forming the conductor pattern may contain an organic binder. The organic binder prevents aggregation of the silver particles in the conductor pattern precursor formed by the film-forming ink. Further, during sintering, the organic binder can be decomposed and removed, and the silver particles in the conductor pattern precursor are bound to one another, thereby forming the conductor pattern.

The organic binder is not particularly limited, however, examples thereof include polyethylene glycols such as polyethylene glycol #200 (weight average molecular weight: 200), polyethylene glycol #300 (weight average molecular weight: 300), polyethylene glycol #400 (average molecular weight: 400), polyethylene glycol #600 (weight average molecular weight: 600), polyethylene glycol #1000 (weight average molecular weight: 1000), polyethylene glycol #1500 (weight average molecular weight: 1500), polyethylene glycol #1540 (weight average molecular weight: 1540), and polyethylene glycol #2000 (weight average molecular weight: 2000), polyvinyl alcohols such as polyvinyl alcohol #200 (weight average molecular weight: 200), polyvinyl alcohol #300 (weight average molecular weight: 300), polyvinyl alcohol #400 (average molecular weight: 400), polyvinyl alcohol #600 (weight average molecular weight: 600), polyvinyl alcohol #1000 (weight average molecular weight: 1000), polyvinyl alcohol #1500 (weight average molecular weight: 1500), polyvinyl alcohol #1540 (weight average molecular weight: 1540), and polyvinyl alcohol #2000 (weight average molecular weight: 2000), and polyglycerin compounds having a polyglycerin skeleton such as polyglycerin and polyglycerin esters, and it is possible to use one type or two or more types in combination among these. Further, examples of the polyglycerin ester include polyglycerin monostearate, tristearate, tetrastearate, monooleate, pentaoleate, monolaurate, monocaprylate, polyricinoleate, sesquistearate, decaoleate, and sesquioleate.

Further, the content of the organic binder in the ink is preferably 1 wt % or more and 30 wt % or less, more preferably 5 wt % or more and 20 wt % or less. According to this, while making the ejection stability of the ink particularly excellent, the occurrence of a crack or wiring disconnection can be more effectively prevented. On the other hand, when the content of the organic binder is less than the above lower limit, depending on the composition of the organic binder, the effect of preventing the occurrence of a crack is decreased in some cases. Further, when the content of the organic binder exceeds the above upper limit, depending on the composition of the organic binder, it is difficult to make the viscosity of the ink sufficiently low in some cases.

(Electronic Apparatus)

Figure 8:
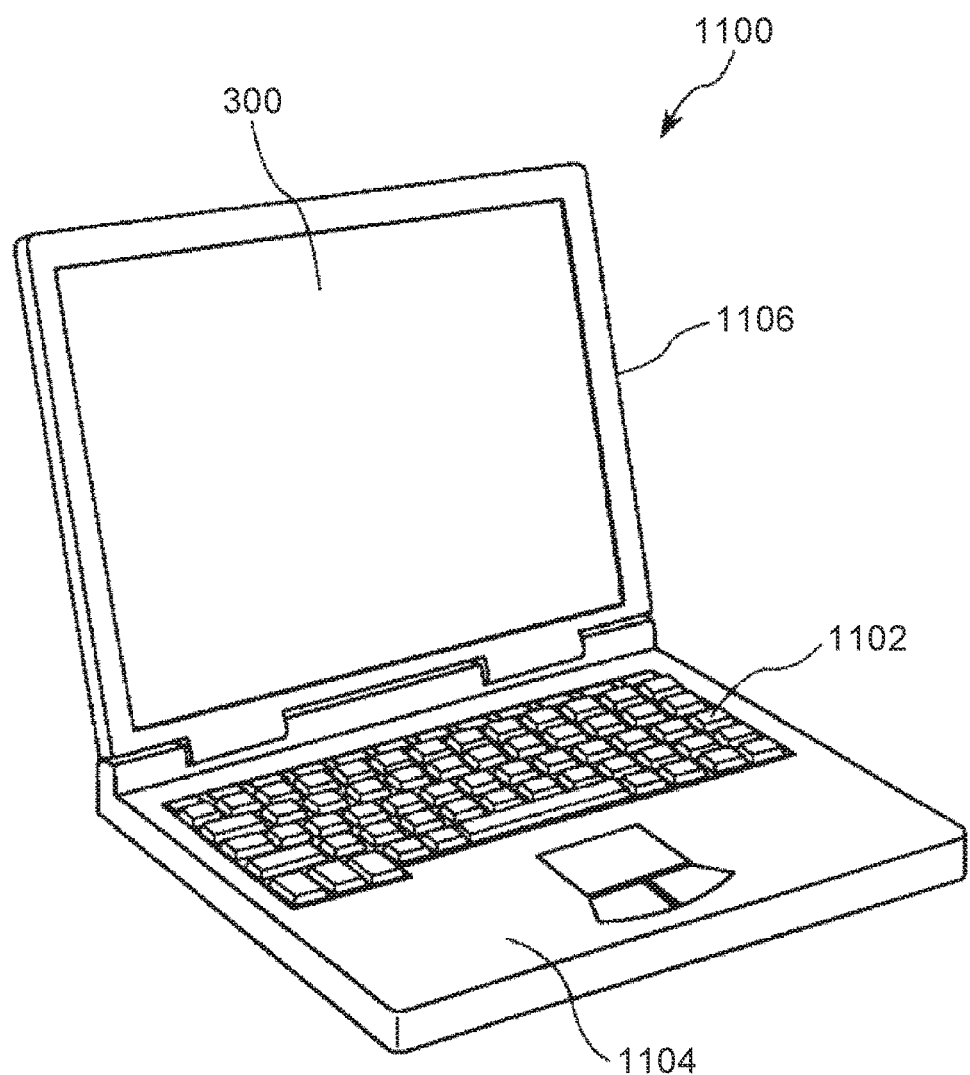
FIG. 8 is a perspective view showing a configuration of a mobile-type (or notebook-type) personal computer to which an electronic apparatus of the invention is applied.

FIG. 8 is a perspective view showing a configuration of a mobile-type (or notebook-type) personal computer to which an electronic apparatus of the invention is applied.

In this drawing, a personal computer 1100 is constituted by a main body part 1104 provided with a keyboard 1102 and a display unit 1106 provided with a display part, and the display unit 1106 is supported rotatably with respect to the main body part 1104 through a hinge structure part.

In this personal computer 1100, the display part included in the display unit 1106 is constituted by the above-mentioned display device 300.

Figure 9:
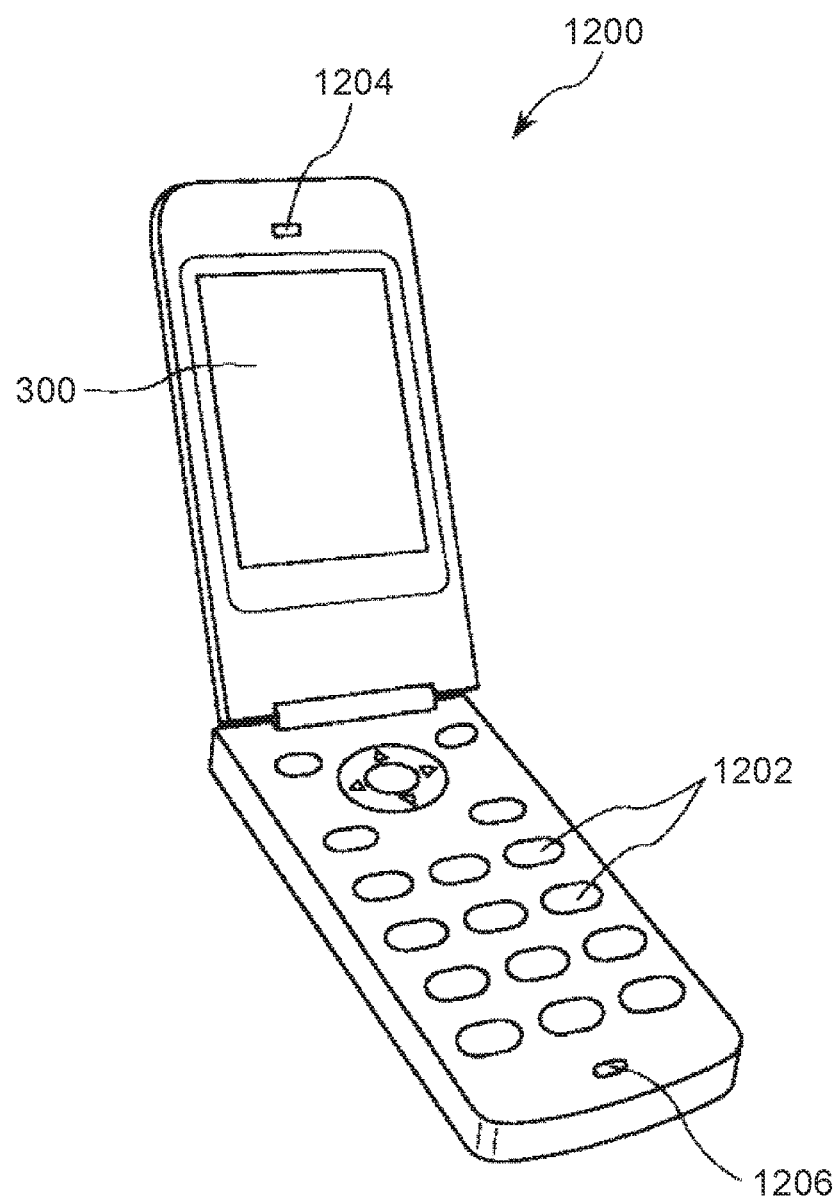
FIG. 9 is a perspective view showing a configuration of a mobile phone (also including a PHS) to which an electronic apparatus of the invention is applied.

FIG. 9 is a perspective view showing a configuration of a mobile phone (also including a PHS) to which an electronic apparatus of the invention is applied.

In this drawing, a mobile phone 1200 includes a plurality of operation buttons 1202, an earpiece 1204, and a mouthpiece 1206, and also a display part.

In the mobile phone 1200, this display part is constituted by the above-mentioned display device 300.

Figure 10:
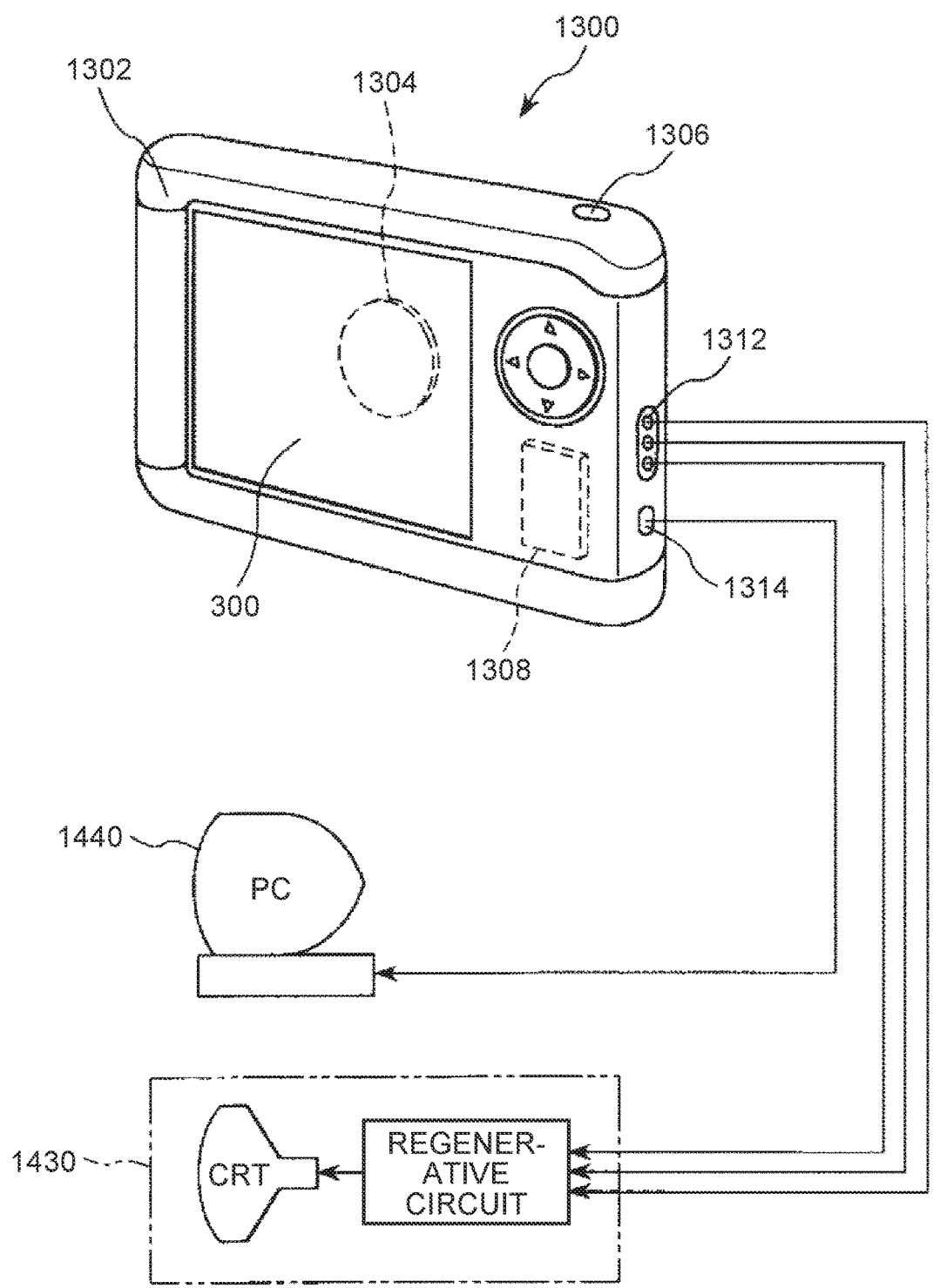
FIG. 10 is a perspective view showing a configuration of a digital still camera to which an electronic apparatus of the invention is applied.

FIG. 10 is a perspective view showing a configuration of a digital still camera to which an electronic apparatus of the invention is applied. Incidentally, in this drawing, connection to external apparatuses is also briefly shown.

Here, while a common camera exposes a silver halide photographic film to light according to an optical image of a subject, a digital still camera 1300 generates an imaging signal (image signal) by performing photoelectric conversion of an optical image of a subject using an imaging element such as a CCD (charge coupled device).

On the rear surface of a case (body) 1302 in the digital still camera 1300, a display part is provided and configured to perform display based on the imaging signal by the CCD, and functions as a finder which displays a subject as an electronic image.

In the digital still camera 1300, this display part is constituted by the above-mentioned display device 300.

In the inside of the case, a circuit board 1308 is installed. In this circuit board 1308, a memory capable of storing an imaging signal is installed.

In addition, a light receiving unit 1304 including an optical lens (imaging optical system), a CCD, and the like is provided on the front surface side (the rear surface side in the configuration shown in the drawing) of the case 1302.

When a photographer checks a subject image displayed on the display part and presses a shutter button 1306, an imaging signal of the CCD at that time point is transferred to and stored in the memory of the circuit board 1308.

In addition, in this digital still camera 1300, a video signal output terminal 1312 and an input/output terminal 1314 for data communication are provided on the side surface of the case 1302. Further, as shown in the drawing, a television monitor 1430 is connected to the video signal output terminal 1312 and a personal computer 1440 is connected to the input/output terminal 1314 for data communication as needed. In addition, it is configured such that an imaging signal stored in the memory of the circuit board 1308 is output to the television monitor 1430 or the personal computer 1440 by a predetermined operation.

The electronic apparatus having such a device with a film of the invention has excellent reliability.

The electronic apparatus of the invention can be applied not only to the personal computer (mobile-type personal computer) shown in FIG. 8, the mobile phone shown in FIG. 9, and the digital still camera shown in FIG. 10, but also, for example, to a television, a video camera, a view finder-type or monitor direct view-type video tape recorder, a laptop-type personal computer, a car navigation device, a pager, an electronic organizer (including an electronic organizer with a communication function), an electronic dictionary, an electronic calculator, an electronic gaming machine, a word processor, a workstation, a videophone, a security television monitor, electronic binoculars, a POS terminal, an apparatus provided with a touch panel (for example, a cash dispenser in financial institutions and an automatic ticket vending machine), a medical apparatus (for example, an electronic thermometer, a sphygmomanometer, a blood glucose meter, an electrocardiographic apparatus, an ultrasonic diagnostic apparatus, or a display device for an endoscope), a fish finder, various types of measurement apparatuses, meters and gauges (for example, meters and gauges for vehicles, aircrafts, and ships), a flight simulator, other various types of monitors, a projection-type display device such as a projector, and the like.

Hereinabove, the film-forming ink, the film formation method, the device with a film, and the electronic apparatus of the invention have been described with reference to the embodiments shown in the drawings, however, the invention is not limited thereto.

For example, in the above-mentioned embodiments, the light-emitting element having three light-emitting layers is described, however, the light-emitting element may have one light-emitting layer or two light-emitting layers, or may have four or more light-emitting layers. Further, the emission color of the light-emitting layer is not limited to R, G, and B in the above-mentioned embodiments.

In the case where a plurality of layers are stacked using the film formation method of the invention, by selecting the type of the liquid medium to be used in the subsequent film formation, or by subjecting the previously formed film to a crosslinking reaction, it is possible to prevent the dissolution of the previously formed film in the subsequent film formation.

Further, the device with a film of the invention is not limited to the above-mentioned color filter, light-emitting device, and wiring board, and the invention can be applied to various devices as long as they are devices having a film formed using the film-forming ink.

Examples

Next, specific Examples of the invention will be described.

Formation of Film Using Film-Forming Ink

1. When Using High-Molecular Weight Hole Transport Material (Hole Injection Material) as Film-Forming Material 1-1. Preparation of Film-Forming Ink First, as a hole transport material (or a hole injection material), poly(N-vinylcarbazole) (PVK), polyfluorene (PF), poly(p-phenylene vinylene) (PPV), poly(methylphenylsilane) (PMPS), poly[N,N'-bis(4-butylphenyl)-N,N'-bis(phenyl)-benzidine], and poly(2,7-(9,9-di-n-octylfluorene)-(1,4-phenylene-((4-sec-butylphenyl)imino)-1,4-phenylene (TFB) were prepared and dissolved in a liquid medium so that the content of these components was 1.5 wt %, whereby film-forming inks for forming a hole transport layer (or a hole injection layer) were prepared, respectively.

Incidentally, as the liquid medium used when preparing these film-forming inks, dibenzyl ether, 4-isopropyl biphenyl, benzyl phenyl ether, 3-phenoxy toluene, octyl benzene, 2-isopropyl naphthalene, 4-methyl biphenyl, diphenylmethane, diphenyl ether, 2-methyl biphenyl, 1-methyl naphthalene, cyclohexyl benzene, heptyl benzene, hexyl benzene, and pentyl benzene were prepared, respectively, as a first component, and each of these first components was used as the liquid medium as shown in Table 1. Further, in addition to the first component, diethylene glycol monophenyl ether, glycerin, triethylene glycol, 2-(benzyloxy)ethanol, diethyl iminodiacetate, diethylene glycol, propylene glycol monophenyl ether, ethylene glycol monophenyl ether, and 1,3-propanediol were prepared, respectively, as a second component, and a mixture obtained by combining the first component with the second component at a content ratio as shown in Tables 2 to 7 was used as the liquid medium.

1-2. Film Formation of Hole Transport Layer (or Hole Injection Layer)

First, an ITO substrate provided with a partition wall with liquid repellency having an opening part with a width of 100 μm×300 μm was prepared, and in this opening part, each of the film-forming inks for forming a hole transport layer (or a hole injection layer) prepared in the above 1-1 was supplied by an inkjet method, whereby a liquid coating film was formed.

Thereafter, vacuum drying (ultimate vacuum degree: $10^{-3}$ Pa) was performed at 25° C., whereby hole transport layers (or hole injection layers) were formed, respectively.

Incidentally, the weight of a liquid droplet to be supplied by the inkjet method was set to 10 ng, and 16 to 40 liquid droplets were supplied into the opening part.

1-3. Evaluation of Film Flatness

Figure 11:
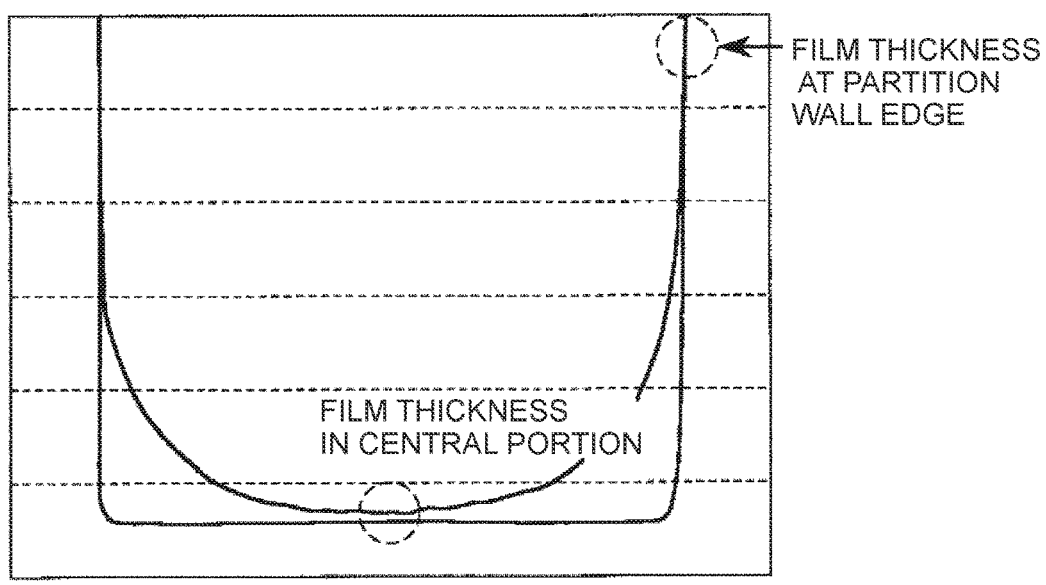
FIG. 11 is a view (graph) showing a position where the thickness of a film formed in an opening part of a partition wall was measured.

The thickness of each of the hole transport layers (or the hole injection layers) formed in the above 1-2 was measured with respect to a central portion of the opening part and an edge portion of the partition wall (bank) (see FIG. 11). Then, based on the measurement value of the central portion (film thickness in central portion) and the measurement value of the edge portion (film thickness at partition wall edge), evaluation was performed according to the following three-step criteria.

A: film thickness at partition wall edge≤film thickness in central portion×1.1

B: film thickness at partition wall edge>film thickness in central portion×1.1

C: Film formation failure due to deposition of the film-forming material is observed.

The evaluation results are shown in the following Table 1 to Table 7, respectively.

TABLE 1

| Functional layer | Material | First component (main solvent) | Bp. | Viscosity [cp] | Film flatness |
|---|---|---|---|---|---|
| HIL, HTL | High-molecular weight | dibenzyl ether | 298 | 10.5 | B |
| | PVK | 4-isopropyl biphenyl | 291 | 9.8 | B |
| | PF | benzyl phenyl ether | 288 | 12 | B |
| | PPV | 3-phenoxy toluene | 272 | 5.8 | B |
| | PMPS | octyl benzene | 268 | 2.8 | B |
| | Poly[N,N'-bis(4-butylphenyl)- | 2-isopropyl naphthalene | 268 | 5.6 | B |
| | N,N'-bis(phenyl)-benzidine] | 4-methyl biphenyl | 268 | 10.2 | B |
| | TFB | diphenylmethane | 265 | 5.5 | B |
| | | diphenyl ether | 260 | 5.8 | B |
| | | 2-methyl biphenyl | 256 | 10 | B |
| | | 1-methyl naphthalene | 244 | 6 | B |
| | | cyclohexyl benzene | 236 | 2.6 | B |
| | | heptyl benzene | 235 | 2.8 | B |
| | | hexyl benzene | 226 | 2.7 | B |
| | | pentyl benzene | 205 | 2.7 | B |

TABLE 2

| | | Mixed solvent (mixing ratio: second component ②:first component ① = 20:100, 60:100, 100:100, 200:100, 300:100, 400:100, 500:100, 600:100, 700:100) | | | Film flatness | | | |
|---|---|---|---|---|---|---|---|---|
| Functional layer | Material | Second component ② | First component ① | Difference in boiling point (① − ②) | 20:100 | 60:100 | 100:100 | 200:100 |
| HIL, HTL | PVK | diethylene glycol monophenyl ether | dibenzyl ether | 0 | A | A | A | A |
| | PF | glycerin | | 8 | A | A | A | A |
| | PPV | triethylene glycol | | 10 | A | A | A | A |
| | PMPS | 2-(benzyloxy)ethanol | | 42 | B | B | B | B |
| | Poly[N,N'-bis(4-butylphenyl)- | diethyl iminodiacetate | | 50 | B | B | B | B |
| | N,N'-bis-(phenyl)-benzidine] | diethylene glycol | | 53 | B | B | B | B |
| | TFB | propylene glycol monophenyl ether | | 55 | B | B | B | B |
| | | ethylene glycol monophenyl ether | | 61 | B | B | B | B |
| | | 1,3-propanediol | | 84 | B | B | B | B |
| HIL, HTL | PVK | diethylene glycol monophenyl ether | 4-isopropyl biphenyl | −7 | A | A | A | A |
| | PF | glycerin | | 1 | A | A | A | A |
| | PPV | triethylene glycol | | 3 | A | A | A | A |
| | PMPS | 2-(benzyloxy)ethanol | | 35 | B | B | C | C |
| | Poly[N,N'-bis(4-butylphenyl)- | diethyl iminodiacetate | | 43 | B | B | B | B |
| | N,N'-bis(phenyl)-benzidine] | diethylene glycol | | 46 | B | B | B | B |
| | TFB | propylene glycol monophenyl ether | | 48 | B | B | B | B |
| | | ethylene glycol monophenyl ether | | 54 | B | B | B | B |
| | | 1,3-propanediol | | 77 | B | B | B | B |
| HIL, HTL | PVK | diethylene glycol monophenyl ether | benzyl phenyl ether | −10 | A | A | A | A |
| | PF | glycerin | | −2 | A | A | A | A |
| | PPV | triethylene glycol | | 0 | A | A | A | A |
| | PMPS | 2-(benzyloxy)ethanol | | 32 | B | B | C | C |
| | Poly[N,N'-bis(4-butylphenyl)- | diethyl iminodiacetate | | 40 | B | B | B | B |
| | N,N'-bis(phenyl)-benzidine] | diethylene glycol | | 43 | B | B | B | B |
| | TFB | propylene glycol monophenyl ether | | 45 | B | B | B | B |
| | | ethylene glycol monophenyl ether | | 51 | B | B | B | B |
| | | 1,3-propanediol | | 74 | B | B | B | B |

TABLE 2-continued

| Functional layer | Material | Second component ② | First component ① | Film flatness | | | | |
|---|---|---|---|---|---|---|---|---|
| | | | | 300:100 | 400:100 | 500:100 | 600:100 | 700:100 |
| HIL, HTL | PVK | diethylene glycol monophenyl ether | dibenzyl ether | A | A | A | C | C |
| | PF | | | | | | | |
| | PPV | glycerin | | A | A | A | C | C |
| | PMPS | triethylene glycol | | A | A | A | C | C |
| | Poly[N,N'-bis(4-butylphenyl)-N,N'-bis-(phenyl)-benzidine] | 2-(benzyloxy)ethanol | | B | B | B | C | C |
| | | diethyl iminodiacetate | | B | B | B | B | B |
| | | diethylene glycol | | B | B | B | B | B |
| | TFB | propylene glycol monophenyl ether | | B | B | B | B | B |
| | | ethylene glycol monophenyl ether | | B | B | B | B | B |
| | | 1,3-propanediol | | B | B | B | B | B |
| HIL, HTL | PVK | diethylene glycol monophenyl ether | 4-isopropyl biphenyl | A | A | A | C | C |
| | PF | | | | | | | |
| | PPV | glycerin | | A | A | A | C | C |
| | PMPS | triethylene glycol | | A | A | A | C | C |
| | Poly[N,N'-bis(4-butylphenyl)-N,N'-bis(phenyl)-benzidine] | 2-(benzyloxy)ethanol | | C | C | C | C | C |
| | | diethyl iminodiacetate | | B | B | B | B | C |
| | | diethylene glycol | | B | B | B | B | B |
| | TFB | propylene glycol monophenyl ether | | B | B | B | B | B |
| | | ethylene glycol monophenyl ether | | B | B | B | B | B |
| | | 1,3-propanediol | | B | B | B | B | B |
| HIL, HTL | PVK | diethylene glycol monophenyl ether | benzyl phenyl ether | A | A | A | C | C |
| | PF | | | | | | | |
| | PPV | glycerin | | A | A | A | C | C |
| | PMPS | triethylene glycol | | A | A | A | C | C |
| | Poly[N,N'-bis(4-butylphenyl)-N,N'-bis(phenyl)-benzidine] | 2-(benzyloxy)ethanol | | C | C | C | C | C |
| | | diethyl iminodiacetate | | B | B | B | B | C |
| | | diethylene glycol | | B | B | B | B | B |
| | TFB | propylene glycol monophenyl ether | | B | B | B | B | B |
| | | ethylene glycol monophenyl ether | | B | B | B | B | B |
| | | 1,3-propanediol | | B | B | B | B | B |

TABLE 3

| Functional layer | Material | Second component ② | First component ① | Difference in boiling point (①−②) | Film flatness | | | |
|---|---|---|---|---|---|---|---|---|
| | | | | | 20:100 | 60:100 | 100:100 | 200:100 |
| HIL, HTL | PVK | diethylene glycol monophenyl ether | 3-phenoxy toluene | −26 | A | A | A | A |
| | PF | | | | | | | |
| | PPV | glycerin | | −18 | A | A | A | A |
| | PMPS | triethylene glycol | | −16 | A | A | A | A |
| | Poly[N,N'-bis(4-butylphenyl)-N,N'-bis(phenyl)-benzidine] | 2-(benzyloxy)ethanol | | 16 | A | A | A | A |
| | | diethyl iminodiacetate | | 24 | A | A | A | A |
| | | diethylene glycol | | 27 | A | A | A | A |
| | TFB | propylene glycol monophenyl ether | | 29 | A | A | A | A |
| | | ethylene glycol monophenyl ether | | 35 | B | B | C | C |
| | | 1,3-propanediol | | 58 | B | B | B | B |
| HIL, HTL | PVK | diethylene glycol monophenyl ether | octyl benzene | −30 | A | A | A | A |
| | PF | | | | | | | |
| | PPV | glycerin | | −22 | A | A | A | A |
| | PMPS | triethylene glycol | | −20 | A | A | A | A |
| | Poly[N,N'- | 2-(benzyloxy)ethanol | | 12 | A | A | A | A |

TABLE 3-continued

| Functional layer | Material | Second component ② | First component ① | | | | |
|---|---|---|---|---|---|---|---|
| | bis(4-butylphenyl)- N,N'-bis(phenyl)- benzidine] TFB | diethyl iminodiacetate | | 20 | A | A | A | A |
| | | diethylene glycol | | 23 | A | A | A | A |
| | | propylene glycol monophenyl ether | | 25 | A | A | A | A |
| | | ethylene glycol monophenyl ether | | 31 | B | B | C | C |
| | | 1,3-propanediol | | 54 | B | B | B | B |
| HIL, HTL | PVK | diethylene glycol monophenyl ether | 2-isopropyl naphthalene | −30 | A | A | A | A |
| | PF | | | | | | | |
| | PPV | glycerin | | −22 | A | A | A | A |
| | PMPS | triethylene glycol | | −20 | A | A | A | A |
| | Poly[N,N'- bis(4-butylphenyl)- N,N'-bis(phenyl)- benzidine] TFB | 2-(benzyloxy)ethanol | | 12 | A | A | A | A |
| | | diethyl iminodiacetate | | 20 | A | A | A | A |
| | | diethylene glycol | | 23 | A | A | A | A |
| | | propylene glycol monophenyl ether | | 25 | A | A | A | A |
| | | ethylene glycol monophenyl ether | | 31 | B | B | C | C |
| | | 1,3-propanediol | | 54 | B | B | B | B |

Mixed solvent (mixing ratio: second component ②:first component ① = 20:100, 60:100, 100:100, 200:100, 300:100, 400:100, 500:100, 600:100, 700:100)

| Functional layer | Material | Second component ② | First component ① | Film flatness | | | | |
|---|---|---|---|---|---|---|---|---|
| | | | | 300:100 | 400:100 | 500:100 | 600:100 | 700:100 |
| HIL, HTL | PVK | diethylene glycol monophenyl ether | 3-phenoxy toluene | A | A | A | C | C |
| | PF | | | | | | | |
| | PPV | glycerin | | A | A | A | C | C |
| | PMPS | triethylene glycol | | A | A | A | C | C |
| | Poly[N,N'- bis(4-butylphenyl)- N,N'-bis(phenyl)- benzidine] TFB | 2-(benzyloxy)ethanol | | A | A | A | C | C |
| | | diethyl iminodiacetate | | A | A | A | C | C |
| | | diethylene glycol | | A | A | A | C | C |
| | | propylene glycol monophenyl ether | | A | A | A | C | C |
| | | ethylene glycol monophenyl ether | | C | C | C | C | C |
| | | 1,3-propanediol | | B | B | B | B | B |
| HIL, HTL | PVK | diethylene glycol monophenyl ether | octyl benzene | A | A | A | C | C |
| | PF | | | | | | | |
| | PPV | glycerin | | A | A | A | C | C |
| | PMPS | triethylene glycol | | A | A | A | C | C |
| | Poly[N,N'- bis(4-butylphenyl)- N,N'-bis(phenyl)- benzidine] TFB | 2-(benzyloxy)ethanol | | A | A | A | C | C |
| | | diethyl iminodiacetate | | A | A | A | C | C |
| | | diethylene glycol | | A | A | A | C | C |
| | | propylene glycol monophenyl ether | | A | A | A | C | C |
| | | ethylene glycol monophenyl ether | | C | C | C | C | C |
| | | 1,3-propanediol | | B | B | B | B | B |
| HIL, HTL | PVK | diethylene glycol monophenyl ether | 2-isopropyl naphthalene | A | A | A | C | C |
| | PF | | | | | | | |
| | PPV | glycerin | | A | A | A | C | C |
| | PMPS | triethylene glycol | | A | A | A | C | C |
| | Poly[N,N'- bis(4-butylphenyl)- N,N'-bis(phenyl)- benzidine] TFB | 2-(benzyloxy)ethanol | | A | A | A | C | C |
| | | diethyl iminodiacetate | | A | A | A | C | C |
| | | diethylene glycol | | A | A | A | C | C |
| | | propylene glycol monophenyl ether | | A | A | A | C | C |
| | | ethylene glycol monophenyl ether | | C | C | C | C | C |
| | | 1,3-propanediol | | B | B | B | B | B |

TABLE 4

| Functional layer | Material | Mixed solvent (mixing ratio: second component ②:first component ① = 20:100, 60:100, 100:100, 200:100, 300:100, 400:100, 500:100, 600:100, 700:100) | | Difference in boiling point (① − ②) | Film flatness | | | |
| --- | --- | --- | --- | --- | --- | --- | --- | --- |
| | | Second component ② | First component ① | | 20:100 | 60:100 | 100:100 | 200:100 |
| HIL, HTL | PVK PF PPV PMPS Poly[N,N'-bis(4-butylphenyl)-N,N'-bis(phenyl)-benzidine] TFB | diethylene glycol monophenyl ether | 4-methyl biphenyl | −30 | A | A | A | A |
| | | glycerin | | −22 | A | A | A | A |
| | | triethylene glycol | | −20 | A | A | A | A |
| | | 2-(benzyloxy)ethanol | | 12 | A | A | A | A |
| | | diethyl iminodiacetate | | 20 | A | A | A | A |
| | | diethylene glycol | | 23 | A | A | A | A |
| | | propylene glycol monophenyl ether | | 25 | A | A | A | A |
| | | ethylene glycol monophenyl ether | | 31 | B | B | C | C |
| | | 1,3-propanediol | | 54 | B | B | B | B |

| Functional layer | Material | Mixed solvent (mixing ratio: second component ②:first component ① = 20:100, 60:100, 100:100, 200:100, 300:100, 400:100, 500:100, 600:100, 700:100) | | Film flatness | | | | |
| --- | --- | --- | --- | --- | --- | --- | --- | --- |
| | | Second component ② | First component ① | 300:100 | 400:100 | 500:100 | 600:100 | 700:100 |
| HIL, HTL | PVK PF PPV PMPS Poly[N,N'-bis(4-butylphenyl)-N,N'-bis(phenyl)-benzidine] TFB | diethylene glycol monophenyl ether | 4-methyl biphenyl | A | A | A | C | C |
| | | glycerin | | A | A | A | C | C |
| | | triethylene glycol | | A | A | A | C | C |
| | | 2-(benzyloxy)ethanol | | A | A | A | C | C |
| | | diethyl iminodiacetate | | A | A | A | C | C |
| | | diethylene glycol | | A | A | A | C | C |
| | | propylene glycol monophenyl ether | | A | A | A | C | C |
| | | ethylene glycol monophenyl ether | | C | C | C | C | C |
| | | 1,3-propanediol | | B | B | B | B | B |

TABLE 5

| Functional layer | Material | Mixed solvent (mixing ratio: second component ②:first component ① = 20:100, 60:100, 100:100, 200:100, 300:100, 400:100, 500:100, 600:100, 700:100) | | Difference in boiling point (① − ②) | Film flatness | | | |
| --- | --- | --- | --- | --- | --- | --- | --- | --- |
| | | Second component ② | First component ① | | 20:100 | 60:100 | 100:100 | 200:100 |
| HIL, HTL | PVK PF PPV PMPS Poly[N,N'-bis(4-butylphenyl)-N,N'-bis(phenyl)-benzidine] TFB | diethylene glycol monophenyl ether | diphenyl-methane | −33 | B | A | A | A |
| | | glycerin | | −25 | A | A | A | A |
| | | triethylene glycol | | −23 | A | A | A | A |
| | | 2-(benzyloxy)ethanol | | 9 | A | A | A | A |
| | | diethyl iminodiacetate | | 17 | A | A | A | A |
| | | diethylene glycol | | 20 | A | A | A | A |
| | | propylene glycol monophenyl ether | | 22 | A | A | A | A |
| | | ethylene glycol monophenyl ether | | 28 | A | A | A | A |
| | | 1,3-propanediol | | 51 | B | B | B | B |
| HIL, HTL | PVK PF PPV PMPS Poly[N,N'-bis(4-butylphenyl)- | diethylene glycol monophenyl ether | diphenyl ether | −38 | B | B | B | B |
| | | glycerin | | −30 | A | A | A | A |
| | | triethylene glycol | | −28 | A | A | A | A |
| | | 2-(benzyloxy)ethanol | | 4 | A | A | A | A |
| | | diethyl iminodiacetate | | 12 | A | A | A | A |

TABLE 5-continued

| Functional layer | Material | Second component ② | First component ① | | | | | |
|---|---|---|---|---|---|---|---|---|
| | N,N'-bis(phenyl)-benzidine] TFB | diethylene glycol monophenyl ether | | 15 | A | A | A | A |
| | | propylene glycol monophenyl ether | | 17 | A | A | A | A |
| | | ethylene glycol monophenyl ether | | 23 | A | A | A | A |
| | | 1,3-propanediol | | 46 | B | B | B | B |
| HIL, HTL | PVK | diethylene glycol monophenyl ether | 2-methyl biphenyl | −42 | C | C | C | C |
| | PF | | | | | | | |
| | PPV | glycerin | | −34 | B | B | B | C |
| | PMPS | triethylene glycol | | −32 | B | B | B | C |
| | Poly[N,N'-bis(4-butylphenyl)-N,N'-bis(phenyl)-benzidine] TFB | 2-(benzyloxy)ethanol | | 0 | A | A | A | A |
| | | diethyl iminodiacetate | | 8 | A | A | A | A |
| | | diethylene glycol | | 11 | A | A | A | A |
| | | propylene glycol monophenyl ether | | 13 | A | A | A | A |
| | | ethylene glycol monophenyl ether | | 19 | A | A | A | A |
| | | 1,3-propanediol | | 42 | B | B | B | B |

Mixed solvent (mixing ratio: second component ②:first component ① = 20:100, 60:100, 100:100, 200:100, 300:100, 400:100, 500:100, 600:100, 700:100)

| Functional layer | Material | Second component ② | First component ① | Film flatness | | | | |
|---|---|---|---|---|---|---|---|---|
| | | | | 300:100 | 400:100 | 500:100 | 600:100 | 700:100 |
| HIL, HTL | PVK | diethylene glycol monophenyl ether | diphenyl-methane | A | A | A | C | C |
| | PF | | | | | | | |
| | PPV | glycerin | | A | A | A | C | C |
| | PMPS | triethylene glycol | | A | A | A | C | C |
| | Poly[N,N'-bis(4-butylphenyl)-N,N'-bis(phenyl)-benzidine] TFB | 2-(benzyloxy)ethanol | | A | A | A | C | C |
| | | diethyl iminodiacetate | | A | A | A | C | C |
| | | diethylene glycol | | A | A | A | C | C |
| | | propylene glycol monophenyl ether | | A | A | A | C | C |
| | | ethylene glycol monophenyl ether | | A | A | A | C | C |
| | | 1,3-propanediol | | B | B | B | B | B |
| HIL, HTL | PVK | diethylene glycol monophenyl ether | diphenyl ether | B | B | B | B | C |
| | PF | | | | | | | |
| | PPV | glycerin | | A | A | A | C | C |
| | PMPS | triethylene glycol | | A | A | A | C | C |
| | Poly[N,N'-bis(4-butylphenyl)-N,N'-bis(phenyl)-benzidine] TFB | 2-(benzyloxy)ethanol | | A | A | A | C | C |
| | | diethyl iminodiacetate | | A | A | A | C | C |
| | | diethylene glycol | | A | A | A | C | C |
| | | propylene glycol monophenyl ether | | A | A | A | C | C |
| | | ethylene glycol monophenyl ether | | A | A | A | C | C |
| | | 1,3-propanediol | | B | B | B | B | B |
| HIL, HTL | PVK | diethylene glycol monophenyl ether | 2-methyl biphenyl | C | C | C | C | C |
| | PF | | | | | | | |
| | PPV | glycerin | | C | C | C | C | C |
| | PMPS | triethylene glycol | | C | C | C | C | C |
| | Poly[N,N'-bis(4-butylphenyl)-N,N'-bis(phenyl)-benzidine] TFB | 2-(benzyloxy)ethanol | | A | A | A | C | C |
| | | diethyl iminodiacetate | | A | A | A | C | C |
| | | diethylene glycol | | A | A | A | C | C |
| | | propylene glycol monophenyl ether | | A | A | A | C | C |
| | | ethylene glycol monophenyl ether | | A | A | A | C | C |
| | | 1,3-propanediol | | B | B | B | B | B |

TABLE 6

| Functional layer | Material | Mixed solvent (mixing ratio: second component ②:first component ① = 20:100, 60:100, 100:100, 200:100, 300:100, 400:100, 500:100, 600:100, 700:100) Second component ② | First component ① | Difference in boiling point (① − ②) | Film flatness 20:100 | 60:100 | 100:100 | 200:100 |
|---|---|---|---|---|---|---|---|---|
| HIL, HTL | PVK PF PPV PMPS Poly[N,N'-bis(4-butylphenyl)-N,N'-bis(phenyl)-benzidine] TFB | diethylene glycol monophenyl ether | 1-methyl naphthalene | −54 | C | C | C | C |
| | | glycerin | | −46 | C | C | C | C |
| | | triethylene glycol | | −44 | C | C | C | C |
| | | 2-(benzyloxy)ethanol | | −12 | A | A | A | A |
| | | diethyl iminodiacetate | | −4 | A | A | A | A |
| | | diethylene glycol | | −1 | A | A | A | A |
| | | propylene glycol monophenyl ether | | 1 | A | A | A | A |
| | | ethylene glycol monophenyl ether | | 7 | A | A | A | A |
| | | 1,3-propanediol | | 30 | A | A | A | A |
| HIL, HTL | PVK PF PPV PMPS Poly[N,N'-bis(4-butylphenyl)-N,N'-bis(phenyl)-benzidine] TFB | diethylene glycol monophenyl ether | cyclohexyl benzene | −62 | C | C | C | C |
| | | glycerin | | −54 | C | C | C | C |
| | | triethylene glycol | | −52 | C | C | C | C |
| | | 2-(benzyloxy)ethanol | | −20 | A | A | A | A |
| | | diethyl iminodiacetate | | −12 | A | A | A | A |
| | | diethylene glycol | | −9 | A | A | A | A |
| | | propylene glycol monophenyl ether | | −7 | A | A | A | A |
| | | ethylene glycol monophenyl ether | | −1 | A | A | A | A |
| | | 1,3-propanediol | | 22 | A | A | A | A |
| HIL, HTL | PVK PF PPV PMPS Poly[N,N'-bis(4-butylphenyl)-N,N'-bis(phenyl)-benzidine] TFB | diethylene glycol monophenyl ether | heptyl benzene | −63 | C | C | C | C |
| | | glycerin | | −55 | C | C | C | C |
| | | triethylene glycol | | −53 | C | C | C | C |
| | | 2-(benzyloxy)ethanol | | −21 | A | A | A | A |
| | | diethyl iminodiacetate | | −13 | A | A | A | A |
| | | diethylene glycol | | −10 | A | A | A | A |
| | | propylene glycol monophenyl ether | | −8 | A | A | A | A |
| | | ethylene glycol monophenyl ether | | −2 | A | A | A | A |
| | | 1,3-propanediol | | 21 | A | A | A | A |

| Functional layer | Material | Mixed solvent (mixing ratio: second component ②:first component ① = 20:100, 60:100, 100:100, 200:100, 300:100, 400:100, 500:100, 600:100, 700:100) Second component ② | First component ① | Film flatness 300:100 | 400:100 | 500:100 | 600:100 | 700:100 |
|---|---|---|---|---|---|---|---|---|
| HIL, HTL | PVK PF PPV PMPS Poly[N,N'-bis(4-butylphenyl)-N,N'-bis(phenyl)-benzidine] TFB | diethylene glycol monophenyl ether | 1-methyl naphthalene | C | C | C | C | C |
| | | glycerin | | C | C | C | C | C |
| | | triethylene glycol | | C | C | C | C | C |
| | | 2-(benzyloxy)ethanol | | A | A | A | C | C |
| | | diethyl iminodiacetate | | A | A | A | C | C |
| | | diethylene glycol | | A | A | A | C | C |
| | | propylene glycol monophenyl ether | | A | A | A | C | C |
| | | ethylene glycol monophenyl ether | | A | A | A | C | C |
| | | 1,3-propanediol | | A | A | A | C | C |
| HIL, HTL | PVK PF PPV PMPS Poly[N,N'-bis(4-butylphenyl)-N,N'-bis(phenyl)-benzidine] | diethylene glycol monophenyl ether | cyclohexyl benzene | C | C | C | C | C |
| | | glycerin | | C | C | C | C | C |
| | | triethylene glycol | | C | C | C | C | C |
| | | 2-(benzyloxy)ethanol | | A | A | A | C | C |
| | | diethyl iminodiacetate | | A | A | A | C | C |
| | | diethylene glycol | | A | A | A | C | C |
| | | propylene glycol | | A | A | A | C | C |

TABLE 6-continued

| | | | | | | | | |
|---|---|---|---|---|---|---|---|---|
| | TFB | monophenyl ether | | | | | | |
| | | ethylene glycol monophenyl ether | | A | A | A | C | C |
| | | 1,3-propanediol | | A | A | A | C | C |
| HIL, HTL | PVK | diethylene glycol | heptyl | C | C | C | C | C |
| | PF | monophenyl ether | benzene | | | | | |
| | PPV | glycerin | | C | C | C | C | C |
| | PMPS | triethylene glycol | | C | C | C | C | C |
| | Poly[N,N'- | 2-(benzyloxy)ethanol | | A | A | A | C | C |
| | bis(4-butylphenyl)- | diethyl iminodiacetate | | A | A | A | C | C |
| | N,N'-bis(phenyl)- | diethylene glycol | | A | A | A | C | C |
| | benzidine] | propylene glycol | | A | A | A | C | C |
| | TFB | monophenyl ether | | | | | | |
| | | ethylene glycol monophenyl ether | | A | A | A | C | C |
| | | 1,3-propanediol | | A | A | A | C | C |

TABLE 7

| | | Mixed solvent (mixing ratio: second component ②:first component ① = 20:100, 60:100, 100:100, 200:100, 300:100, 400:100, 500:100, 600:100, 700:100) | | | Film flatness | | | |
|---|---|---|---|---|---|---|---|---|
| Functional layer | Material | Second component ② | First component ① | Difference in boiling point (① − ②) | 20:100 | 60:100 | 100:100 | 200:100 |
| HIL, HTL | PVK | diethylene glycol | hexyl benzene | −72 | C | C | C | C |
| | PF | monophenyl ether | | | | | | |
| | PPV | glycerin | | −64 | C | C | C | C |
| | PMPS | triethylene glycol | | −62 | C | C | C | C |
| | Poly[N,N'- | 2-(benzyloxy)ethanol | | −30 | A | A | A | A |
| | bis(4-butylphenyl)- | diethyl iminodiacetate | | −22 | A | A | A | A |
| | N,N'-bis(phenyl)- | diethylene glycol | | −19 | A | A | A | A |
| | benzidine] | propylene glycol | | −17 | A | A | A | A |
| | TFB | monophenyl ether | | | | | | |
| | | ethylene glycol monophenyl ether | | −11 | A | A | A | A |
| | | 1,3-propanediol | | 12 | A | A | A | A |
| HIL, HTL | PVK | diethylene glycol | pentyl | −93 | C | C | C | C |
| | PF | monophenyl ether | benzene | | | | | |
| | PPV | glycerin | | −85 | C | C | C | C |
| | PMPS | triethylene glycol | | −83 | C | C | C | C |
| | Poly[N,N'- | 2-(benzyloxy)ethanol | | −51 | C | C | C | C |
| | bis(4-butylphenyl)- | diethyl iminodiacetate | | −43 | C | C | C | C |
| | N,N'-bis(phenyl)- | diethylene glycol | | −40 | C | C | C | C |
| | benzidine] | propylene glycol | | −38 | C | C | C | C |
| | TFB | monophenyl ether | | | | | | |
| | | ethylene glycol monophenyl ether | | −32 | B | B | C | C |
| | | 1,3-propanediol | | −9 | A | A | A | A |

| | | Mixed solvent (mixing ratio: second component ②:first component ① = 20:100, 60:100, 100:100, 200:100, 300:100, 400:100, 500:100, 600:100, 700:100) | | Film flatness | | | | |
|---|---|---|---|---|---|---|---|---|
| Functional layer | Material | Second component ② | First component ① | 300:100 | 400:100 | 500:100 | 600:100 | 700:100 |
| HIL, HTL | PVK | diethylene glycol | hexyl benzene | C | C | C | C | C |
| | PF | monophenyl ether | | | | | | |
| | PPV | glycerin | | C | C | C | C | C |
| | PMPS | triethylene glycol | | C | C | C | C | C |
| | Poly[N,N'- | 2-(benzyloxy)ethanol | | A | A | A | C | C |
| | bis(4-butylphenyl)- | diethyl iminodiacetate | | A | A | A | C | C |
| | N,N'-bis(phenyl)- | diethylene glycol | | A | A | A | C | C |
| | benzidine] | propylene glycol | | A | A | A | C | C |
| | TFB | monophenyl ether | | | | | | |
| | | ethylene glycol monophenyl ether | | A | A | A | C | C |
| | | 1,3-propanediol | | A | A | A | C | C |

TABLE 7-continued

| | | | | | | | | |
|---|---|---|---|---|---|---|---|---|
| HIL, HTL | PVK | diethylene glycol monophenyl ether | pentyl benzene | C | C | C | C | C |
| | PF | glycerin | | C | C | C | C | C |
| | PPV | triethylene glycol | | C | C | C | C | C |
| | PMPS | 2-(benzyloxy)ethanol | | C | C | C | C | C |
| | Poly[N,N'-bis(4-butylphenyl)-N,N'-bis(phenyl)-benzidine] | diethyl iminodiacetate | | C | C | C | C | C |
| | | diethylene glycol | | C | C | C | C | C |
| | | propylene glycol monophenyl ether | | C | C | C | C | C |
| | TFB | ethylene glycol monophenyl ether | | C | C | C | C | C |
| | | 1,3-propanediol | | A | A | A | C | C |

As shown in Table 1, in the case where the liquid medium containing the first component alone was used, in the hole transport layer (or the hole injection layer) formed using the film-forming ink containing the liquid medium, the film thickness at the partition wall edge was thicker than 1.1 times the film thickness in the central portion due to the fact that seeping-up of the film-forming ink was not suppressed, and the hole transport layer (or the hole injection layer) could not be formed with a uniform thickness.

On the other hand, as shown in Tables 2 to 7, by using the liquid medium containing the first component and the second component having a difference in boiling point of 30° C. or less, and also setting the content ratio thereof (the second component:the first component) within the range of 20:100 to 500:100, seeping-up of the film-forming ink could be suppressed, and the hole transport layer (or the hole injection layer) formed using this film-forming ink could be formed as a layer in which the film thickness at the partition wall edge was thinner than 1.1 times the film thickness in the central portion, that is, as the hole transport layer (or the hole injection layer) having a uniform thickness.

2. When Using High-Molecular Weight Light-Emitting Material as Film-Forming Material
2-1. Preparation of Film-Forming Ink First, as a light-emitting material, poly[{9,9-dihexyl-2,7-bis(1-cyanovinylene)fluorenyl-ene}-alt-co-{2,5-bis(N,N'-diphenylamino)-1,4-phenylene}], poly(9,9-dihexylfluorenyl-2,7-diyl), and poly[(9,9-dioctylfluorenyl-2,7-diyl)-co-(N,N'-diphenyl)-N,N'-di(p-butylphenyl)1,4-diamino-benzene)] were prepared and dissolved in a liquid medium so that the content of these components was 1.6 wt %, whereby film-forming inks for forming a light-emitting layer were prepared, respectively.

Incidentally, as the liquid medium used when preparing these film-forming inks, dibenzyl ether, 4-isopropyl biphenyl, benzyl phenyl ether, 3-phenoxy toluene, octyl benzene, 2-isopropyl naphthalene, 4-methyl biphenyl, diphenylmethane, diphenyl ether, 2-methyl biphenyl, 1-methyl naphthalene, cyclohexyl benzene, heptyl benzene, hexyl benzene, and pentyl benzene were prepared, respectively, as a first component, and each of these first components was used as the liquid medium as shown in Table 8. Further, in addition to the first component, diethylene glycol monophenyl ether, glycerin, triethylene glycol, 2-(benzyloxy)ethanol, diethyl iminodiacetate, diethylene glycol, propylene glycol monophenyl ether, ethylene glycol monophenyl ether, and 1,3-propanediol were prepared, respectively, as a second component, and a mixture obtained by combining the first component with the second component at a content ratio as shown in Tables 9 to 16 was used as the liquid medium.

2-2. Film Formation of Light-Emitting Layer

First, an ITO substrate provided with a partition wall with liquid repellency having an opening part with a width of 100 μm×300 μm was prepared, and in this opening part, each of the film-forming inks for forming a light-emitting layer prepared in the above 2-1 was supplied by an inkjet method, whereby a liquid coating film was formed.

Thereafter, vacuum drying (ultimate vacuum degree: $10^{-3}$ Pa) was performed at 25° C., whereby light-emitting layers were formed, respectively.

Incidentally, the weight of a liquid droplet to be supplied by the inkjet method was set to 10 ng, and 16 to 40 liquid droplets were supplied into the opening part.

2-3. Evaluation of Film Flatness

The thickness of each of the light-emitting layers formed in the above 2-2 was measured with respect to a central portion of the opening part and an edge portion of the partition wall (bank) (see FIG. 11). Then, based on the measurement value of the central portion (film thickness in central portion) and the measurement value of the edge portion (film thickness at partition wall edge), evaluation was performed according to the following three-step criteria.

A: film thickness at partition wall edge≤film thickness in central portion×1.1

B: film thickness at partition wall edge>film thickness in central portion×1.1

C: Film formation failure due to deposition of the film-forming material is observed.

The evaluation results are shown in the following Table 8 to Table 16, respectively.

TABLE 8

| Functional layer | Material | First component (main solvent) | Bp. | Viscosity [cp] | Film flatness |
|---|---|---|---|---|---|
| EML | High-molecular weight Poly[{9,9-dihexyl-2,7-bis(1-cyanovinylene)fluorenylene}-alt-co-{2,5-bis(N,N'-diphenylamino)-1,4-phenylene}] Poly(9,9-dihexylfluorenyl-2,7-diyl) Poly[(9,9-dioctylfluorenyl-2,7-diyl)-co-(N,N'-diphenyl)-N,N'-di(p-butylphenyl)1,4-diamino-benzene)] | dibenzyl ether | 298 | 10.5 | B |
| | | 4-isopropyl biphenyl | 291 | 9.8 | B |
| | | benzyl phenyl ether | 288 | 12 | B |
| | | 3-phenoxy toluene | 272 | 5.8 | B |
| | | octyl benzene | 268 | 2.8 | B |
| | | 2-isopropyl naphthalene | 268 | 5.6 | B |
| | | 4-methyl biphenyl | 268 | 10.2 | B |
| | | 2-methyl biphenyl | 256 | 10 | B |
| | | 1-methyl naphthalene | 244 | 6 | B |

TABLE 8-continued

| Functional layer | Material | First component (main solvent) | Bp. | Viscosity [cp] | Film flatness |
|---|---|---|---|---|---|
| | | cyclohexyl benzene | 236 | 2.6 | B |
| | | heptyl benzene | 235 | 2.8 | B |
| | | hexyl benzene | 226 | 2.7 | B |
| | | pentyl benzene | 205 | 2.7 | B |

TABLE 9

Mixed solvent (mixing ratio: second component ②:first component ① = 20:100, 60:100, 100:100, 200:100, 300:100, 400:100, 500:100, 600:100, 700:100)

| Functional layer | Material | Second component ② | First component ① | Difference in boiling point (①-②) | Film flatness 20:100 | 60:100 | 100:100 | 200:100 |
|---|---|---|---|---|---|---|---|---|
| EML | High-molecular weight Poly[{9,9-dihexyl-2,7-bis(1-cyanovinylene)fluorenylene}-alt-co-{2,5-bis(N,N'-diphenylamino)-1,4-phenylene}] Poly(9,9-dihexylfluorenyl-2,7-diyl) Poly[(9,9-dioctylfluorenyl-2,7-diyl)-co-(N,N'-diphenyl)-N,N'-di(p-butylphenyl)1,4-diaminobenzene)] | diethylene glycol monophenyl ether | dibenzyl ether | 0 | A | A | A | A |
| | | glycerin | | 8 | A | A | A | A |
| | | triethylene glycol | | 10 | A | A | A | A |
| | | 2-(benzyloxy)ethanol | | 42 | B | B | B | B |
| | | diethyl iminodiacetate | | 50 | B | B | B | B |
| | | diethylene glycol | | 53 | B | B | B | B |
| | | propylene glycol | | 55 | B | B | B | B |
| | | ethylene glycol | | 61 | B | B | B | B |
| | | monophenyl ether 1,3-propanediol | | 84 | B | B | B | B |
| EML | High-molecular weight Poly[{9,9-dihexyl-2,7-bis(1-cyanovinylene)fluorenylene}-alt-co-{2,5-bis(N,N'-diphenylamino)-1,4-phenylene}] Poly(9,9-dihexylfluorenyl-2,7-diyl) Poly[(9,9-dioctylfluorenyl-2,7-diyl)-co-(N,N'-diphenyl)-N,N'-di(p-butylphenyl)1,4-diaminobenzene)] | diethylene glycol monophenyl ether | 4-isopropyl biphenyl | −7 | A | A | A | A |
| | | glycerin | | 1 | A | A | A | A |
| | | triethylene glycol | | 3 | A | A | A | A |
| | | 2-(benzyloxy)ethanol | | 35 | B | B | C | C |
| | | diethyl iminodiacetate | | 43 | B | B | B | B |
| | | diethylene glycol | | 46 | B | B | B | B |
| | | propylene glycol | | 48 | B | B | B | B |
| | | ethylene glycol | | 54 | B | B | B | B |
| | | monophenyl ether 1,3-propanediol | | 77 | B | B | B | B |

Mixed solvent (mixing ratio: second component ②:first component ① = 20:100, 60:100, 100:100, 200:100, 300:100, 400:100, 500:100, 600:100, 700:100)

| Functional layer | Material | Second component ② | First component ① | Film flatness 300:100 | 400:100 | 500:100 | 600:100 | 700:100 |
|---|---|---|---|---|---|---|---|---|
| EML | High-molecular weight Poly[{9,9-dihexyl-2,7-bis(1-cyanovinylene)fluorenylene}-alt-co-{2,5-bis(N,N'-diphenylamino)-1,4-phenylene}] Poly(9,9-dihexylfluorenyl-2,7-diyl) Poly[(9,9-dioctylfluorenyl-2,7-diyl)-co-(N,N'-diphenyl)-N,N'-di(p-butylphenyl)1,4-diaminobenzene)] | diethylene glycol monophenyl ether | dibenzyl ether | A | A | A | C | C |
| | | glycerin | | A | A | A | C | C |
| | | triethylene glycol | | A | A | A | C | C |
| | | 2-(benzyloxy)ethanol | | B | B | B | C | C |
| | | diethyl iminodiacetate | | B | B | B | B | B |
| | | diethylene glycol | | B | B | B | B | B |
| | | propylene glycol | | B | B | B | B | B |
| | | ethylene glycol | | B | B | B | B | B |
| | | monophenyl ether 1,3-propanediol | | B | B | B | B | B |
| EML | High-molecular weight Poly[{9,9-dihexyl-2,7-bis(1-cyanovinylene)fluorenylene}-alt-co-{2,5-bis(N,N'-diphenylamino)-1,4-phenylene}] Poly(9,9-dihexylfluorenyl-2,7-diyl) | diethylene glycol monophenyl ether | 4-isopropyl biphenyl | A | A | A | C | C |
| | | glycerin | | A | A | A | C | C |
| | | triethylene glycol | | A | A | A | C | C |
| | | 2-(benzyloxy)ethanol | | C | C | C | C | C |
| | | diethyl iminodiacetate | | B | B | B | B | C |
| | | diethylene glycol | | B | B | B | B | B |
| | | propylene glycol | | B | B | B | B | B |

TABLE 9-continued

| Functional layer | Material | Second component | First component | | | | | |
|---|---|---|---|---|---|---|---|---|
| | Poly[(9,9-dioctylfluorenyl-2,7-diyl)-co-(N,N'-diphenyl)-N,N'-di(p-butylphenyl)1,4-diaminobenzene)] | monophenyl ether ethylene glycol monophenyl ether | | B | B | B | B | B |
| | | 1,3-propanediol | | B | B | B | B | B |

TABLE 10

| Functional layer | Material | Second component ② | First component ① | Difference in boiling point (① − ②) | 20:100 | 60:100 | 100:100 | 200:100 | 300:100 | 400:100 | 500:100 | 600:100 | 700:100 |
|---|---|---|---|---|---|---|---|---|---|---|---|---|---|
| EML | High-molecular weight Poly[{9,9-dihexyl-2,7-bis(1-cyanovinylene)fluorenylene}-alt-co-{2,5-bis(N,N'-diphenylamino)-1,4-phenylene}] | diethylene glycol monophenyl ether | benzyl phenyl ether | −10 | A | A | A | A | A | A | A | C | C |
| | | glycerin | | −2 | A | A | A | A | A | A | A | C | C |
| | | triethylene glycol | | 0 | A | A | A | A | A | A | A | C | C |
| | | 2-(benzyloxy)ethanol | | 32 | B | B | C | C | C | C | C | C | C |
| | | diethyl iminodiacetate | | 40 | B | B | B | B | B | B | B | B | C |
| | Poly(9,9-dihexylfluorenyl-2,7-diyl) | diethylene glycol | | 43 | B | B | B | B | B | B | B | B | B |
| | | propylene glycol monophenyl ether | | 45 | B | B | B | B | B | B | B | B | B |
| | Poly[(9,9-dioctylfluorenyl-2,7-diyl)-co-(N,N'-diphenyl)-N,N'-di(p-butylphenyl)1,4-diaminobenzene)] | ethylene glycol monophenyl ether | | 51 | B | B | B | B | B | B | B | B | B |
| | | 1,3-propanediol | | 74 | B | B | B | B | B | B | B | B | B |
| EML | High-molecular weight Poly[{9,9-dihexyl-2,7-bis(1-cyanovinylene)fluorenylene}-alt-co-{2,5-bis(N,N'-diphenylamino)-1,4-phenylene}] | diethylene glycol monophenyl ether | 3-phenoxy toluene | −26 | A | A | A | A | A | A | A | C | C |
| | | glycerin | | −18 | A | A | A | A | A | A | A | C | C |
| | | triethylene glycol | | −16 | A | A | A | A | A | A | A | C | C |
| | | 2-(benzyloxy)ethanol | | 16 | A | A | A | A | A | A | A | C | C |
| | | diethyl iminodiacetate | | 24 | A | A | A | A | A | A | A | C | C |
| | Poly(9,9-dihexylfluorenyl-2,7-diyl) | diethylene glycol | | 27 | A | A | A | A | A | A | A | C | C |
| | | propylene glycol | | 29 | A | A | A | A | A | A | A | C | C |
| | Poly[(9,9-dioctylfluorenyl-2,7-diyl)-co-(N,N'-diphenyl)-N,N'-di(p-butylphenyl)1,4-diaminobenzene)] | monophenyl ether ethylene glycol monophenyl ether | | 35 | B | B | C | C | | | | | |
| | | 1,3-propanediol | | 58 | B | B | B | B | | | | | |

TABLE 10-continued

| | | | | | | | |
|---|---|---|---|---|---|---|---|
| Poly[(9,9-dioctylfluorenyl-2,7-diyl)-co-(N,N'-diphenyl)-N,N'-di(p-butylphenyl)1,4-diamino-benzene)] | monophenyl ether ethylene glycol monophenyl ether 1,3-propanediol | | C B | C B | C B | C B | C B |

TABLE 11

| Functional layer | Material | Mixed solvent (mixing ratio: second component ②:first component ① = 20:100, 60:100, 100:100, 200:100, 300:100, 400:100, 500:100, 600:100, 700:100) | | Film flatness | | | | |
|---|---|---|---|---|---|---|---|---|
| | | Second component ② | First component ① | Difference in boiling point (① − ②) | 20:100 | 60:100 | 100:100 | 200:100 |
| EML | High-molecular weight Poly[{9,9-dihexyl-2,7-bis(1-cyanovinylene)fluorenylene}-alt-co-{2,5-bis(N,N'-diphenylamino)-1,4-phenylene}] | diethylene glycol monophenyl ether | octyl benzene | −30 | A | A | A | A |
| | | glycerin | | −22 | A | A | A | A |
| | | triethylene glycol | | −20 | A | A | A | A |
| | | 2-(benzyloxy)ethanol | | 12 | A | A | A | A |
| | | diethyl iminodiacetate | | 20 | A | A | A | A |
| | Poly(9,9-dihexylfluorenyl-2,7-diyl) | diethylene glycol | | 23 | A | A | A | A |
| | | propylene glycol | | 25 | A | A | A | A |
| | Poly[(9,9-dioctylfluorenyl-2,7-diyl)-co-(N,N'-diphenyl)-N,N'-di(p-butylphenyl)1,4-diamino-benzene)] | monophenyl ether ethylene glycol monophenyl ether | | 31 | B | B | C | C |
| | | 1,3-propanediol | | 54 | B | B | B | B |
| EML | High-molecular weight Poly[{9,9-dihexyl-2,7-bis(1-cyanovinylene)fluorenylene}-alt-co-{2,5-bis(N,N'-diphenylamino)-1,4-phenylene}] | diethylene glycol monophenyl ether | 2-isopropyl naphthalene | −30 | A | A | A | A |
| | | glycerin | | −22 | A | A | A | A |
| | | triethylene glycol | | −20 | A | A | A | A |
| | | 2-(benzyloxy)ethanol | | 12 | A | A | A | A |
| | | diethyl iminodiacetate | | 20 | A | A | A | A |
| | Poly(9,9-dihexylfluorenyl-2,7-diyl) | diethylene glycol | | 23 | A | A | A | A |
| | | propylene glycol | | 25 | A | A | A | A |
| | Poly[(9,9-dioctylfluorenyl-2,7-diyl)-co-(N,N'-diphenyl)-N,N'-di(p-butylphenyl)1,4-diamino-benzene)] | monophenyl ether ethylene glycol monophenyl ether | | 31 | B | B | C | C |
| | | 1,3-propanediol | | 54 | B | B | B | B |

| Functional layer | Material | Mixed solvent (mixing ratio: second component ②:first component ① = 20:100, 60:100, 100:100, 200:100, 300:100, 400:100, 500:100, 600:100, 700:100) | | Film flatness | | | | |
|---|---|---|---|---|---|---|---|---|
| | | Second component ② | First component ① | 300:100 | 400:100 | 500:100 | 600:100 | 700:100 |
| EML | High-molecular weight Poly[{9,9-dihexyl-2,7-bis(1-cyanovinylene)fluorenylene}-alt-co-{2,5-bis(N,N'-diphenylamino)-1,4-phenylene}] | diethylene glycol monophenyl ether | octyl benzene | A | A | A | C | C |
| | | glycerin | | A | A | A | C | C |
| | | triethylene glycol | | A | A | A | C | C |
| | | 2-(benzyloxy)ethanol | | A | A | A | C | C |
| | | diethyl iminodiacetate | | A | A | A | C | C |
| | Poly(9,9-dihexylfluorenyl-2,7-diyl) | diethylene glycol | | A | A | A | C | C |
| | | propylene glycol | | A | A | A | C | C |
| | Poly[(9,9-dioctylfluorenyl-2,7-diyl)-co-(N,N'-diphenyl)-N,N'-di(p-butylphenyl)1,4-diamino-benzene)] | monophenyl ether ethylene glycol monophenyl ether | | C | C | C | C | C |
| | | 1,3-propanediol | | B | B | B | B | B |
| EML | High-molecular weight Poly[{9,9-dihexyl-2,7-bis(1-cyanovinylene)fluorenylene}-alt-co-{2,5-bis(N,N'-diphenylamino)-1,4-phenylene}] | diethylene glycol monophenyl ether | 2-isopropyl naphthalene | A | A | A | C | C |
| | | glycerin | | A | A | A | C | C |
| | | triethylene glycol | | A | A | A | C | C |
| | | 2-(benzyloxy)ethanol | | A | A | A | C | C |
| | | diethyl iminodiacetate | | A | A | A | C | C |
| | Poly(9,9-dihexylfluorenyl-2,7-diyl) | diethylene glycol | | A | A | A | C | C |
| | | propylene glycol | | A | A | A | C | C |

TABLE 11-continued

| | | | | | | | |
|---|---|---|---|---|---|---|---|
| Poly[(9,9-dioctylfluorenyl-2,7-diyl)-co-(N,N'-diphenyl)-N,N'-di(p-butylphenyl)1,4-diaminobenzene)] | monophenyl ether ethylene glycol monophenyl ether | | C | C | C | C | C |
| | 1,3-propanediol | | B | B | B | B | B |

TABLE 12

| Functional layer | Material | Mixed solvent (mixing ratio: second component ②:first component ① = 20:100, 60:100, 100:100, 200:100, 300:100, 400:100, 500:100, 600:100, 700:100) | | Difference in boiling point (① − ②) | Film flatness | | | |
|---|---|---|---|---|---|---|---|---|
| | | Second component ② | First component ① | | 20:100 | 60:100 | 100:100 | 200:100 |
| EML | High-molecular weight Poly[{9,9-dihexyl-2,7-bis(1-cyanovinylene)fluorenylene}-alt-co-{2,5-bis(N,N'-diphenylamino)-1,4-phenylene}] | diethylene glycol monophenyl ether | 4-methyl biphenyl | −30 | A | A | A | A |
| | | glycerin | | −22 | A | A | A | A |
| | | triethylene glycol | | −20 | A | A | A | A |
| | | 2-(benzyloxy)ethanol | | 12 | A | A | A | A |
| | | diethyl iminodiacetate | | 20 | A | A | A | A |
| | Poly(9,9-dihexylfluorenyl-2,7-diyl) | diethylene glycol | | 23 | A | A | A | A |
| | | propylene glycol monophenyl ether | | 25 | A | A | A | A |
| | Poly[(9,9-dioctylfluorenyl-2,7-diyl)-co-(N,N'-diphenyl)-N,N'-di(p-butylphenyl)1,4-diaminobenzene)] | ethylene glycol monophenyl ether | | 31 | B | B | C | C |
| | | 1,3-propanediol | | 54 | B | B | B | B |
| EML | High-molecular weight Poly[{9,9-dihexyl-2,7-bis(1-cyanovinylene)fluorenylene}-alt-co-{2,5-bis(N,N'-diphenylamino)-1,4-phenylene}] | diethylene glycol monophenyl ether | diphenyl-methane | −33 | B | A | A | A |
| | | glycerin | | −25 | A | A | A | A |
| | | triethylene glycol | | −23 | A | A | A | A |
| | | 2-(benzyloxy)ethanol | | 9 | A | A | A | A |
| | | diethyl iminodiacetate | | 17 | A | A | A | A |
| | Poly(9,9-dihexylfluorenyl-2,7-diyl) | diethylene glycol | | 20 | A | A | A | A |
| | | propylene glycol monophenyl ether | | 22 | A | A | A | A |
| | Poly[(9,9-dioctylfluorenyl-2,7-diyl)-co-(N,N'-diphenyl)-N,N'-di(p-butylphenyl)1,4-diaminobenzene)] | ethylene glycol monophenyl ether | | 28 | A | A | A | A |
| | | 1,3-propanediol | | 51 | B | B | B | B |

| Functional layer | Material | Mixed solvent (mixing ratio: second component ②:first component ① = 20:100, 60:100, 100:100, 200:100, 300:100, 400:100, 500:100, 600:100, 700:100) | | Film flatness | | | | |
|---|---|---|---|---|---|---|---|---|
| | | Second component ② | First component ① | 300:100 | 400:100 | 500:100 | 600:100 | 700:100 |
| EML | High-molecular weight Poly[{9,9-dihexyl-2,7-bis(1-cyanovinylene)fluorenylene}-alt-co-{2,5-bis(N,N'-diphenylamino)-1,4-phenylene}] | diethylene glycol monophenyl ether | 4-methyl biphenyl | A | A | A | C | C |
| | | glycerin | | A | A | A | C | C |
| | | triethylene glycol | | A | A | A | C | C |
| | | 2-(benzyloxy)ethanol | | A | A | A | C | C |
| | Poly(9,9-dihexylfluorenyl-2,7-diyl) | diethylene glycol | | A | A | A | C | C |
| | | propylene glycol monophenyl ether | | A | A | A | C | C |
| | Poly[(9,9-dioctylfluorenyl-2,7-diyl)-co-(N,N'-diphenyl)-N,N'-di(p-butylphenyl)1,4-diaminobenzene)] | ethylene glycol monophenyl ether | | C | C | C | C | C |
| | | 1,3-propanediol | | B | B | B | B | B |
| EML | High-molecular weight Poly[{9,9-dihexyl-2,7-bis(1-cyanovinylene)fluorenylene}-alt-co-{2,5-bis(N,N'-diphenylamino)-1,4-phenylene}] | diethylene glycol monophenyl ether | diphenyl-methane | A | A | A | C | C |
| | | glycerin | | A | A | A | C | C |
| | | triethylene glycol | | A | A | A | C | C |
| | | 2-(benzyloxy)ethanol | | A | A | A | C | C |
| | Poly(9,9-dihexylfluorenyl-2,7-diyl) | diethylene glycol | | A | A | A | C | C |
| | | propylene glycol monophenyl ether | | A | A | A | C | C |
| | Poly[(9,9-dioctylfluorenyl-2,7-diyl)-co-(N,N'-diphenyl)-N,N'-di(p-butylphenyl)1,4-diaminobenzene)] | ethylene glycol monophenyl ether | | A | A | A | C | C |
| | | 1,3-propanediol | | B | B | B | B | B |

TABLE 13

| Functional layer | Material | Second component ② | First component ① | Difference in boiling point (① − ②) | 20:100 | 60:100 | 100:100 | 200:100 | 300:100 | 400:100 | 500:100 | 600:100 | 700:100 |
|---|---|---|---|---|---|---|---|---|---|---|---|---|---|
| EML | High-molecular weight Poly[{9,9-dihexyl-2,7-bis(1-cyanovinylene)fluorenylene}-alt-co-{2,5-bis(N,N'-diphenylamino)-1,4-phenylene}] | diethylene glycol monophenyl ether | diphenyl ether | −38 | B | B | B | B | B | B | B | B | C |
|  |  | glycerin |  | −30 | A | A | A | A | A | A | A | C | C |
|  |  | triethylene glycol |  | −28 | A | A | A | A | A | A | A | C | C |
|  |  | 2-(benzyloxy)ethanol |  | 4 | A | A | A | A | A | A | A | C | C |
|  |  | diethyl iminodiacetate |  | 12 | A | A | A | A | A | A | A | C | C |
|  | Poly(9,9-dihexylfluorenyl-2,7-diyl) | diethylene glycol |  | 15 | A | A | A | A | A | A | A | C | C |
|  |  | propylene glycol |  | 17 | A | A | A | A | A | A | A | C | C |
|  | Poly[(9,9-dioctylfluorenyl-2,7-diyl)-co-(N,N'-diphenyl)-N,N'-di(p-butylphenyl)1,4-diaminobenzene)] | ethylene glycol monophenyl ether |  | 23 | A | A | A | A | A | A | A | C | C |
|  |  | 1,3-propanediol |  | 46 | B | B | B | B | B | B | B | B | B |
| EML | High-molecular weight Poly[{9,9-dihexyl-2,7-bis(1-cyanovinylene)fluorenylene}-alt-co-{2,5-bis(N,N'-diphenylamino)-1,4-phenylene}] | diethylene glycol monophenyl ether | 2-methyl biphenyl | −42 | C | C | C | C | C | C | C | C | C |
|  |  | glycerin |  | −34 | B | B | B | C | C | C | C | C | C |
|  |  | triethylene glycol |  | −32 | B | B | B | C | C | C | C | C | C |
|  |  | 2-(benzyloxy)ethanol |  | 0 | A | A | A | A | A | A | A | C | C |
|  |  | diethyl iminodiacetate |  | 8 | A | A | A | A | A | A | A | C | C |
|  | Poly(9,9-dihexylfluorenyl-2,7-diyl) | diethylene glycol |  | 11 | A | A | A | A | A | A | A | C | C |
|  |  | propylene glycol |  | 13 | A | A | A | A | A | A | A | C | C |
|  | Poly[(9,9-dioctylfluorenyl-2,7-diyl)-co-(N,N'-diphenyl)-N,N'-di(p-butylphenyl)1,4-diaminobenzene)] | ethylene glycol monophenyl ether |  | 19 | A | A | A | A | A | A | A | C | C |
|  |  | 1,3-propanediol |  | 42 | B | B | B | B | B | B | B | B | B |

Mixed solvent (mixing ratio: second component ②:first component ① = 20:100, 60:100, 100:100, 200:100, 300:100, 400:100, 500:100, 600:100, 700:100)

TABLE 14

| Functional layer | Material | Second component ② | First component ① | Difference in boiling point (①−②) | Film flatness 20:100 | 60:100 | 100:100 | 200:100 |
|---|---|---|---|---|---|---|---|---|
| EML | High-molecular weight Poly[{9,9-dihexyl-2,7-bis(1-cyanovinylene)fluorenylene}-alt-co-{2,5-bis(N,N'-diphenylamino)-1,4-phenylene}] | diethylene glycol monophenyl ether | 1-methyl naphthalene | −54 | C | C | C | C |
| | | glycerin | | −46 | C | C | C | C |
| | | triethylene glycol | | −44 | C | C | C | C |
| | | 2-(benzyloxy)ethanol | | −12 | A | A | A | A |
| | | diethyl iminodiacetate | | −4 | A | A | A | A |
| | Poly(9,9-dihexylfluorenyl-2,7-diyl) | diethylene glycol monophenyl ether | | −1 | A | A | A | A |
| | | propylene glycol | | 1 | A | A | A | A |
| | Poly[(9,9-dioctylfluorenyl-2,7-diyl)-co-(N,N'-diphenyl)-N,N'-di(p-butylphenyl)1,4-diamino-benzene)] | ethylene glycol monophenyl ether | | 7 | A | A | A | A |
| | | 1,3-propanediol | | 30 | A | A | A | A |
| EML | High-molecular weight Poly[{9,9-dihexyl-2,7-bis(1-cyanovinylene)fluorenylene}-alt-co-{2,5-bis(N,N'-diphenylamino)-1,4-phenylene}] | diethylene glycol monophenyl ether | cyclohexyl benzene | −62 | C | C | C | C |
| | | glycerin | | −54 | C | C | C | C |
| | | triethylene glycol | | −52 | C | C | C | C |
| | | 2-(benzyloxy)ethanol | | −20 | A | A | A | A |
| | | diethyl iminodiacetate | | −12 | A | A | A | A |
| | Poly(9,9-dihexylfluorenyl-2,7-diyl) | diethylene glycol monophenyl ether | | −9 | A | A | A | A |
| | | propylene glycol | | −7 | A | A | A | A |
| | Poly[(9,9-dioctylfluorenyl-2,7-diyl)-co-(N,N'-diphenyl)-N,N'-di(p-butylphenyl)1,4-diamino-benzene)] | ethylene glycol monophenyl ether | | −1 | A | A | A | A |
| | | 1,3-propanediol | | 22 | A | A | A | A |

| Functional layer | Material | Second component ② | First component ① | Film flatness 300:100 | 400:100 | 500:100 | 600:100 | 700:100 |
|---|---|---|---|---|---|---|---|---|
| EML | High-molecular weight Poly[{9,9-dihexyl-2,7-bis(1-cyanovinylene)fluorenylene}-alt-co-{2,5-bis(N,N'-diphenylamino)-1,4-phenylene}] | diethylene glycol monophenyl ether | 1-methyl naphthalene | C | C | C | C | C |
| | | glycerin | | C | C | C | C | C |
| | | triethylene glycol | | C | C | C | C | C |
| | | 2-(benzyloxy)ethanol | | A | A | A | C | C |
| | | diethyl iminodiacetate | | A | A | A | C | C |
| | Poly(9,9-dihexylfluorenyl-2,7-diyl) | diethylene glycol monophenyl ether | | A | A | A | C | C |
| | | propylene glycol | | A | A | A | C | C |
| | Poly[(9,9-dioctylfluorenyl-2,7-diyl)-co-(N,N'-diphenyl)-N,N'-di(p-butylphenyl)1,4-diamino-benzene)] | ethylene glycol monophenyl ether | | A | A | A | C | C |
| | | 1,3-propanediol | | A | A | A | C | C |
| EML | High-molecular weight Poly[{9,9-dihexyl-2,7-bis(1-cyanovinylene)fluorenylene}-alt-co-{2,5-bis(N,N'-diphenylamino)-1,4-phenylene}] | diethylene glycol monophenyl ether | cyclohexyl benzene | C | C | C | C | C |
| | | glycerin | | C | C | C | C | C |
| | | triethylene glycol | | C | C | C | C | C |
| | | 2-(benzyloxy)ethanol | | A | A | A | C | C |
| | | diethyl iminodiacetate | | A | A | A | C | C |
| | Poly(9,9-dihexylfluorenyl-2,7-diyl) | diethylene glycol monophenyl ether | | A | A | A | C | C |
| | | propylene glycol | | A | A | A | C | C |
| | Poly[(9,9-dioctylfluorenyl-2,7-diyl)-co-(N,N'-diphenyl)-N,N'-di(p-butylphenyl)1,4-diamino-benzene)] | ethylene glycol monophenyl ether | | A | A | A | C | C |
| | | 1,3-propanediol | | A | A | A | C | C |

Mixed solvent (mixing ratio: second component ②:first component ① = 20:100, 60:100, 100:100, 200:100, 300:100, 400:100, 500:100, 600:100, 700:100)

TABLE 15

| Functional layer | Material | Mixed solvent Second component ② | Mixed solvent First component ① | Difference in boiling point (①  − ②) | Film flatness 20:100 | 60:100 | 100:100 | 200:100 | 300:100 | 400:100 | 500:100 | 600:100 | 700:100 |
|---|---|---|---|---|---|---|---|---|---|---|---|---|---|
| EML | High-molecular weight Poly[{9,9-dihexyl-2,7-bis(1-cyanovinylene)fluorenylene}-alt-co-{2,5-bis(N,N'-diphenylamino)-1,4-phenylene}] | diethylene glycol monophenyl ether | heptyl benzene | −63 | C | C | C | C | C | C | C | C | C |
| | | glycerin | | −55 | C | C | C | C | C | C | C | C | C |
| | | triethylene glycol | | −53 | C | C | C | C | C | C | C | C | C |
| | | 2-(benzyloxy)ethanol | | −21 | A | A | A | A | A | A | A | C | C |
| | | diethyl iminodiacetate | | −13 | A | A | A | A | A | A | A | C | C |
| | Poly(9,9-dihexylfluorenyl-2,7-diyl) | diethylene glycol | | −10 | A | A | A | A | A | A | A | C | C |
| | | propylene glycol | | −8 | A | A | A | A | A | A | A | C | C |
| | Poly[(9,9-dioctylfluorenyl-2,7-diyl)-co-(N,N'-diphenyl)-N,N'-di(p-butylphenyl)1,4-diamino-benzene)] | monophenyl ether ethylene glycol | | −2 | A | A | A | A | A | A | A | C | C |
| | | monophenyl ether 1,3-propanediol | | 21 | A | A | A | A | A | A | A | C | C |
| EML | High-molecular weight Poly[{9,9-dihexyl-2,7-bis(1-cyanovinylene)fluorenylene}-alt-co-{2,5-bis(N,N'-diphenylamino)-1,4-phenylene}] | diethylene glycol monophenyl ether | hexyl benzene | −72 | C | C | C | C | C | C | C | C | C |
| | | glycerin | | −64 | C | C | C | C | C | C | C | C | C |
| | | triethylene glycol | | −62 | C | C | C | C | C | C | C | C | C |
| | | 2-(benzyloxy)ethanol | | −30 | A | A | A | A | A | A | A | C | C |
| | | diethyl iminodiacetate | | −22 | A | A | A | A | A | A | A | C | C |
| | Poly(9,9-dihexylfluorenyl-2,7-diyl) | diethylene glycol | | −19 | A | A | A | A | A | A | A | C | C |
| | | propylene glycol | | −17 | A | A | A | A | A | A | A | C | C |
| | Poly[(9,9-dioctylfluorenyl-2,7-diyl)-co-(N,N'-diphenyl)-N,N'-di(p-butylphenyl)1,4-diamino-benzene)] | monophenyl ether ethylene glycol | | −11 | A | A | A | A | A | A | A | C | C |
| | | monophenyl ether 1,3-propanediol | | 12 | A | A | A | A | A | A | A | C | C |

TABLE 16

| Functional layer | Material | Second component ② | First component ① | Difference in boiling point (①−②) | Film flatness 20:100 | 60:100 | 100:100 | 200:100 |
|---|---|---|---|---|---|---|---|---|
| EML | High-molecular weight Poly[{9,9-dihexyl-2,7-bis(1-cyanovinylene)fluorenylene}-alt-co-{2,5-bis(N,N'-diphenylamino)-1,4-phenylene}] Poly(9,9-dihexylfluorenyl-2,7-diyl) Poly[(9,9-dioctylfluorenyl-2,7-diyl)-co-(N,N'-diphenyl)-N,N'-di(p-butylphenyl)1,4-diamino-benzene)] | diethylene glycol monophenyl ether glycerin triethylene glycol 2-(benzyloxy)ethanol diethyl iminodiacetate diethylene glycol propylene glycol monophenyl ether ethylene glycol monophenyl ether 1,3-propanediol | pentyl benzene | −93 −85 −83 −51 −43 −40 −38 −32 −9 | C C C C C C C B A | C C C C C C C B A | C C C C C C C C A | C C C C C C C C A |

Mixed solvent (mixing ratio: second component ②:first component ① = 20:100, 60:100, 100:100, 200:100, 300:100, 400:100, 500:100, 600:100, 700:100)

| Functional layer | Material | Second component ② | First component ① | Film flatness 300:100 | 400:100 | 500:100 | 600:100 | 700:100 |
|---|---|---|---|---|---|---|---|---|
| EML | High-molecular weight Poly[{9,9-dihexyl-2,7-bis(1-cyanovinylene)fluorenylene}-alt-co-{2,5-bis(N,N'-diphenylamino)-1,4-phenylene}] Poly(9,9-dihexylfluorenyl-2,7-diyl) Poly[(9,9-dioctylfluorenyl-2,7-diyl)-co-(N,N'-diphenyl)-N,N'-di(p-butylphenyl)1,4-diamino-benzene)] | diethylene glycol monophenyl ether glycerin triethylene glycol 2-(benzyloxy)ethanol diethyl iminodiacetate diethylene glycol propylene glycol monophenyl ether ethylene glycol monophenyl ether 1,3-propanediol | pentyl benzene | C C C C C C C C A | C C C C C C C C A | C C C C C C C C A | C C C C C C C C C | C C C C C C C C C |

As shown in Table 8, in the case where the liquid medium containing the first component alone was used, in the light-emitting layer formed using the film-forming ink containing the liquid medium, the film thickness at the partition wall edge was thicker than 1.1 times the film thickness in the central portion due to the fact that seeping-up of the film-forming ink was not suppressed, and the light-emitting layer could not be formed with a uniform thickness.

On the other hand, as shown in Tables 9 to 16, by using the liquid medium containing the first component and the second component having a difference in boiling point of 30° C. or less, and also setting the content ratio thereof (the second component:the first component) within the range of 20:100 to 500:100, seeping-up of the film-forming ink could be suppressed, and the light-emitting layer formed using this film-forming ink could be formed as a layer in which the film thickness at the partition wall edge was thinner than 1.1 times the film thickness in the central portion, that is, as the light-emitting layer having a uniform thickness.

3. When Using Low-Molecular Weight Hole Transport Material (Hole Injection Material) as Film-Forming Material 3-1. Preparation of Film-Forming Ink First, as a hole transport material (or a hole injection material), copper phthalocyanine (CuPc), 4,4'-(cyclohexane-1,1-diyl)bis(N,N-di-p-tolylaniline) (TAPC), N,N'-bis(3-methylphenyl)-N,N'-bis(phenyl)-benzidine (TPD), N,N'-di(naphthalen-1-yl)-N,N'-diphenyl-benzidine (α-NPD), 4,4',4"-tris(3-methylphenylphenylamino)triphenylamine (m-MTDATA), 4,4',4"-tris{2-naphthyl(phenyl)amino}triphenylamine (2-TNATA), 4,4',4"-tris-9-carbazolyl-triphenylamine (TCTA), 1,3,5-tris[4-(diphenylamino)phenyl]benzene (TDAPB), 2,2',7,7'-tetrakis(N,N-diphenylamino)-9,9'-spirobifluorene (Supiro-TAD), N,N'-di(4-methylphenyl)-N,N'-diphenyl-1,4-phenylenediamine (DPPD=DTP), tris-p-tolylamine (HTM1), 1,1-bis[(di-4-tolylamino)phenyl]cyclohexane (HTM2), 1,3,5-tris(4-pyridyl)-2,4,6-triazine (TPT1), and triphenylamine tetramer (TPTE) were prepared and dissolved in a liquid medium so that the content of these components was 1.6 wt %, whereby film-forming inks for forming a hole transport layer (or a hole injection layer) were prepared, respectively.

Incidentally, as the liquid medium used when preparing these film-forming inks, dibenzyl ether, 4-isopropyl biphenyl, benzyl phenyl ether, 3-phenoxy toluene, octyl benzene, 2-isopropyl naphthalene, 4-methyl biphenyl, diphenylmethane, diphenyl ether, 2-methyl biphenyl, 1-methyl naphthalene, cyclohexyl benzene, heptyl benzene, hexyl benzene, and pentyl benzene were prepared, respectively, as a first component, and each of these first components was used as the liquid medium as shown in Table 17. Further, in addition to the first component, diethylene glycol monophenyl ether, glycerin, triethylene glycol, 2-(benzyloxy)ethanol, diethyl iminodiacetate, diethylene glycol, propylene glycol monophenyl ether, ethylene glycol monophenyl ether, and 1,3-propanediol were prepared, respectively, as a second component, and a mixture obtained by combining the first component with the second component at a content ratio as shown in Tables 18 to 24 was used as the liquid medium.

3-2. Film Formation of Hole Transport Layer (Hole Injection Layer)

First, an ITO substrate provided with a partition wall with liquid repellency having an opening part with a width of 100 μm×300 μm was prepared, and in this opening part, each of the film-forming inks for forming a hole transport layer (or a hole injection layer) prepared in the above 3-1 was supplied by an inkjet method, whereby a liquid coating film was formed.

Thereafter, vacuum drying (ultimate vacuum degree: $10^{-3}$ Pa) was performed at 25° C., whereby hole transport layers (or hole injection layers) were formed, respectively.

Incidentally, the weight of a liquid droplet to be supplied by the inkjet method was set to 10 ng, and 16 to 40 liquid droplets were supplied into the opening part.

3-3. Evaluation of Film Flatness

The thickness of each of the hole transport layers (or the hole injection layers) formed in the above 3-2 was measured with respect to a central portion of the opening part and an edge portion of the partition wall (bank) (see FIG. 11). Then, based on the measurement value of the central portion (film thickness in central portion) and the measurement value of the edge portion (film thickness at partition wall edge), evaluation was performed according to the following three-step criteria.

A: film thickness at partition wall edge≤film thickness in central portion×1.1

B: film thickness at partition wall edge>film thickness in central portion×1.1

C: Film formation failure due to deposition of the film-forming material is observed.

The evaluation results are shown in the following Table 17 to Table 24, respectively.

TABLE 17

| Functional layer | Material | First component (main solvent) | Bp. | Viscosity [cp] | Film flatness |
|---|---|---|---|---|---|
| HIL, HTL | Low-molecular weight CuPc, TAPC, TPD, α-NPD, m-MT DATA 2-TNATA, TCTA, TDAPB spiro--TAD, DPPD, DTP HTM1, HTM2, TPT1, TPTE | dibenzyl ether | 298 | 10.5 | B |
| | | 4-isopropyl biphenyl | 291 | 9.8 | B |
| | | benzyl phenyl ether | 288 | 12 | B |
| | | 3-phenoxy toluene | 272 | 5.8 | B |
| | | octyl benzene | 268 | 2.8 | B |
| | | 2-isopropyl naphthalene | 268 | 5.6 | B |
| | | 4-methyl biphenyl | 268 | 10.2 | B |
| | | 2-methyl biphenyl | 256 | 10 | B |
| | | 1-methyl naphthalene | 244 | 6 | B |
| | | cyclohexyl benzene | 236 | 2.6 | B |
| | | heptyl benzene | 235 | 2.8 | B |
| | | hexyl benzene | 226 | 2.7 | B |
| | | pentyl benzene | 205 | 2.7 | B |

TABLE 18

| | | Mixed solvent (mixing ratio: second component ②:first component ① = 20:100, 60:100, 100:100, 200:100, 300:100, 400:100, 500:100, 600:100, 700:100) | | | Film flatness | | | |
|---|---|---|---|---|---|---|---|---|
| Functional layer | Material | Second component ② | First component ① | Difference in boiling point (① - ②) | 20:100 | 60:100 | 100:100 | 200:100 |
| HIL, HTL | Low-molecular weight CuPc, TAPC, TPD, α-NPD, m-MT DATA 2-TNATA, TCTA, TDAPB spiro-TAD, DPPD, DTP HTM1, HTM2, TPT1, TPTE | diethylene glycol monophenyl ether | dibenzyl ether | 0 | A | A | A | A |
| | | glycerin | | 8 | A | A | A | A |
| | | triethylene glycol | | 10 | A | A | A | A |
| | | 2-(benzyloxy)ethanol | | 42 | B | B | B | B |
| | | diethyl iminodiacetate | | 50 | B | B | B | B |
| | | diethylene glycol | | 53 | B | B | B | B |
| | | propylene glycol monophenyl ether | | 55 | B | B | B | B |
| | | ethylene glycol monophenyl ether | | 61 | B | B | B | B |
| | | 1,3-propanediol | | 84 | B | B | B | B |
| HIL, HTL | Low-molecular weight CuPc, TAPC, TPD, α-NPD, m-MT DATA 2-TNATA, TCTA, TDAPB spiro-TAD, DPPD, DTP HTM1, HTM2, TPT1, TPTE | diethylene glycol monophenyl ether | 4-isopropyl biphenyl | −7 | A | A | A | A |
| | | glycerin | | 1 | A | A | A | A |
| | | triethylene glycol | | 3 | A | A | A | A |
| | | 2-(benzyloxy)ethanol | | 35 | B | B | C | C |
| | | diethyl iminodiacetate | | 43 | B | B | B | B |
| | | diethylene glycol | | 46 | B | B | B | B |
| | | propylene glycol monophenyl ether | | 48 | B | B | B | B |
| | | ethylene glycol monophenyl ether | | 54 | B | B | B | B |

TABLE 18-continued

| | | 1,3-propanediol | 77 | B | B | B | B |

| | | Mixed solvent (mixing ratio: second component ②:first component ① = 20:100, 60:100, 100:100, 200:100, 300:100, 400:100, 500:100, 600:100, 700:100) | | | | | |

| Functional layer | Material | Second component ② | First component ① | Film flatness | | | | |
| --- | --- | --- | --- | --- | --- | --- | --- | --- |
| | | | | 300:100 | 400:100 | 500:100 | 600:100 | 700:100 |
| HIL, HTL | Low-molecular weight CuPc, TAPC, TPD, α-NPD, m-MT DATA 2-TNATA, TCTA, TDAPB spiro-TAD, DPPD, DTP HTM1, HTM2, TPT1, TPTE | diethylene glycol monophenyl ether | dibenzyl ether | A | A | A | C | C |
| | | glycerin | | A | A | A | C | C |
| | | triethylene glycol | | A | A | A | C | C |
| | | 2-(benzyloxy)ethanol | | B | B | B | C | C |
| | | diethyl iminodiacetate | | B | B | B | B | B |
| | | diethylene glycol | | B | B | B | B | B |
| | | propylene glycol monophenyl ether | | B | B | B | B | B |
| | | ethylene glycol monophenyl ether | | B | B | B | B | B |
| | | 1,3-propanediol | | B | B | B | B | B |
| HIL, HTL | Low-molecular weight CuPc, TAPC, TPD, α-NPD, m-MT DATA 2-TNATA, TCTA, TDAPB spiro-TAD, DPPD, DTP HTM1, HTM2, TPT1, TPTE | diethylene glycol monophenyl ether | 4-isopropyl biphenyl | A | A | A | C | C |
| | | glycerin | | A | A | A | C | C |
| | | triethylene glycol | | A | A | A | C | C |
| | | 2-(benzyloxy)ethanol | | C | C | C | C | C |
| | | diethyl iminodiacetate | | B | B | B | B | C |
| | | diethylene glycol | | B | B | B | B | B |
| | | propylene glycol monophenyl ether | | B | B | B | B | B |
| | | ethylene glycol monophenyl ether | | B | B | B | B | B |
| | | 1,3-propanediol | | B | B | B | B | B |

TABLE 19

| | | Mixed solvent (mixing ratio: second component ②:first component ① = 20:100, 60:100, 100:100, 200:100, 300:100, 400:100, 500:100, 600:100, 700:100) | | | | | | |

| Functional layer | Material | Second component ② | First component ① | Difference in boiling point (① − ②) | Film flatness | | | |
| --- | --- | --- | --- | --- | --- | --- | --- | --- |
| | | | | | 20:100 | 60:100 | 100:100 | 200:100 |
| HIL, HTL | Low-molecular weight CuPc, TAPC, TPD, α-NPD, m-MT DATA 2-TNATA, TCTA, TDAPB spiro-TAD, DPPD, DTP HTM1, HTM2, TPT1, TPTE | diethylene glycol monophenyl ether | benzyl phenyl ether | −10 | A | A | A | A |
| | | glycerin | | −2 | A | A | A | A |
| | | triethylene glycol | | 0 | A | A | A | A |
| | | 2-(benzyloxy)ethanol | | 32 | B | B | C | C |
| | | diethyl iminodiacetate | | 40 | B | B | B | B |
| | | diethylene glycol | | 43 | B | B | B | B |
| | | propylene glycol monophenyl ether | | 45 | B | B | B | B |
| | | ethylene glycol monophenyl ether | | 51 | B | B | B | B |
| | | 1,3-propanediol | | 74 | B | B | B | B |
| HIL, HTL | Low-molecular weight CuPc, TAPC, TPD, α-NPD, m-MT DATA 2-TNATA, TCTA, TDAPB spiro-TAD, DPPD, DTP HTM1, HTM2, TPT1, TPTE | diethylene glycol monophenyl ether | 3-phenoxy toluene | −26 | A | A | A | A |
| | | glycerin | | −18 | A | A | A | A |
| | | triethylene glycol | | −16 | A | A | A | A |
| | | 2-(benzyloxy)ethanol | | 16 | A | A | A | A |
| | | diethyl iminodiacetate | | 24 | A | A | A | A |
| | | diethylene glycol | | 27 | A | A | A | A |
| | | propylene glycol monophenyl ether | | 29 | A | A | A | A |
| | | ethylene glycol monophenyl ether | | 35 | B | B | C | C |
| | | 1,3-propanediol | | 58 | B | B | B | B |

TABLE 19-continued

| Functional layer | Material | Mixed solvent (mixing ratio: second component ②:first component ① = 20:100, 60:100, 100:100, 200:100, 300:100, 400:100, 500:100, 600:100, 700:100) | | Film flatness | | | | |
| --- | --- | --- | --- | --- | --- | --- | --- | --- |
| | | Second component ② | First component ① | 300:100 | 400:100 | 500:100 | 600:100 | 700:100 |
| HIL, HTL | Low-molecular weight CuPc, TAPC, TPD, α-NPD, m-MT DATA 2-TNATA, TCTA, TDAPB spiro-TAD, DPPD, DTP HTM1, HTM2, TPT1, TPTE | diethylene glycol monophenyl ether | benzyl phenyl ether | A | A | A | C | C |
| | | glycerin | | A | A | A | C | C |
| | | triethylene glycol | | A | A | A | C | C |
| | | 2-(benzyloxy)ethanol | | C | C | C | C | C |
| | | diethyl iminodiacetate | | B | B | B | B | C |
| | | diethylene glycol | | B | B | B | B | B |
| | | propylene glycol monophenyl ether | | B | B | B | B | B |
| | | ethylene glycol monophenyl ether | | B | B | B | B | B |
| | | 1,3-propanediol | | B | B | B | B | B |
| HIL, HTL | Low-molecular weight CuPc, TAPC, TPD, α-NPD, m-MT DATA 2-TNATA, TCTA, TDAPB spiro-TAD, DPPD, DTP HTM1, HTM2, TPT1, TPTE | diethylene glycol monophenyl ether | 3-phenoxy toluene | A | A | A | C | C |
| | | glycerin | | A | A | A | C | C |
| | | triethylene glycol | | A | A | A | C | C |
| | | 2-(benzyloxy)ethanol | | A | A | A | C | C |
| | | diethyl iminodiacetate | | A | A | A | C | C |
| | | diethylene glycol | | A | A | A | C | C |
| | | propylene glycol monophenyl ether | | A | A | A | C | C |
| | | ethylene glycol monophenyl ether | | C | C | C | C | C |
| | | 1,3-propanediol | | B | B | B | B | B |

TABLE 20

| Functional layer | Material | Mixed solvent (mixing ratio: second component ②:first component ① = 20:100, 60:100, 100:100, 200:100, 300:100, 400:100, 500:100, 600:100, 700:100) | | Difference in boiling point (① − ②) | Film flatness | | | |
| --- | --- | --- | --- | --- | --- | --- | --- | --- |
| | | Second component ② | First component ① | | 20:100 | 60:100 | 100:100 | 200:100 |
| HIL, HTL | Low-molecular weight CuPc, TAPC, TPD, α-NPD, m-MT DATA 2-TNATA, TCTA, TDAPB spiro-TAD, DPPD, DTP HTM1, HTM2, TPT1, TPTE | diethylene glycol monophenyl ether | octyl benzene | −30 | A | A | A | A |
| | | glycerin | | −22 | A | A | A | A |
| | | triethylene glycol | | −20 | A | A | A | A |
| | | 2-(benzyloxy)ethanol | | 12 | A | A | A | A |
| | | diethyl iminodiacetate | | 20 | A | A | A | A |
| | | diethylene glycol | | 23 | A | A | A | A |
| | | propylene glycol monophenyl ether | | 25 | A | A | A | A |
| | | ethylene glycol monophenyl ether | | 31 | B | B | C | C |
| | | 1,3-propanediol | | 54 | B | B | B | B |
| HIL, HTL | Low-molecular weight CuPc, TAPC, TPD, α-NPD, m-MT DATA 2-TNATA, TCTA, TDAPB spiro-TAD, DPPD, DTP HTM1, HTM2, TPT1, TPTE | diethylene glycol monophenyl ether | 2-isopropyl naphthalene | −30 | A | A | A | A |
| | | glycerin | | −22 | A | A | A | A |
| | | triethylene glycol | | −20 | A | A | A | A |
| | | 2-(benzyloxy)ethanol | | 12 | A | A | A | A |
| | | diethyl iminodiacetate | | 20 | A | A | A | A |
| | | diethylene glycol | | 23 | A | A | A | A |
| | | propylene glycol monophenyl ether | | 25 | A | A | A | A |
| | | ethylene glycol monophenyl ether | | 31 | B | B | C | C |
| | | 1,3-propanediol | | 54 | B | B | B | B |

TABLE 20-continued

| Functional layer | Material | Mixed solvent (mixing ratio: second component ②:first component ① = 20:100, 60:100, 100:100, 200:100, 300:100, 400:100, 500:100, 600:100, 700:100) | | Film flatness | | | | |
| --- | --- | --- | --- | --- | --- | --- | --- | --- |
| | | Second component ② | First component ① | 300:100 | 400:100 | 500:100 | 600:100 | 700:100 |
| HIL, HTL | Low-molecular weight CuPc, TAPC, TPD, α-NPD, m-MT DATA 2-TNATA, TCTA, TDAPB spiro-TAD, DPPD, DTP HTM1, HTM2, TPT1, TPTE | diethylene glycol monophenyl ether | octyl benzene | A | A | A | C | C |
| | | glycerin | | A | A | A | C | C |
| | | triethylene glycol | | A | A | A | C | C |
| | | 2-(benzyloxy)ethanol | | A | A | A | C | C |
| | | diethyl iminodiacetate | | A | A | A | C | C |
| | | diethylene glycol | | A | A | A | C | C |
| | | propylene glycol monophenyl ether | | A | A | A | C | C |
| | | ethylene glycol monophenyl ether | | C | C | C | C | C |
| | | 1,3-propanediol | | B | B | B | B | B |
| HIL, HTL | Low-molecular weight CuPc, TAPC, TPD, α-NPD, m-MT DATA 2-TNATA, TCTA, TDAPB spiro-TAD, DPPD, DTP HTM1, HTM2, TPT1, TPTE | diethylene glycol monophenyl ether | 2-isopropyl naphthalene | A | A | A | C | C |
| | | glycerin | | A | A | A | C | C |
| | | triethylene glycol | | A | A | A | C | C |
| | | 2-(benzyloxy)ethanol | | A | A | A | C | C |
| | | diethyl iminodiacetate | | A | A | A | C | C |
| | | diethylene glycol | | A | A | A | C | C |
| | | propylene glycol monophenyl ether | | A | A | A | C | C |
| | | ethylene glycol monophenyl ether | | C | C | C | C | C |
| | | 1,3-propanediol | | B | B | B | B | B |

TABLE 21

| Functional layer | Material | Mixed solvent (mixing ratio: second component ②:first component ① = 20:100, 60:100, 100:100, 200:100, 300:100, 400:100, 500:100, 600:100, 700:100) | | Difference in boiling point (① − ②) | Film flatness | | | |
| --- | --- | --- | --- | --- | --- | --- | --- | --- |
| | | Second component ② | First component ① | | 20:100 | 60:100 | 100:100 | 200:100 |
| HIL, HTL | Low-molecular weight CuPc, TAPC, TPD, α-NPD, m-MT DATA 2-TNATA, TCTA, TDAPB spiro-TAD, DPPD, DTP HTM1, HTM2, TPT1, TPTE | diethylene glycol monophenyl ether | 4-methyl biphenyl | −30 | A | A | A | A |
| | | glycerin | | −22 | A | A | A | A |
| | | triethylene glycol | | −20 | A | A | A | A |
| | | 2-(benzyloxy)ethanol | | 12 | A | A | A | A |
| | | diethyl iminodiacetate | | 20 | A | A | A | A |
| | | diethylene glycol | | 23 | A | A | A | A |
| | | propylene glycol monophenyl ether | | 25 | A | A | A | A |
| | | ethylene glycol monophenyl ether | | 31 | B | B | C | C |
| | | 1,3-propanediol | | 54 | B | B | B | B |
| HIL, HTL | Low-molecular weight CuPc, TAPC, TPD, α-NPD, m-MT DATA 2-TNATA, TCTA, TDAPB spiro-TAD, DPPD, DTP HTM1, HTM2, TPT1, TPTE | diethylene glycol monophenyl ether | diphenyl-methane | −33 | B | A | A | A |
| | | glycerin | | −25 | A | A | A | A |
| | | triethylene glycol | | −23 | A | A | A | A |
| | | 2-(benzyloxy)ethanol | | 9 | A | A | A | A |
| | | diethyl iminodiacetate | | 17 | A | A | A | A |
| | | diethylene glycol | | 20 | A | A | A | A |
| | | propylene glycol monophenyl ether | | 22 | A | A | A | A |
| | | ethylene glycol monophenyl ether | | 28 | A | A | A | A |
| | | 1,3-propanediol | | 51 | B | B | B | B |

TABLE 21-continued

| Functional layer | Material | Mixed solvent Second component ② | Mixed solvent First component ① | Film flatness 300:100 | 400:100 | 500:100 | 600:100 | 700:100 |
|---|---|---|---|---|---|---|---|---|
| HIL, HTL | Low-molecular weight CuPc, TAPC, TPD, α-NPD, m-MT DATA 2-TNATA, TCTA, TDAPB spiro-TAD, DPPD, DTP HTM1, HTM2, TPT1, TPTE | diethylene glycol monophenyl ether | 4-methyl biphenyl | A | A | A | C | C |
| | | glycerin | | A | A | A | C | C |
| | | triethylene glycol | | A | A | A | C | C |
| | | 2-(benzyloxy)ethanol | | A | A | A | C | C |
| | | diethyl iminodiacetate | | A | A | A | C | C |
| | | diethylene glycol | | A | A | A | C | C |
| | | propylene glycol monophenyl ether | | A | A | A | C | C |
| | | ethylene glycol monophenyl ether | | C | C | C | C | C |
| | | 1,3-propanediol | | B | B | B | B | B |
| HIL, HTL | Low-molecular weight CuPc, TAPC, TPD, α-NPD, m-MT DATA 2-TNATA, TCTA, TDAPB spiro-TAD, DPPD, DTP HTM1, HTM2, TPT1, TPTE | diethylene glycol monophenyl ether | diphenyl-methane | A | A | A | C | C |
| | | glycerin | | A | A | A | C | C |
| | | triethylene glycol | | A | A | A | C | C |
| | | 2-(benzyloxy)ethanol | | A | A | A | C | C |
| | | diethyl iminodiacetate | | A | A | A | C | C |
| | | diethylene glycol | | A | A | A | C | C |
| | | propylene glycol monophenyl ether | | A | A | A | C | C |
| | | ethylene glycol monophenyl ether | | A | A | A | C | C |
| | | 1,3-propanediol | | B | B | B | B | B |

TABLE 22

| Functional layer | Material | Second component ② | First component ① | Difference in boiling point (① − ②) | 20:100 | 60:100 | 100:100 | 200:100 |
|---|---|---|---|---|---|---|---|---|
| HIL, HTL | Low-molecular weight CuPc, TAPC, TPD, α-NPD, m-MT DATA 2-TNATA, TCTA, TDAPB spiro-TAD, DPPD, DTP HTM1, HTM2, TPT1, TPTE | diethylene glycol monophenyl ether | diphenyl ether | −38 | B | B | B | B |
| | | glycerin | | −30 | A | A | A | A |
| | | triethylene glycol | | −28 | A | A | A | A |
| | | 2-(benzyloxy)ethanol | | 4 | A | A | A | A |
| | | diethyl iminodiacetate | | 12 | A | A | A | A |
| | | diethylene glycol | | 15 | A | A | A | A |
| | | propylene glycol monophenyl ether | | 17 | A | A | A | A |
| | | ethylene glycol monophenyl ether | | 23 | A | A | A | A |
| | | 1,3-propanediol | | 46 | B | B | B | B |
| HIL, HTL | Low-molecular weight CuPc, TAPC, TPD, α-NPD, m-MT DATA 2-TNATA, TCTA, TDAPB spiro-TAD, DPPD, DTP HTM1, HTM2, TPT1, TPTE | diethylene glycol monophenyl ether | 2-methyl biphenyl | −42 | C | C | C | C |
| | | glycerin | | −34 | B | B | B | C |
| | | triethylene glycol | | −32 | B | B | B | C |
| | | 2-(benzyloxy)ethanol | | 0 | A | A | A | A |
| | | diethyl iminodiacetate | | 8 | A | A | A | A |
| | | diethylene glycol | | 11 | A | A | A | A |
| | | propylene glycol monophenyl ether | | 13 | A | A | A | A |
| | | ethylene glycol monophenyl ether | | 19 | A | A | A | A |
| | | 1,3-propanediol | | 42 | B | B | B | B |
| HIL, HTL | Low-molecular weight CuPc, TAPC, TPD, α-NPD, m-MT DATA 2-TNATA, TCTA, TDAPB | diethylene glycol monophenyl ether | 1-methyl naphthalene | −54 | C | C | C | C |
| | | glycerin | | −46 | C | C | C | C |
| | | triethylene glycol | | −44 | C | C | C | C |
| | | 2-(benzyloxy)ethanol | | −12 | A | A | A | A |

TABLE 22-continued

| Functional layer | Material | Second component ② | First component ① | Difference in boiling point (①−②) | A | A | A | A |
|---|---|---|---|---|---|---|---|---|
| | spiro-TAD, DPPD, DTP HTM1, HTM2, TPT1, TPTE | diethyl iminodiacetate | | −4 | A | A | A | A |
| | | diethylene glycol | | −1 | A | A | A | A |
| | | propylene glycol monophenyl ether | | 1 | A | A | A | A |
| | | ethylene glycol monophenyl ether | | 7 | A | A | A | A |
| | | 1,3-propanediol | | 30 | A | A | A | A |

Mixed solvent (mixing ratio: second component ②:first component ① = 20:100, 60:100, 100:100, 200:100, 300:100, 400:100, 500:100, 600:100, 700:100)

| Functional layer | Material | Second component ② | First component ① | Film flatness | | | | |
|---|---|---|---|---|---|---|---|---|
| | | | | 300:100 | 400:100 | 500:100 | 600:100 | 700:100 |
| HIL, HTL | Low-molecular weight CuPc, TAPC, TPD, α-NPD, m-MT DATA 2-TNATA, TCTA, TDAPB spiro-TAD, DPPD, DTP HTM1, HTM2, TPT1, TPTE | diethylene glycol monophenyl ether | diphenyl ether | B | B | B | B | C |
| | | glycerin | | A | A | A | C | C |
| | | triethylene glycol | | A | A | A | C | C |
| | | 2-(benzyloxy)ethanol | | A | A | A | C | C |
| | | diethyl iminodiacetate | | A | A | A | C | C |
| | | diethylene glycol | | A | A | A | C | C |
| | | propylene glycol monophenyl ether | | A | A | A | C | C |
| | | ethylene glycol monophenyl ether | | A | A | A | C | C |
| | | 1,3-propanediol | | B | B | B | B | B |
| HIL, HTL | Low-molecular weight CuPc, TAPC, TPD, α-NPD, m-MT DATA 2-TNATA, TCTA, TDAPB spiro-TAD, DPPD, DTP HTM1, HTM2, TPT1, TPTE | diethylene glycol monophenyl ether | 2-methyl biphenyl | C | C | C | C | C |
| | | glycerin | | C | C | C | C | C |
| | | triethylene glycol | | C | C | C | C | C |
| | | 2-(benzyloxy)ethanol | | A | A | A | C | C |
| | | diethyl iminodiacetate | | A | A | A | C | C |
| | | diethylene glycol | | A | A | A | C | C |
| | | propylene glycol monophenyl ether | | A | A | A | C | C |
| | | ethylene glycol monophenyl ether | | A | A | A | C | C |
| | | 1,3-propanediol | | B | B | B | B | B |
| HIL, HTL | Low-molecular weight CuPc, TAPC, TPD, α-NPD, m-MT DATA 2-TNATA, TCTA, TDAPB spiro-TAD, DPPD, DTP HTM1, HTM2, TPT1, TPTE | diethylene glycol monophenyl ether | 1-methyl naphthalene | C | C | C | C | C |
| | | glycerin | | C | C | C | C | C |
| | | triethylene glycol | | C | C | C | C | C |
| | | 2-(benzyloxy)ethanol | | A | A | A | C | C |
| | | diethyl iminodiacetate | | A | A | A | C | C |
| | | diethylene glycol | | A | A | A | C | C |
| | | propylene glycol monophenyl ether | | A | A | A | C | C |
| | | ethylene glycol monophenyl ether | | A | A | A | C | C |
| | | 1,3-propanediol | | A | A | A | C | C |

TABLE 23

Mixed solvent (mixing ratio: second component ②:first component ① = 20:100, 60:100, 100:100, 200:100, 300:100, 400:100, 500:100, 600:100, 700:100)

| Functional layer | Material | Second component ② | First component ① | Difference in boiling point (①−②) | 20:100 | 60:100 | 100:100 | 200:100 |
|---|---|---|---|---|---|---|---|---|
| HIL, HTL | Low-molecular weight CuPc, TAPC, TPD, α-NPD, m-MT DATA 2-TNATA, TCTA, TDAPB spiro-TAD, DPPD, DTP HTM1, HTM2, TPT1, | diethylene glycol monophenyl ether | cyclohexyl benzene | −62 | C | C | C | C |
| | | glycerin | | −54 | C | C | C | C |
| | | triethylene glycol | | −52 | C | C | C | C |
| | | 2-(benzyloxy)ethanol | | −20 | A | A | A | A |
| | | diethyl iminodiacetate | | −12 | A | A | A | A |
| | | diethylene glycol | | −9 | A | A | A | A |

TABLE 23-continued

| Functional layer | Material | Second component | First component | | | | | |
|---|---|---|---|---|---|---|---|---|
| | TPTE | propylene glycol monophenyl ether | | −7 | A | A | A | A |
| | | ethylene glycol monophenyl ether | | −1 | A | A | A | A |
| | | 1,3-propanediol | | 22 | A | A | A | A |
| HIL, HTL | Low-molecular weight CuPc, TAPC, TPD, α-NPD, m-MT DATA 2-TNATA, TCTA, TDAPB spiro-TAD, DPPD, DTP HTM1, HTM2, TPT1, TPTE | diethylene glycol monophenyl ether | heptyl benzene | −63 | C | C | C | C |
| | | glycerin | | −55 | C | C | C | C |
| | | triethylene glycol | | −53 | C | C | C | C |
| | | 2-(benzyloxy)ethanol | | −21 | A | A | A | A |
| | | diethyl iminodiacetate | | −13 | A | A | A | A |
| | | diethylene glycol | | −10 | A | A | A | A |
| | | propylene glycol monophenyl ether | | −8 | A | A | A | A |
| | | ethylene glycol monophenyl ether | | −2 | A | A | A | A |
| | | 1,3-propanediol | | 21 | A | A | A | A |
| HIL, HTL | Low-molecular weight CuPc, TAPC, TPD, α-NPD, m-MT DATA 2-TNATA, TCTA, TDAPB spiro-TAD, DPPD, DTP HTM1, HTM2, TPT1, TPTE | diethylene glycol monophenyl ether | hexyl benzene | −72 | C | C | C | C |
| | | glycerin | | −64 | C | C | C | C |
| | | triethylene glycol | | −62 | C | C | C | C |
| | | 2-(benzyloxy)ethanol | | −30 | A | A | A | A |
| | | diethyl iminodiacetate | | −22 | A | A | A | A |
| | | diethylene glycol | | −19 | A | A | A | A |
| | | propylene glycol monophenyl ether | | −17 | A | A | A | A |
| | | ethylene glycol monophenyl ether | | −11 | A | A | A | A |
| | | 1,3-propanediol | | 12 | A | A | A | A |

| Functional layer | Material | Second component ② | First component ① | Film flatness | | | | |
|---|---|---|---|---|---|---|---|---|
| | | | | 300:100 | 400:100 | 500:100 | 600:100 | 700:100 |
| HIL, HTL | Low-molecular weight CuPc, TAPC, TPD, α-NPD, m-MT DATA 2-TNATA, TCTA, TDAPB spiro-TAD, DPPD, DTP HTM1, HTM2, TPT1, TPTE | diethylene glycol monophenyl ether | cyclohexyl benzene | C | C | C | C | C |
| | | glycerin | | C | C | C | C | C |
| | | triethylene glycol | | C | C | C | C | C |
| | | 2-(benzyloxy)ethanol | | A | A | A | C | C |
| | | diethyl iminodiacetate | | A | A | A | C | C |
| | | diethylene glycol | | A | A | A | C | C |
| | | propylene glycol monophenyl ether | | A | A | A | C | C |
| | | ethylene glycol monophenyl ether | | A | A | A | C | C |
| | | 1,3-propanediol | | A | A | A | C | C |
| HIL, HTL | Low-molecular weight CuPc, TAPC, TPD, α-NPD, m-MT DATA 2-TNATA, TCTA, TDAPB spiro-TAD, DPPD, DTP HTM1, HTM2, TPT1, TPTE | diethylene glycol monophenyl ether | heptyl benzene | C | C | C | C | C |
| | | glycerin | | C | C | C | C | C |
| | | triethylene glycol | | C | C | C | C | C |
| | | 2-(benzyloxy)ethanol | | A | A | A | C | C |
| | | diethyl iminodiacetate | | A | A | A | C | C |
| | | diethylene glycol | | A | A | A | C | C |
| | | propylene glycol monophenyl ether | | A | A | A | C | C |
| | | ethylene glycol monophenyl ether | | A | A | A | C | C |
| | | 1,3-propanediol | | A | A | A | C | C |
| HIL, HTL | Low-molecular weight CuPc, TAPC, TPD, α-NPD, m-MT DATA 2-TNATA, TCTA, TDAPB spiro-TAD, DPPD, DTP HTM1, HTM2, TPT1, TPTE | diethylene glycol monophenyl ether | hexyl benzene | C | C | C | C | C |
| | | glycerin | | C | C | C | C | C |
| | | triethylene glycol | | C | C | C | C | C |
| | | 2-(benzyloxy)ethanol | | A | A | A | C | C |
| | | diethyl iminodiacetate | | A | A | A | C | C |
| | | diethylene glycol | | A | A | A | C | C |
| | | propylene glycol monophenyl ether | | A | A | A | C | C |
| | | ethylene glycol monophenyl ether | | A | A | A | C | C |
| | | 1,3-propanediol | | A | A | A | C | C |

Mixed solvent (mixing ratio: second component ②:first component ① = 20:100, 60:100, 100:100, 200:100, 300:100, 400:100, 500:100, 600:100, 700:100)

TABLE 24

| Functional layer | Material | Mixed solvent Second component ② | Mixed solvent First component ① | Difference in boiling point (①−②) | Film flatness 20:100 | 60:100 | 100:100 | 200:100 | 300:100 | 400:100 | 500:100 | 600:100 | 700:100 |
|---|---|---|---|---|---|---|---|---|---|---|---|---|---|
| HIL, HTL | Low-molecular weight CuPc, TAPC, TPD, α-NPD, m-MT DATA 2-TNATA, TCTA, TDAPB spiro-TAD, DPPD, DTP HTM1, HTM2, TPT1, TPTE | diethylene glycol monophenyl ether | pentyl benzene | −93 | C | C | C | C | C | C | C | C | C |
| | | glycerin | | −85 | C | C | C | C | C | C | C | C | C |
| | | triethylene glycol | | −83 | C | C | C | C | C | C | C | C | C |
| | | 2-(benzyloxy)ethanol | | −51 | C | C | C | C | C | C | C | C | C |
| | | diethyl iminodiacetate | | −43 | C | C | C | C | C | C | C | C | C |
| | | diethylene glycol | | −40 | C | C | C | C | C | C | C | C | C |
| | | propylene glycol monophenyl ether | | −38 | C | C | C | C | C | C | C | C | C |
| | | ethylene glycol monophenyl ether | | −32 | B | B | C | C | C | C | C | C | C |
| | | 1,3-propanediol | | −9 | A | A | A | A | A | A | A | C | C |

As shown in Table 17, in the case where the liquid medium containing the first component alone was used, in the hole transport layer (or the hole injection layer) formed using the film-forming ink containing the liquid medium, the film thickness at the partition wall edge was thicker than 1.1 times the film thickness in the central portion due to the fact that seeping-up of the film-forming ink was not suppressed, and the hole transport layer (or the hole injection layer) could not be formed with a uniform thickness.

On the other hand, as shown in Tables 18 to 24, by using the liquid medium containing the first component and the second component having a difference in boiling point of 30° C. or less, and also setting the content ratio thereof (the second component:the first component) within the range of 20:100 to 500:100, seeping-up of the film-forming ink could be suppressed, and the hole transport layer (or the hole injection layer) formed using this film-forming ink could be formed as a layer in which the film thickness at the partition wall edge was thinner than 1.1 times the film thickness in the central portion, that is, as the hole transport layer (or the hole injection layer) having a uniform thickness.

4. When Using Low-Molecular Weight Light-Emitting Material as Film-Forming Material 4-1. Preparation of Film-Forming Ink First, as a host material to be contained in a light-emitting material, 4,4'-N,N'-dicarbazol-biphenyl (CBP), BAlq, mCP, CDBP, DCB, P06, SimCP, UGH3, and TDAPB, as a red light-emitting material (dopant), Bt2Ir (acac), Btp2Ir (acac), and PtOEP, as a green light-emitting material (dopant), Ir(ppy)3 and Ppy2Ir(acac), as a blue light-emitting material (dopant), FIrpic, Ir(pmb)3, FIrN4, and FIrtaz were prepared, respectively, and dissolved in a liquid medium so that the content of the host material was 97 wt % and the content of the light-emitting material was 3 wt % in a combination of each host material with each light-emitting material (the red light-emitting material, the green light-emitting material, or the blue light-emitting material), whereby film-forming inks for forming a light-emitting layer were prepared, respectively.

Incidentally, as the liquid medium used when preparing these film-forming inks, dibenzyl ether, 4-isopropyl biphenyl, benzyl phenyl ether, 3-phenoxy toluene, octyl benzene, 2-isopropyl naphthalene, 4-methyl biphenyl, diphenylmethane, diphenyl ether, 2-methyl biphenyl, 1-methyl naphthalene, cyclohexyl benzene, heptyl benzene, hexyl benzene, and pentyl benzene were prepared, respectively, as a first component, and each of these first components was used as the liquid medium as shown in Table 25. Further, in addition to the first component, diethylene glycol monophenyl ether, glycerin, triethylene glycol, 2-(benzyloxy)ethanol, diethyl iminodiacetate, diethylene glycol, propylene glycol monophenyl ether, ethylene glycol monophenyl ether, and 1,3- propanediol were prepared, respectively, as a second component, and a mixture obtained by combining the first component with the second component at a content ratio as shown in Tables 26 to 31 was used as the liquid medium.

4-2. Film Formation of Light-Emitting Layer

First, an ITO substrate provided with a partition wall with liquid repellency having an opening part with a width of 100 μm×300 μm was prepared, and in this opening part, each of the film-forming inks for forming a light-emitting layer prepared in the above 4-1 was supplied by an inkjet method, whereby a liquid coating film was formed. Then, vacuum drying (ultimate vacuum degree: $10^{-3}$ Pa) was performed at 25° C., whereby light-emitting layers were formed, respectively.

Incidentally, the weight of a liquid droplet to be supplied by the inkjet method was set to 10 ng, and 16 to 40 liquid droplets were supplied into the opening part.

4-3. Evaluation of Film Flatness

The thickness of each of the light-emitting layers formed in the above 4-2 was measured with respect to a central portion of the opening part and an edge portion of the partition wall (bank) (see FIG. 11). Then, based on the measurement value of the central portion (film thickness in central portion) and the measurement value of the edge portion (film thickness at partition wall edge), evaluation was performed according to the following three-step criteria.

A: film thickness at partition wall edge≤film thickness in central portion×1.1

B: film thickness at partition wall edge>film thickness in central portion×1.1

C: Film formation failure due to deposition of the film-forming material is observed.

The evaluation results are shown in the following Table 25 to Table 31, respectively.

TABLE 25

| Functional layer | Material | First component (main solvent) | Bp. | Viscosity [cp] | Film flatness |
|---|---|---|---|---|---|
| EML | <Host> CBP, BAlq, mCP, CDBP, DCB, P06, SimCP, UGH3, TDAPB | dibenzyl ether | 298 | 10.5 | B |
| | | 4-isopropyl biphenyl | 291 | 9.8 | B |
| | | benzyl phenyl ether | 288 | 12 | B |
| | <Red dopant> Bt2Ir(acac), Btp2Ir(acac) PtOEP | 3-phenoxy toluene | 272 | 5.8 | B |
| | | octyl benzene | 268 | 2.8 | B |
| | | 2-isopropyl naphthalene | 268 | 5.6 | B |
| | <Green dopant> Ir(ppy)3, Ppy2Ir(acac) | 4-methyl biphenyl | 268 | 10.2 | B |
| | | 2-methyl biphenyl | 256 | 10 | B |
| | <Blue dopant> FIrpic, Ir(pmb)3, FIrN4, Firtaz | 1-methyl naphthalene | 244 | 6 | B |
| | | cyclohexyl benzene | 236 | 2.6 | B |
| | | heptyl benzene | 235 | 2.8 | B |
| | | hexyl benzene | 226 | 2.7 | B |
| | | pentyl benzene | 205 | 2.7 | B |

TABLE 26

| | | Mixed solvent (mixing ratio: second component ②:first component ① = 20:100, 60:100, 100:100, 200:100, 300:100, 400:100, 500:100, 600:100, 700:100) | | | Film flatness | | | |
|---|---|---|---|---|---|---|---|---|
| Functional layer | Material | Second component ② | First component ① | Difference in boiling point (①) − (②) | 20:100 | 60:100 | 100:100 | 200:100 |
| EML | <Host> CBP, BAlq, mCP, CDBP, DCB, P06, SimCP, UGH3, TDAPB | diethylene glycol monophenyl ether | dibenzyl ether | 0 | A | A | A | A |
| | | glycerin | | 8 | A | A | A | A |
| | | triethylene glycol | | 10 | A | A | A | A |
| | <Red dopant> Bt2Ir(acac), Btp2Ir(acac) PtOEP | 2-(benzyloxy)ethanol | | 42 | B | B | B | B |
| | | diethyl iminodiacetate | | 50 | B | B | B | B |
| | | diethylene glycol | | 53 | B | B | B | B |
| | <Green dopant> Ir(ppy)3, Ppy2Ir(acac) | propylene glycol monophenyl ether | | 55 | B | B | B | B |
| | <Blue dopant> FIrpic, Ir(pmb)3, FIrN4, Firtaz | ethylene glycol monophenyl ether | | 61 | B | B | B | B |
| | | 1,3-propanediol | | 84 | B | B | B | B |
| EML | <Host> CBP, BAlq, mCP, CDBP, DCB, P06, SimCP, UGH3, TDAPB | diethylene glycol monophenyl ether | 4-isopropyl biphenyl | −7 | A | A | A | A |
| | | glycerin | | 1 | A | A | A | A |
| | | triethylene glycol | | 3 | A | A | A | A |
| | <Red dopant> Bt2Ir(acac), Btp2Ir(acac) PtOEP | 2-(benzyloxy)ethanol | | 35 | B | B | C | C |
| | | diethyl iminodiacetate | | 43 | B | B | B | B |
| | | diethylene glycol | | 46 | B | B | B | B |
| | <Green dopant> Ir(ppy)3, Ppy2Ir(acac) | propylene glycol monophenyl ether | | 48 | B | B | B | B |
| | <Blue dopant> FIrpic, Ir(pmb)3, FIrN4, Firtaz | ethylene glycol monophenyl ether | | 54 | B | B | B | B |
| | | 1,3-propanediol | | 77 | B | B | B | B |
| EML | <Host> CBP, BAlq, mCP, CDBP, DCB, P06, SimCP, UGH3, | diethylene glycol monophenyl ether | benzyl phenyl ether | −10 | A | A | A | A |
| | | glycerin | | −2 | A | A | A | A |

TABLE 26-continued

| Functional layer | Material | Second component | First component | Diff. b.p. | 20:100 | 60:100 | 100:100 | 200:100 |
|---|---|---|---|---|---|---|---|---|
| | TDAPB | triethylene glycol | | 0 | A | A | A | A |
| | <Red dopant> | 2-(benzyloxy)ethanol | | 32 | B | B | C | C |
| | Bt2Ir(acac), Btp2Ir(acac) | diethyl iminodiacetate | | 40 | B | B | B | B |
| | PtOEP | diethylene glycol | | 43 | B | B | B | B |
| | <Green dopant> | propylene glycol monophenyl ether | | 45 | B | B | B | B |
| | Ir(ppy)3, Ppy2Ir(acac) | | | | | | | |
| | <Blue dopant> | ethylene glycol monophenyl ether | | 51 | B | B | B | B |
| | FIrpic, Ir(pmb)3, FIrN4, Firtaz | 1,3-propanediol | | 74 | B | B | B | B |

| Functional layer | Material | Second component ② | First component ① | 300:100 | 400:100 | 500:100 | 600:100 | 700:100 |
|---|---|---|---|---|---|---|---|---|
| EML | <Host> CBP, BAlq, mCP, CDBP, DCB, P06, SimCP, UGH3, TDAPB | diethylene glycol monophenyl ether | dibenzyl ether | A | A | A | C | C |
| | | glycerin | | A | A | A | C | C |
| | | triethylene glycol | | A | A | A | C | C |
| | <Red dopant> | 2-(benzyloxy)ethanol | | B | B | B | C | C |
| | Bt2Ir(acac), Btp2Ir(acac) | diethyl iminodiacetate | | B | B | B | B | B |
| | PtOEP | diethylene glycol | | B | B | B | B | B |
| | <Green dopant> Ir(ppy)3, Ppy2Ir(acac) | propylene glycol monophenyl ether | | B | B | B | B | B |
| | <Blue dopant> FIrpic, Ir(pmb)3, FIrN4, Firtaz | ethylene glycol monophenyl ether | | B | B | B | B | B |
| | | 1,3-propanediol | | B | B | B | B | B |
| EML | <Host> CBP, BAlq, mCP, CDBP, DCB, P06, SimCP, UGH3, TDAPB | diethylene glycol monophenyl ether | 4-isopropyl biphenyl | A | A | A | C | C |
| | | glycerin | | A | A | A | C | C |
| | | triethylene glycol | | A | A | A | C | C |
| | <Red dopant> | 2-(benzyloxy)ethanol | | C | C | C | C | C |
| | Bt2Ir(acac), Btp2Ir(acac) | diethyl iminodiacetate | | B | B | B | B | C |
| | PtOEP | diethylene glycol | | B | B | B | B | B |
| | <Green dopant> Ir(ppy)3, Ppy2Ir(acac) | propylene glycol monophenyl ether | | B | B | B | B | B |
| | <Blue dopant> FIrpic, Ir(pmb)3, FIrN4, Firtaz | ethylene glycol monophenyl ether | | B | B | B | B | B |
| | | 1,3-propanediol | | B | B | B | B | B |
| EML | <Host> CBP, BAlq, mCP, CDBP, DCB, P06, SimCP, UGH3, TDAPB | diethylene glycol monophenyl ether | benzyl phenyl ether | A | A | A | C | C |
| | | glycerin | | A | A | A | C | C |
| | | triethylene glycol | | A | A | A | C | C |
| | <Red dopant> | 2-(benzyloxy)ethanol | | C | C | C | C | C |
| | Bt2Ir(acac), Btp2Ir(acac) | diethyl iminodiacetate | | B | B | B | B | C |
| | PtOEP | diethylene glycol | | B | B | B | B | B |
| | <Green dopant> Ir(ppy)3, Ppy2Ir(acac) | propylene glycol monophenyl ether | | B | B | B | B | B |
| | <Blue dopant> FIrpic, Ir(pmb)3, FIrN4, Firtaz | ethylene glycol monophenyl ether | | B | B | B | B | B |
| | | 1,3-propanediol | | B | B | B | B | B |

TABLE 27

| Functional layer | Material | Second component ② | First component ① | Difference in boiling point (① − ②) | 20:100 | 60:100 | 100:100 | 200:100 |
|---|---|---|---|---|---|---|---|---|
| EML | <Host> CBP, BAlq, mCP, CDBP, DCB, P06, SimCP, UGH3, TDAPB | diethylene glycol monophenyl ether | 3-phenoxy toluene | −26 | A | A | A | A |
| | | glycerin | | −18 | A | A | A | A |
| | | triethylene glycol | | −16 | A | A | A | A |
| | <Red dopant> | 2-(benzyloxy)ethanol | | 16 | A | A | A | A |
| | Bt2Ir(acac), Btp2Ir(acac) | diethyl iminodiacetate | | 24 | A | A | A | A |
| | PtOEP | diethylene glycol | | 27 | A | A | A | A |

TABLE 27-continued

| Functional layer | Material | Second component | First component | | 20:100 | 60:100 | 100:100 | 200:100 |
|---|---|---|---|---|---|---|---|---|
| | <Green dopant> Ir(ppy)3, Ppy2Ir(acac) | propylene glycol monophenyl ether | | 29 | A | A | A | A |
| | <Blue dopant> FIrpic, Ir(pmb)3, FIrN4, Firtaz | ethylene glycol monophenyl ether | | 35 | B | B | C | C |
| | | 1,3-propanediol | | 58 | B | B | B | B |
| EML | <Host> CBP, BAlq, mCP, CDBP, DCB, P06, SimCP, UGH3, TDAPB | diethylene glycol monophenyl ether | octyl benzene | -30 | A | A | A | A |
| | | glycerin | | -22 | A | A | A | A |
| | | triethylene glycol | | -20 | A | A | A | A |
| | <Red dopant> Bt2Ir(acac), Btp2Ir(acac) | 2-(benzyloxy)ethanol | | 12 | A | A | A | A |
| | | diethyl iminodiacetate | | 20 | A | A | A | A |
| | PtOEP | diethylene glycol | | 23 | A | A | A | A |
| | <Green dopant> Ir(ppy)3, Ppy2Ir(acac) | propylene glycol monophenyl ether | | 25 | A | A | A | A |
| | <Blue dopant> FIrpic, Ir(pmb)3, FIrN4, Firtaz | ethylene glycol monophenyl ether | | 31 | B | B | C | C |
| | | 1,3-propanediol | | 54 | B | B | B | B |
| EML | <Host> CBP, BAlq, mCP, CDBP, DCB, P06, SimCP, UGH3, TDAPB | diethylene glycol monophenyl ether | 2-isopropyl naphthalene | -30 | A | A | A | A |
| | | glycerin | | -22 | A | A | A | A |
| | | triethylene glycol | | -20 | A | A | A | A |
| | <Red dopant> Bt2Ir(acac), Btp2Ir(acac) | 2-(benzyloxy)ethanol | | 12 | A | A | A | A |
| | | diethyl iminodiacetate | | 20 | A | A | A | A |
| | PtOEP | diethylene glycol | | 23 | A | A | A | A |
| | <Green dopant> Ir(ppy)3, Ppy2Ir(acac) | propylene glycol monophenyl ether | | 25 | A | A | A | A |
| | <Blue dopant> FIrpic, Ir(pmb)3, FIrN4, Firtaz | ethylene glycol monophenyl ether | | 31 | B | B | C | C |
| | | 1,3-propanediol | | 54 | B | B | B | B |

Mixed solvent (mixing ratio: second component ② : first component ① = 20:100, 60:100, 100:100, 200:100, 300:100, 400:100, 500:100, 600:100, 700:100)

| Functional layer | Material | Second component ② | First component ① | Film flatness 300:100 | 400:100 | 500:100 | 600:100 | 700:100 |
|---|---|---|---|---|---|---|---|---|
| EML | <Host> CBP, BAlq, mCP, CDBP, DCB, P06, SimCP, UGH3, TDAPB | diethylene glycol monophenyl ether | 3-phenoxy toluene | A | A | A | C | C |
| | | glycerin | | A | A | A | C | C |
| | | triethylene glycol | | A | A | A | C | C |
| | <Red dopant> Bt2Ir(acac), Btp2Ir(acac) | 2-(benzyloxy)ethanol | | A | A | A | C | C |
| | | diethyl iminodiacetate | | A | A | A | C | C |
| | PtOEP | diethylene glycol | | A | A | A | C | C |
| | <Green dopant> Ir(ppy)3, Ppy2Ir(acac) | propylene glycol monophenyl ether | | A | A | A | C | C |
| | <Blue dopant> FIrpic, Ir(pmb)3, FIrN4, Firtaz | ethylene glycol monophenyl ether | | C | C | C | C | C |
| | | 1,3-propanediol | | B | B | B | B | B |
| EML | <Host> CBP, BAlq, mCP, CDBP, DCB, P06, SimCP, UGH3, TDAPB | diethylene glycol monophenyl ether | octyl benzene | A | A | A | C | C |
| | | glycerin | | A | A | A | C | C |
| | | triethylene glycol | | A | A | A | C | C |
| | <Red dopant> Bt2Ir(acac), Btp2Ir(acac) | 2-(benzyloxy)ethanol | | A | A | A | C | C |
| | | diethyl iminodiacetate | | A | A | A | C | C |
| | PtOEP | diethylene glycol | | A | A | A | C | C |
| | <Green dopant> Ir(ppy)3, Ppy2Ir(acac) | propylene glycol monophenyl ether | | A | A | A | C | C |
| | <Blue dopant> FIrpic, Ir(pmb)3, FIrN4, Firtaz | ethylene glycol monophenyl ether | | C | C | C | C | C |
| | | 1,3-propanediol | | B | B | B | B | B |
| EML | <Host> CBP, BAlq, mCP, CDBP, DCB, P06, SimCP, UGH3, TDAPB | diethylene glycol monophenyl ether | 2-isopropyl naphthalene | A | A | A | C | C |
| | | glycerin | | A | A | A | C | C |
| | | triethylene glycol | | A | A | A | C | C |
| | <Red dopant> Bt2Ir(acac), Btp2Ir(acac) | 2-(benzyloxy)ethanol | | A | A | A | C | C |
| | | diethyl iminodiacetate | | A | A | A | C | C |
| | PtOEP | diethylene glycol | | A | A | A | C | C |
| | <Green dopant> Ir(ppy)3, Ppy2Ir(acac) | propylene glycol monophenyl ether | | A | A | A | C | C |
| | <Blue dopant> FIrpic, Ir(pmb)3, FIrN4, Firtaz | ethylene glycol monophenyl ether | | C | C | C | C | C |
| | | 1,3-propanediol | | B | B | B | B | B |

TABLE 28

| Functional layer | Material | Mixed solvent (mixing ratio: second component ②:first component ① = 20:100, 60:100, 100:100, 200:100, 300:100, 400:100, 500:100, 600:100, 700:100) | | Film flatness | | | | |
| --- | --- | --- | --- | --- | --- | --- | --- | --- |
| | | Second component ② | First component ① | Difference in boiling point (① − ②) | 20:100 | 60:100 | 100:100 | 200:100 |
| EML | \<Host\> CBP, BAlq, mCP, CDBP, DCB, P06, SimCP, UGH3, TDAPB | diethylene glycol monophenyl ether | 4-methyl biphenyl | −30 | A | A | A | A |
| | | glycerin | | −22 | A | A | A | A |
| | | triethylene glycol | | −20 | A | A | A | A |
| | \<Red dopant\> Bt2Ir(acac), Btp2Ir(acac) PtOEP | 2-(benzyloxy)ethanol | | 12 | A | A | A | A |
| | | diethyl iminodiacetate | | 20 | A | A | A | A |
| | | diethylene glycol | | 23 | A | A | A | A |
| | \<Green dopant\> Ir(ppy)3, Ppy2Ir(acac) | propylene glycol monophenyl ether | | 25 | A | A | A | A |
| | \<Blue dopant\> FIrpic, Ir(pmb)3, FIrN4, Firtaz | ethylene glycol monophenyl ether | | 31 | B | B | C | C |
| | | 1,3-propanediol | | 54 | B | B | B | B |
| EML | \<Host\> CBP, BAlq, mCP, CDBP, DCB, P06, SimCP, UGH3, TDAPB | diethylene glycol monophenyl ether | diphenyl-methane | −33 | B | A | A | A |
| | | glycerin | | −25 | A | A | A | A |
| | | triethylene glycol | | −23 | A | A | A | A |
| | \<Red dopant\> Bt2Ir(acac), Btp2Ir(acac) PtOEP | 2-(benzyloxy)ethanol | | 9 | A | A | A | A |
| | | diethyl iminodiacetate | | 17 | A | A | A | A |
| | | diethylene glycol | | 20 | A | A | A | A |
| | \<Green dopant\> Ir(ppy)3, Ppy2Ir(acac) | propylene glycol monophenyl ether | | 22 | A | A | A | A |
| | \<Blue dopant\> FIrpic, Ir(pmb)3, FIrN4, Firtaz | ethylene glycol monophenyl ether | | 28 | A | A | A | A |
| | | 1,3-propanediol | | 51 | B | B | B | B |

| Functional layer | Material | Mixed solvent (mixing ratio: second component ②:first component ① = 20:100, 60:100, 100:100, 200:100, 300:100, 400:100, 500:100, 600:100, 700:100) | | Film flatness | | | | |
| --- | --- | --- | --- | --- | --- | --- | --- | --- |
| | | Second component ② | First component ① | 300:100 | 400:100 | 500:100 | 600:100 | 700:100 |
| EML | \<Host\> CBP, BAlq, mCP, CDBP, DCB, P06, SimCP, UGH3, TDAPB | diethylene glycol monophenyl ether | 4-methyl biphenyl | A | A | A | C | C |
| | | glycerin | | A | A | A | C | C |
| | | triethylene glycol | | A | A | A | C | C |
| | \<Red dopant\> Bt2Ir(acac), Btp2Ir(acac) PtOEP | 2-(benzyloxy)ethanol | | A | A | A | C | C |
| | | diethyl iminodiacetate | | A | A | A | C | C |
| | | diethylene glycol | | A | A | A | C | C |
| | \<Green dopant\> Ir(ppy)3, Ppy2Ir(acac) | propylene glycol monophenyl ether | | A | A | A | C | C |
| | \<Blue dopant\> FIrpic, Ir(pmb)3, FIrN4, Firtaz | ethylene glycol monophenyl ether | | C | C | C | C | C |
| | | 1,3-propanediol | | B | B | B | B | B |
| EML | \<Host\> CBP, BAlq, mCP, CDBP, DCB, P06, SimCP, UGH3, TDAPB | diethylene glycol monophenyl ether | diphenyl-methane | A | A | A | C | C |
| | | glycerin | | A | A | A | C | C |
| | | triethylene glycol | | A | A | A | C | C |
| | \<Red dopant\> Bt2Ir(acac), Btp2Ir(acac) PtOEP | 2-(benzyloxy)ethanol | | A | A | A | C | C |
| | | diethyl iminodiacetate | | A | A | A | C | C |
| | | diethylene glycol | | A | A | A | C | C |
| | \<Green dopant\> Ir(ppy)3, Ppy2Ir(acac) | propylene glycol monophenyl ether | | A | A | A | C | C |
| | \<Blue dopant\> FIrpic, Ir(pmb)3, FIrN4, Firtaz | ethylene glycol monophenyl ether | | A | A | A | C | C |
| | | 1,3-propanediol | | B | B | B | B | B |

TABLE 29

| Functional layer | Material | Second component ② | First component ① | Difference in boiling point (① − ②) | 20:100 | 60:100 | 100:100 | 200:100 |
|---|---|---|---|---|---|---|---|---|
| EML | <Host> CBP, BAlq, mCP, CDBP, DCB, P06, SimCP, UGH3, TDAPB | diethylene glycol monophenyl ether | diphenyl ether | −38 | B | B | B | B |
| | | glycerin | | −30 | A | A | A | A |
| | | triethylene glycol | | −28 | A | A | A | A |
| | <Red dopant> Bt2Ir(acac), Btp2Ir(acac) PtOEP | 2-(benzyloxy)ethanol | | 4 | A | A | A | A |
| | | diethyl iminodiacetate | | 12 | A | A | A | A |
| | | diethylene glycol | | 15 | A | A | A | A |
| | <Green dopant> Ir(ppy)3, Ppy2Ir(acac) | propylene glycol monophenyl ether | | 17 | A | A | A | A |
| | <Blue dopant> FIrpic, Ir(pmb)3, FIrN4, Firtaz | ethylene glycol monophenyl ether | | 23 | A | A | A | A |
| | | 1,3-propanediol | | 46 | B | B | B | B |
| EML | <Host> CBP, BAlq, mCP, CDBP, DCB, P06, SimCP, UGH3, TDAPB | diethylene glycol monophenyl ether | 2-methyl biphenyl | −42 | C | C | C | C |
| | | glycerin | | −34 | B | B | B | C |
| | | triethylene glycol | | −32 | B | B | B | C |
| | <Red dopant> Bt2Ir(acac), Btp2Ir(acac) PtOEP | 2-(benzyloxy)ethanol | | 0 | A | A | A | A |
| | | diethyl iminodiacetate | | 8 | A | A | A | A |
| | | diethylene glycol | | 11 | A | A | A | A |
| | <Green dopant> Ir(ppy)3, Ppy2Ir(acac) | propylene glycol monophenyl ether | | 13 | A | A | A | A |
| | <Blue dopant> FIrpic, Ir(pmb)3, FIrN4, Firtaz | ethylene glycol monophenyl ether | | 19 | A | A | A | A |
| | | 1,3-propanediol | | 42 | B | B | B | B |
| EML | <Host> CBP, BAlq, mCP, CDBP, DCB, P06, SimCP, UGH3, TDAPB | diethylene glycol monophenyl ether | 1-methyl naphthalene | −54 | C | C | C | C |
| | | glycerin | | −46 | C | C | C | C |
| | | triethylene glycol | | −44 | C | C | C | C |
| | <Red dopant> Bt2Ir(acac), Btp2Ir(acac) PtOEP | 2-(benzyloxy)ethanol | | −12 | A | A | A | A |
| | | diethyl iminodiacetate | | −4 | A | A | A | A |
| | | diethylene glycol | | −1 | A | A | A | A |
| | <Green dopant> Ir(ppy)3, Ppy2Ir(acac) | propylene glycol monophenyl ether | | 1 | A | A | A | A |
| | <Blue dopant> FIrpic, Ir(pmb)3, FIrN4, Firtaz | ethylene glycol monophenyl ether | | 7 | A | A | A | A |
| | | 1,3-propanediol | | 30 | A | A | A | A |

| Functional layer | Material | Second component ② | First component ① | 300:100 | 400:100 | 500:100 | 600:100 | 700:100 |
|---|---|---|---|---|---|---|---|---|
| EML | <Host> CBP, BAlq, mCP, CDBP, DCB, P06, SimCP, UGH3, TDAPB | diethylene glycol monophenyl ether | diphenyl ether | B | B | B | B | C |
| | | glycerin | | A | A | A | C | C |
| | | triethylene glycol | | A | A | A | C | C |
| | <Red dopant> Bt2Ir(acac), Btp2Ir(acac) PtOEP | 2-(benzyloxy)ethanol | | A | A | A | C | C |
| | | diethyl iminodiacetate | | A | A | A | C | C |
| | | diethylene glycol | | A | A | A | C | C |
| | <Green dopant> Ir(ppy)3, Ppy2Ir(acac) | propylene glycol monophenyl ether | | A | A | A | C | C |
| | <Blue dopant> FIrpic, Ir(pmb)3, FIrN4, Firtaz | ethylene glycol monophenyl ether | | A | A | A | C | C |
| | | 1,3-propanediol | | B | B | B | B | B |
| EML | <Host> CBP, BAlq, mCP, CDBP, DCB, P06, SimCP, UGH3, TDAPB | diethylene glycol monophenyl ether | 2-methyl biphenyl | C | C | C | C | C |
| | | glycerin | | C | C | C | C | C |
| | | triethylene glycol | | C | C | C | C | C |
| | <Red dopant> Bt2Ir(acac), Btp2Ir(acac) PtOEP | 2-(benzyloxy)ethanol | | A | A | A | C | C |
| | | diethyl iminodiacetate | | A | A | A | C | C |
| | | diethylene glycol | | A | A | A | C | C |
| | <Green dopant> Ir(ppy)3, Ppy2Ir(acac) | propylene glycol monophenyl ether | | A | A | A | C | C |

TABLE 29-continued

| | | | | | | | | |
|---|---|---|---|---|---|---|---|---|
| | <Blue dopant> | ethylene glycol | | A | A | A | C | C |
| | FIrpic, Ir(pmb)3, FIrN4, | monophenyl ether | | | | | | |
| | Firtaz | 1,3-propanediol | | B | B | B | B | B |
| EML | <Host> | diethylene glycol | 1-methyl | C | C | C | C | C |
| | CBP, BAlq, mCP, CDBP, | monophenyl ether | naphthalene | | | | | |
| | DCB, P06, SimCP, UGH3, | glycerin | | C | C | C | C | C |
| | TDAPB | triethylene glycol | | C | C | C | C | C |
| | <Red dopant> | 2-(benzyloxy)ethanol | | A | A | A | C | C |
| | Bt2Ir(acac), Btp2Ir(acac) | diethyl iminodiacetate | | A | A | A | C | C |
| | PtOEP | diethylene glycol | | A | A | A | C | C |
| | <Green dopant> | propylene glycol | | A | A | A | C | C |
| | Ir(ppy)3, Ppy2Ir(acac) | monophenyl ether | | | | | | |
| | <Blue dopant> | ethylene glycol | | A | A | A | C | C |
| | FIrpic, Ir(pmb)3, FIrN4, | monophenyl ether | | | | | | |
| | Firtaz | 1,3-propanediol | | A | A | A | C | C |

TABLE 30

| | | Mixed solvent (mixing ratio: second component ②:first component ① = 20:100, 60:100, 100:100, 200:100, 300:100, 400:100, 500:100, 600:100, 700:100) | | | Film flatness | | | |
|---|---|---|---|---|---|---|---|---|
| Functional layer | Material | Second component ② | First component ① | Difference in boiling point (① − ②) | 20:100 | 60:100 | 100:100 | 200:100 |
| EML | <Host> CBP, BAlq, mCP, CDBP, | diethylene glycol monophenyl ether | cyclohexyl benzene | −62 | C | C | C | C |
| | DCB, P06, SimCP, UGH3, | glycerin | | −54 | C | C | C | C |
| | TDAPB | triethylene glycol | | −52 | C | C | C | C |
| | <Red dopant> | 2-(benzyloxy)ethanol | | −20 | A | A | A | A |
| | Bt2Ir(acac), Btp2Ir(acac) | diethyl iminodiacetate | | −12 | A | A | A | A |
| | PtOEP | diethylene glycol | | −9 | A | A | A | A |
| | <Green dopant> | propylene glycol | | −7 | A | A | A | A |
| | Ir(ppy)3, Ppy2Ir(acac) | monophenyl ether | | | | | | |
| | <Blue dopant> | ethylene glycol | | −1 | A | A | A | A |
| | FIrpic, Ir(pmb)3, FIrN4, | monophenyl ether | | | | | | |
| | Firtaz | 1,3-propanediol | | 22 | A | A | A | A |
| EML | <Host> CBP, BAlq, mCP, CDBP, | diethylene glycol monophenyl ether | heptyl benzene | −63 | C | C | C | C |
| | DCB, P06, SimCP, UGH3, | glycerin | | −55 | C | C | C | C |
| | TDAPB | triethylene glycol | | −53 | C | C | C | C |
| | <Red dopant> | 2-(benzyloxy)ethanol | | −21 | A | A | A | A |
| | Bt2Ir(acac), Btp2Ir(acac) | diethyl iminodiacetate | | −13 | A | A | A | A |
| | PtOEP | diethylene glycol | | −10 | A | A | A | A |
| | <Green dopant> | propylene glycol | | −8 | A | A | A | A |
| | Ir(ppy)3, Ppy2Ir(acac) | monophenyl ether | | | | | | |
| | <Blue dopant> | ethylene glycol | | −2 | A | A | A | A |
| | FIrpic, Ir(pmb)3, FIrN4, | monophenyl ether | | | | | | |
| | Firtaz | 1,3-propanediol | | 21 | A | A | A | A |
| EML | <Host> CBP, BAlq, mCP, CDBP, | diethylene glycol monophenyl ether | hexyl benzene | −72 | C | C | C | C |
| | DCB, P06, SimCP, UGH3, | glycerin | | −64 | C | C | C | C |
| | TDAPB | triethylene glycol | | −62 | C | C | C | C |
| | <Red dopant> | 2-(benzyloxy)ethanol | | −30 | A | A | A | A |
| | Bt2Ir(acac), Btp2Ir(acac) | diethyl iminodiacetate | | −22 | A | A | A | A |
| | PtOEP | diethylene glycol | | −19 | A | A | A | A |
| | <Green dopant> | propylene glycol | | −17 | A | A | A | A |
| | Ir(ppy)3, Ppy2Ir(acac) | monophenyl ether | | | | | | |
| | <Blue dopant> | ethylene glycol | | −11 | A | A | A | A |
| | FIrpic, Ir(pmb)3, FIrN4, | monophenyl ether | | | | | | |
| | Firtaz | 1,3-propanediol | | 12 | A | A | A | A |

TABLE 30-continued

| Functional layer | Material | Mixed solvent (mixing ratio: second component ②:first component ① = 20:100, 60:100, 100:100, 200:100, 300:100, 400:100, 500:100, 600:100, 700:100) | | Film flatness | | | | |
|---|---|---|---|---|---|---|---|---|
| | | Second component ② | First component ① | 300:100 | 400:100 | 500:100 | 600:100 | 700:100 |
| EML | <Host> CBP, BAlq, mCP, CDBP, DCB, P06, SimCP, UGH3, TDAPB | diethylene glycol monophenyl ether | cyclohexyl benzene | C | C | C | C | C |
| | | glycerin | | C | C | C | C | C |
| | | triethylene glycol | | C | C | C | C | C |
| | <Red dopant> Bt2Ir(acac), Btp2Ir(acac) | 2-(benzyloxy)ethanol | | A | A | A | C | C |
| | | diethyl iminodiacetate | | A | A | A | C | C |
| | PtOEP | diethylene glycol | | A | A | A | C | C |
| | <Green dopant> Ir(ppy)3, Ppy2Ir(acac) | propylene glycol monophenyl ether | | A | A | A | C | C |
| | <Blue dopant> FIrpic, Ir(pmb)3, FIrN4, FIrtaz | ethylene glycol monophenyl ether | | A | A | A | C | C |
| | | 1,3-propanediol | | A | A | A | C | C |
| EML | <Host> CBP, BAlq, mCP, CDBP, DCB, P06, SimCP, UGH3, TDAPB | diethylene glycol monophenyl ether | heptyl benzene | C | C | C | C | C |
| | | glycerin | | C | C | C | C | C |
| | | triethylene glycol | | C | C | C | C | C |
| | <Red dopant> Bt2Ir(acac), Btp2Ir(acac) | 2-(benzyloxy)ethanol | | A | A | A | C | C |
| | | diethyl iminodiacetate | | A | A | A | C | C |
| | PtOEP | diethylene glycol | | A | A | A | C | C |
| | <Green dopant> Ir(ppy)3, Ppy2Ir(acac) | propylene glycol monophenyl ether | | A | A | A | C | C |
| | <Blue dopant> FIrpic, Ir(pmb)3, FIrN4, FIrtaz | ethylene glycol monophenyl ether | | A | A | A | C | C |
| | | 1,3-propanediol | | A | A | A | C | C |
| EML | <Host> CBP, BAlq, mCP, CDBP, DCB, P06, SimCP, UGH3, TDAPB | diethylene glycol monophenyl ether | hexyl benzene | C | C | C | C | C |
| | | glycerin | | C | C | C | C | C |
| | | triethylene glycol | | C | C | C | C | C |
| | <Red dopant> Bt2Ir(acac), Btp2Ir(acac) | 2-(benzyloxy)ethanol | | A | A | A | C | C |
| | | diethyl iminodiacetate | | A | A | A | C | C |
| | PtOEP | diethylene glycol | | A | A | A | C | C |
| | <Green dopant> Ir(ppy)3, Ppy2Ir(acac) | propylene glycol monophenyl ether | | A | A | A | C | C |
| | <Blue dopant> FIrpic, Ir(pmb)3, FIrN4, FIrtaz | ethylene glycol monophenyl ether | | A | A | A | C | C |
| | | 1,3-propanediol | | A | A | A | C | C |

TABLE 31

| Functional layer | Material | Mixed solvent (mixing ratio: second component ②:first component ① = 20:100, 60:100, 100:100, 200:100, 300:100, 400:100, 500:100, 600:100, 700:100) | | | Film flatness | | | |
|---|---|---|---|---|---|---|---|---|
| | | Second component ② | First component ① | Difference in boiling point (①−②) | 20:100 | 60:100 | 100:100 | 200:100 |
| EML | <Host> CBP, BAlq, mCP, CDBP, DCB, P06, SimCP, UGH3, TDAPB | diethylene glycol monophenyl ether | pentyl benzene | −93 | C | C | C | C |
| | | glycerin | | −85 | C | C | C | C |
| | | triethylene glycol | | −83 | C | C | C | C |
| | <Red dopant> Bt2Ir(acac), Btp2Ir(acac) | 2-(benzyloxy)ethanol | | −51 | C | C | C | C |
| | | diethyl iminodiacetate | | −43 | C | C | C | C |
| | PtOEP | diethylene glycol | | −40 | C | C | C | C |
| | <Green dopant> Ir(ppy)3, Ppy2Ir(acac) | propylene glycol monophenyl ether | | −38 | C | C | C | C |
| | <Blue dopant> FIrpic, Ir(pmb)3, FIrN4, FIrtaz | ethylene glycol monophenyl ether | | −32 | B | B | C | C |
| | | 1,3-propanediol | | −9 | A | A | A | A |

TABLE 31-continued

Mixed solvent (mixing ratio: second component ②:first component ① = 20:100, 60:100, 100:100, 200:100, 300:100, 400:100, 500:100, 600:100, 700:100)

| Functional layer | Material | Second component ② | First component ① | Film flatness |||||
|---|---|---|---|---|---|---|---|---|
| | | | | 300:100 | 400:100 | 500:100 | 600:100 | 700:100 |
| EML | <Host> CBP, BAlq, mCP, CDBP, DCB, P06, SimCP, UGH3, TDAPB | diethylene glycol monophenyl ether | pentyl benzene | C | C | C | C | C |
| | | glycerin | | C | C | C | C | C |
| | | triethylene glycol | | C | C | C | C | C |
| | <Red dopant> Bt2Ir(acac), Btp2Ir(acac) PtOEP | 2-(benzyloxy)ethanol | | C | C | C | C | C |
| | | diethyl iminodiacetate | | C | C | C | C | C |
| | | diethylene glycol | | C | C | C | C | C |
| | <Green dopant> Ir(ppy)3, Ppy2Ir(acac) | propylene glycol monophenyl ether | | C | C | C | C | C |
| | <Blue dopant> FIrpic, Ir(pmb)3, FIrN4, Firtaz | ethylene glycol monophenyl ether | | C | C | C | C | C |
| | | 1,3-propanediol | | A | A | A | C | C |

As shown in Table 25, in the case where the liquid medium containing the first component alone was used, in the light-emitting layer formed using the film-forming ink containing the liquid medium, the film thickness at the partition wall edge was thicker than 1.1 times the film thickness in the central portion due to the fact that seeping-up of the film-forming ink was not suppressed, and the light-emitting layer could not be formed with a uniform thickness.

On the other hand, as shown in Tables 26 to 31, by using the liquid medium containing the first component and the second component having a difference in boiling point of 30° C. or less, and also setting the content ratio thereof (the second component:the first component) within the range of 20:100 to 500:100, seeping-up of the film-forming ink could be suppressed, and the light-emitting layer formed using this film-forming ink could be formed as a layer in which the film thickness at the partition wall edge was thinner than 1.1 times the film thickness in the central portion, that is, as the light-emitting layer having a uniform thickness.

REFERENCE SIGNS LIST 1, 4A: film-forming ink, 1A: liquid coating film, 1B: film, 3: anode, 4: hole injection layer, 5: hole transport layer, 6: red light-emitting layer, 10: electron transport layer, 11: electron injection layer, 12: cathode, 14: stacked body, 14R, 14G, 14B: stacked body, 15, 15A: base material, 16: partition wall, 17: opening part, 19: transmission layer, 19B: colored layer, 19BA: film-forming ink, 19G: colored layer, 19GA: film-forming ink, 19R: colored layer, 19RA: film-forming ink, 20: substrate, 21: substrate, 22: flattening layer, 24: switching element, 27: conductive part, 31: partition wall, 311: partition wall surface, 32: reflective film, 33: anti-corrosion film, 34: cathode cover, 35: resin layer, 36: partition wall, 100: liquid droplet ejection device, 101: light-emitting device, 102: transmission filter, 103: color filter, 110: head, 111: head main body, 112: vibrating plate, 113: piezo element, 114: main body, 115: nozzle plate, 115P: ink ejection surface, 116: reservoir, 117: ink chamber, 118: nozzle, 130: base, 140: table, 170: table positioning unit, 171: first moving unit, 172: motor, 180: head positioning unit, 181: second moving unit, 182: linear motor, 183, 184, 185: motor, 190: control device, 191: driving circuit, 200, 200R, 200G, 200B: light-emitting element, 241: semiconductor layer, 242: gate insulating layer, 243: gate electrode, 244: source electrode, 245: drain electrode, 300: display device, 300R, 300G, 300B: sub-pixel, 1100: personal computer, 1102: key board, 1104: main body part, 1106: display unit, 1200: mobile phone, 1202: operation button, 1204: earpiece, 1206: mouthpiece, 1300: digital still camera, 1302: case, 1304: light receiving unit, 1306: shutter button, 1308: circuit board, 1312: video signal output terminal, 1314: input/output terminal, 1430: television monitor, 1440: personal computer, B, G, R: light The entire disclosure of Japanese Patent Application No. 2014-244519, filed Dec. 2, 2014 is expressly incorporated by reference herein.

The invention claimed is:
1. A film-forming ink, comprising:
a film-forming material; and
a liquid medium in which the film-forming material is dissolved, the liquid medium containing:
 a first component which:
  (i) has a viscosity less than 20 cp at a normal temperature that is a range of 20° C.±15° C.,
  (ii) has a solubility capable of dissolving the film-forming material in an amount of 1.5 wt % or more, and
  (iii) has a boiling point at an atmospheric pressure of 200° C. or higher and 300° C. or lower; and
 a second component which:
  (i) has a viscosity of 20 cp or more at the normal temperature,
  (ii) has a solubility lower than the solubility of the first component, and
  (iii) has a boiling point at the atmospheric pressure within a range of ±30° C. relative to the boiling point at the atmospheric pressure of the first component; and
 a third component different from the first component and the second component, wherein
the second component is contained in an amount of 20 parts by weight or more and 500 parts by weight or less with respect to 100 parts by weight of the first component.

2. The film-forming ink according to claim 1, wherein the viscosity of the film-forming ink is less than 20 cp at the normal temperature.

3. The film-forming ink according to claim 1, wherein the third component has a boiling point at the atmospheric pressure lower than a higher one of the boiling point of the first component and the boiling point of the second component, and has a viscosity of less than 20 cp at the normal temperature.

4. The film-forming ink according to claim 3, wherein the boiling point at the atmospheric pressure of the third component is 200° C. or higher and 270° C. or lower.

5. The film-forming ink according to claim 1, wherein the first component has the solubility capable of dissolving the film-forming material in the amount of 1.5 wt % or more and 4.5 wt % or less of the first component.

6. The film-forming ink according to claim 5, wherein the second component has the solubility capable of dissolving the film-forming material in an amount of 0.1 wt % or more and 1.0 wt % or less.

7. The film-forming ink according to claim 1, wherein the second component includes a hydroxy group.

8. The film-forming ink according to claim 7, wherein the second component includes an aromatic group.

9. The film-forming ink according to claim 7, wherein the second component includes an acetate group.

10. The film-forming ink according to claim 1, wherein the film-forming ink is supplied as a liquid droplet to an opening part included in a partition wall on a substrate, followed by drying, thereby forming a film.

11. The film-forming ink according to claim 1, wherein the third component has a higher volatility than the first component and the second component.

12. The film-forming ink according to claim 1, wherein the third component is in a liquid form at the normal temperature.

13. The film-forming ink according to claim 1, wherein the third component has the viscosity of 1 cp or more and 5 cp or less at the normal temperature.

14. The film-forming ink according to claim 1, wherein:
the third component has a surface tension of 20 mN/m or more and 30 mN/m or less at the normal temperature; and
the third component is contained in the liquid medium 40 parts by weight or more and 500 parts by weight or less with respect to 100 parts by weight of the first component.

15. A film formation method, comprising:
a step of supplying the film-forming ink according to claim 1 as a liquid droplet into an opening part included in a partition wall provided on a base material, thereby forming a liquid coating film; and
a step of drying the liquid coating film by heating, thereby forming a film in the opening part.

16. A device with a film, comprising a film formed by the film formation method according to claim 15 or a film obtained by treating the film.

17. An electronic apparatus, comprising the device with a film according to claim 16.

* * * * *